(12) United States Patent
English et al.

(10) Patent No.: US 7,623,360 B2
(45) Date of Patent: Nov. 24, 2009

(54) EMI SHIELDING AND THERMAL MANAGEMENT ASSEMBLIES INCLUDING FRAMES AND COVERS WITH MULTI-POSITION LATCHING

(75) Inventors: Gerald Robert English, Glen Ellyn, IL (US); Allan Richard Zuehlsdorf, Sycamore, IL (US)

(73) Assignee: Laird Technologies, Inc., Chesterfield, MO (US)

( * ) Notice: Subject to any disclaimer, the term of this patent is extended or adjusted under 35 U.S.C. 154(b) by 744 days.

(21) Appl. No.: 11/440,618

(22) Filed: May 25, 2006

(65) Prior Publication Data

US 2007/0210082 A1    Sep. 13, 2007

Related U.S. Application Data

(60) Provisional application No. 60/781,000, filed on Mar. 9, 2006.

(51) Int. Cl.
 *H05K 9/00*  (2006.01)
(52) U.S. Cl. .................. 361/816; 361/818; 361/800
(58) Field of Classification Search ......... 361/801–802, 361/800, 816, 818, 701–711
See application file for complete search history.

(56) References Cited

U.S. PATENT DOCUMENTS

| 3,047,648 | A | 7/1962 | Mowatt |
|---|---|---|---|
| 3,208,511 | A | 9/1965 | McAdam |
| 3,572,428 | A | 3/1971 | Monaco |
| 3,721,746 | A | 3/1973 | Knappenberger |
| 4,203,488 | A | 5/1980 | Johnson et al. |
| 4,235,285 | A | 11/1980 | Johnson et al. |
| 4,345,267 | A | 8/1982 | Corman et al. |
| 4,405,961 | A | 9/1983 | Chow et al. |
| 4,433,886 | A | 2/1984 | Cassarly et al. |
| 4,481,525 | A | 11/1984 | Calabro et al. |
| 4,508,163 | A | 4/1985 | McCarthy |
| 4,661,888 | A | 4/1987 | Jewell et al. |
| 4,679,118 | A | 7/1987 | Johnson et al. |
| 4,729,426 | A | 3/1988 | Hinshaw |
| 4,754,101 | A | 6/1988 | Stickney et al. |
| 4,933,746 | A | 6/1990 | King |
| 5,052,481 | A | 10/1991 | Horvath et al. |
| 5,060,114 | A | 10/1991 | Feinberg et al. |

(Continued)

FOREIGN PATENT DOCUMENTS

EP    0632686    8/1996

(Continued)

OTHER PUBLICATIONS

Heat Sink Shield, 13 pages of drawings.

*Primary Examiner*—Hung S Bui
(74) *Attorney, Agent, or Firm*—Harness, Dickey & Pierce, P.L.C.

(57) ABSTRACT

According to various aspects of the present disclosure, exemplary embodiments are of assemblies capable of providing board level EMI shielding and heat dissipation of one or more electrical components. Other aspects relate to components of such assemblies. Further aspects relate to methods of using EMI shielding and thermal management assemblies. Additional aspects relate to methods of making EMI shielding and thermal management assemblies, and methods of making the components thereof.

27 Claims, 42 Drawing Sheets

U.S. PATENT DOCUMENTS

| | | |
|---|---|---|
| 5,130,888 A | 7/1992 | Moore |
| 5,175,395 A | 12/1992 | Moore |
| 5,175,613 A | 12/1992 | Barker, III et al. |
| 5,208,731 A | 5/1993 | Blomquist |
| 5,241,453 A | 8/1993 | Bright et al. |
| 5,285,350 A | 2/1994 | Villaume |
| 5,287,001 A | 2/1994 | Buchmann et al. |
| 5,288,313 A | 2/1994 | Portner |
| 5,295,043 A | 3/1994 | Beijer |
| 5,329,426 A | 7/1994 | Villani |
| 5,354,951 A | 10/1994 | Lange, Sr. et al. |
| 5,357,404 A | 10/1994 | Bright et al. |
| 5,365,399 A | 11/1994 | Kent et al. |
| 5,367,433 A | 11/1994 | Blomquist |
| 5,416,668 A | 5/1995 | Benzoni |
| 5,461,257 A | 10/1995 | Hundt |
| 5,485,037 A | 1/1996 | Marrs |
| 5,524,908 A | 6/1996 | Reis |
| 5,541,811 A | 7/1996 | Henningsson et al. |
| 5,550,713 A | 8/1996 | Pressler et al. |
| 5,552,635 A | 9/1996 | Kim et al. |
| 5,566,052 A | 10/1996 | Hughes |
| 5,585,671 A | 12/1996 | Nagesh et al. |
| 5,586,005 A | 12/1996 | Cipolla et al. |
| 5,640,047 A | 6/1997 | Nakashima |
| 5,663,786 A | 9/1997 | Miyamori |
| 5,706,579 A | 1/1998 | Ross |
| 5,717,248 A | 2/1998 | Neumann et al. |
| 5,717,577 A | 2/1998 | Mendolia et al. |
| 5,763,824 A | 6/1998 | King et al. |
| 5,804,875 A | 9/1998 | Remsburg et al. |
| 5,811,050 A | 9/1998 | Gabower |
| 5,866,943 A | 2/1999 | Mertol |
| 5,893,409 A | 4/1999 | Kohler et al. |
| 5,917,701 A | 6/1999 | Solberg |
| 5,990,418 A | 11/1999 | Bivona et al. |
| 6,005,186 A | 12/1999 | Bachman |
| 6,025,991 A | 2/2000 | Saito |
| 6,049,469 A | 4/2000 | Hood, III et al. |
| 6,075,700 A | 6/2000 | Houghton et al. |
| 6,122,167 A | 9/2000 | Smith et al. |
| 6,166,918 A | 12/2000 | Olofsson et al. |
| 6,178,097 B1 | 1/2001 | Hauk, Jr. |
| 6,178,318 B1 | 1/2001 | Holmberg et al. |
| 6,181,573 B1 | 1/2001 | Riet |
| 6,195,267 B1 * | 2/2001 | MacDonald et al. ........ 361/800 |
| 6,205,026 B1 | 3/2001 | Wong et al. |
| 6,208,515 B1 | 3/2001 | Klein |
| 6,212,073 B1 | 4/2001 | Yamaguchi |
| 6,269,008 B1 | 7/2001 | Hsu |
| 6,347,035 B1 | 2/2002 | Hamano et al. |
| 6,377,472 B1 | 4/2002 | Fan |
| 6,377,475 B1 | 4/2002 | Reis |
| 6,388,189 B1 | 5/2002 | Onoue |
| 6,410,846 B1 | 6/2002 | Benn, Jr. |
| 6,430,043 B1 | 8/2002 | Osburn |
| 6,445,583 B1 | 9/2002 | Kline et al. |
| 6,490,173 B2 | 12/2002 | Perkins et al. |
| 6,501,018 B2 | 12/2002 | Mayer |
| 6,504,095 B1 | 1/2003 | Hoffstrom |
| 6,552,261 B2 | 4/2003 | Shlahtichman et al. |
| 6,590,783 B2 | 7/2003 | Spratte et al. |
| 6,624,432 B1 | 9/2003 | Gabower et al. |
| 6,673,998 B1 | 1/2004 | Wu |
| 6,674,653 B1 | 1/2004 | Valentine |
| 6,676,137 B2 | 1/2004 | Dean |
| 6,744,640 B2 | 6/2004 | Reis et al. |
| 6,943,287 B2 | 9/2005 | Lloyd et al. |
| 6,946,598 B1 | 9/2005 | Konshak |
| 6,949,706 B2 * | 9/2005 | West .......................... 174/384 |
| 6,965,071 B2 | 11/2005 | Watchko et al. |
| 6,979,773 B2 | 12/2005 | Fursich |
| 6,989,994 B2 | 1/2006 | Maguire et al. |
| 7,013,558 B2 | 3/2006 | Bachman |
| 7,245,896 B2 * | 7/2007 | Seo et al. ..................... 455/300 |
| 7,529,095 B2 * | 5/2009 | Whitton ....................... 361/719 |
| 2001/0046119 A1 | 11/2001 | Hamano et al. |
| 2003/0066672 A1 | 4/2003 | Watchko et al. |
| 2003/0224186 A1 | 12/2003 | Feng et al. |
| 2004/0052064 A1 | 3/2004 | Oliver et al. |
| 2005/0236171 A1 | 10/2005 | Garcia |
| 2005/0237727 A1 | 10/2005 | Baker |

FOREIGN PATENT DOCUMENTS

| | | |
|---|---|---|
| EP | 0910005 | 4/1999 |
| EP | 1364565 | 6/2002 |
| EP | 1493314 | 10/2006 |
| WO | WO 01/41521 | 6/2001 |
| WO | WO 02/069687 | 9/2002 |
| WO | WO 03/088729 | 10/2003 |

* cited by examiner

EMI SHIELDING AND THERMAL MANAGEMENT ASSEMBLIES INCLUDING FRAMES AND COVERS WITH MULTI-POSITION LATCHING

CROSS-REFERENCE TO RELATED APPLICATION

This application claims the benefit of United States Provisional Application 60/781,000 filed Mar. 9, 2006, the disclosure of which is incorporated herein by reference.

FIELD

The present disclosure generally relates (but not exclusively) to EMI shielding and thermal management assemblies including frames and covers with multi-position latching such that the cover can be attached to the frame in a first latched position (e.g., in a first stage prior to reflow), and then in a second latched position (e.g., in a second stage after reflow).

BACKGROUND

The statements in this section merely provide background information related to the present disclosure and may not constitute prior art.

Electronic equipment includes electrical components and circuits mounted on a substrate that can be sensitive to electromagnetic interference (EMI) and radio frequency interference (RFI). Such EMI/RFI interference may originate from internal sources within the electronic equipment or from external EMI/RFI interference sources. Interference can cause degradation or complete loss of important signals, thereby rendering the electronic equipment inefficient or inoperable. Accordingly, the circuits (sometimes referred to as RF modules or transceiver circuits) usually require EMI/RFI shielding in order to function properly. The shielding reduces interference not only from external sources, but also from various functional blocks within the module.

As used herein, the term "EMI" should be considered to generally include and refer to both EMI and RFI emissions, and the term "electromagnetic" should be considered to generally include and refer to both electromagnetic and radio frequency from external sources and internal sources. Accordingly, the term shielding (as used herein) generally includes and refers to both EMI shielding and RFI shielding, for example, to prevent (or at least reduce) ingress and egress of EMI and RFI relative to a housing or other enclosure in which electronic equipment is disposed.

By way of example, electronic circuits or components of a printed circuit board (PCB) are often enclosed with shields to localize EMI within its source, and to insulate other devices proximal to the EMI source. Such shields may be soldered or otherwise affixed to the PCB, thus increasing the overall size of the PCB. Soldered shields, however, may need to be removed to repair or replace the covered component, which can be an expensive and time consuming task that can even cause damage to the PCB.

In addition, many electronic components generate significant amounts of heat. Excessive heat build up can lead to reduced product life and reliability.

SUMMARY

According to various aspects of the present disclosure, exemplary embodiments include assemblies capable of providing board level EMI shielding and heat dissipation of one or more electrical components. Other aspects relate to components of such assemblies. Further aspects relate to methods of using EMI shielding and thermal management assemblies. Additional aspects relate to methods of making EMI shielding and thermal management assemblies, and methods of making the components thereof.

In one exemplary embodiment, an assembly generally includes a frame and a cover attachable to the frame in a first latched position and at least a second, operational latched position. The assembly also includes at least one thermally-conductive compliant material. When the cover is attached to the frame in the first latched position, a spaced distance separates the at least one thermally-conductive compliant material from at least one of the cover or the one or more electrical components. When the cover is attached to the frame in the second latched position, the spaced distance is substantially eliminated and the at least one thermally-conductive compliant material forms a thermally-conducting heat path from the one or more electrical components to the cover.

In another embodiment, an assembly generally includes a frame, a cover attachable to the frame, and at least one thermal interface/phase change material. Before solder reflow of the frame to the board, a spaced distance is provided between the thermal interface/phase change material and the one or more electrical components disposed within an interior defined by the cover and the frame. After solder reflow and cooling, however, displacement of the thermal interface/phase change material and thermal contraction of the cover can cooperatively generate a clamping force for compressing the thermal interface/phase change material generally between the cover and the one or more electrical components, whereby the thermal interface/phase material forms a thermally-conducting heat path from the one or more electrical components to the cover.

Other exemplary embodiments include methods for providing board level EMI shielding and thermal management for one or more electrical components of a board. In one exemplary embodiments, a method generally includes attaching a cover to a frame in a first latched position such that a spaced distance separates at least one thermally-conductive compliant material, disposed within an interior defined by the cover and the frame, from at least one of the cover or the one or more electrical components disposed within the interior defined by the cover and the frame. The method can also include moving the cover relatively downward towards the board from the first latched position into a second, operational latched position in which the spaced distance is substantially eliminated and the at least one thermally-conductive compliant material forms a thermally-conducting heat path from the one or more electrical components to the cover.

Further aspects and features of the present disclosure will become apparent from the detailed description provided hereinafter. In addition, any one or more aspects of the present disclosure may be implemented individually or in any combination with any one or more of the other aspects of the present disclosure. It should be understood that the detailed description and specific examples, while indicating exemplary embodiments of the present disclosure, are intended for purposes of illustration only and are not intended to limit the scope of the present disclosure.

DRAWINGS

The drawings described herein are for illustration purposes only and are not intended to limit the scope of the present disclosure in any way.

Figure 41:
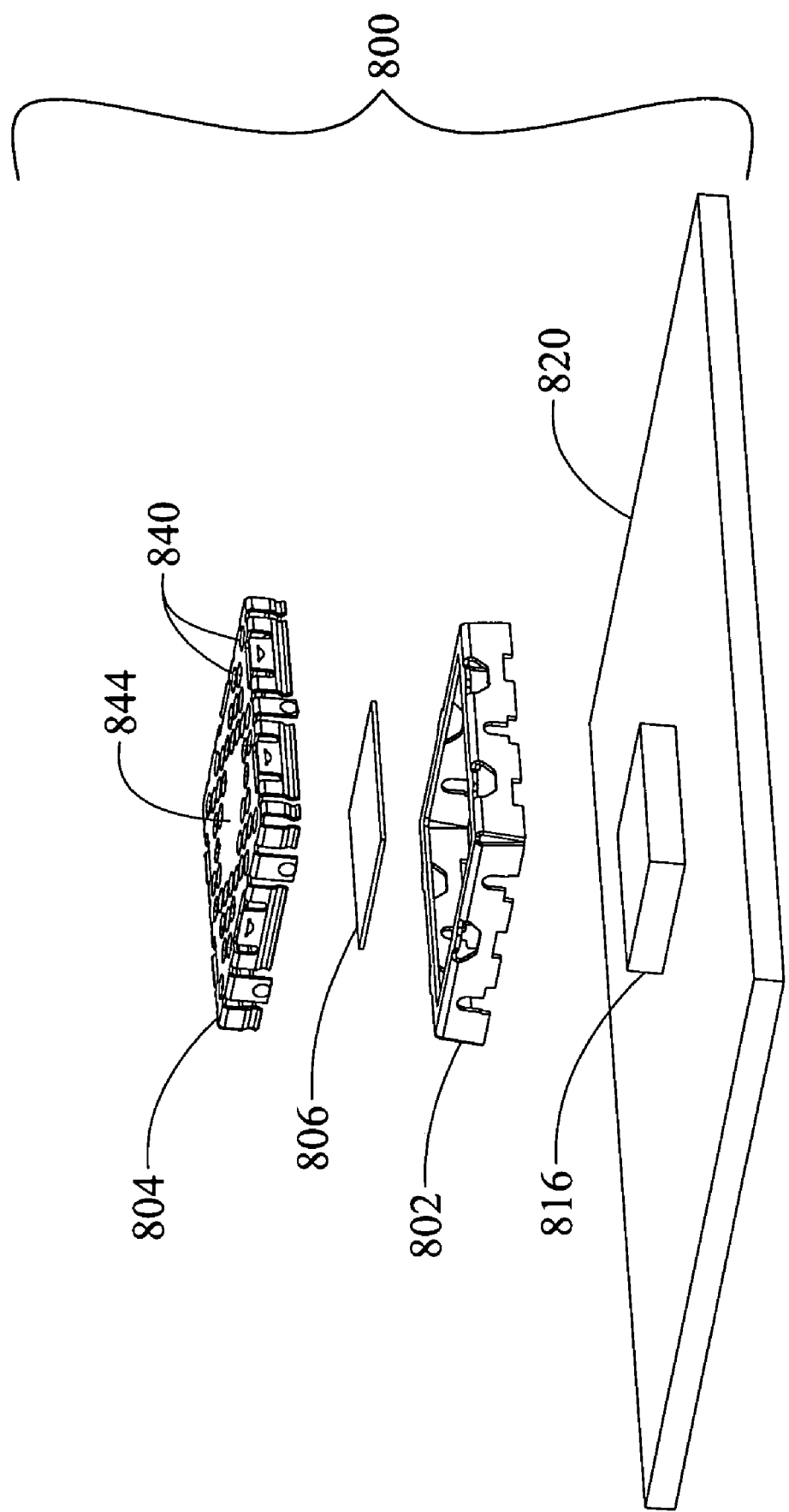
Figure 42:
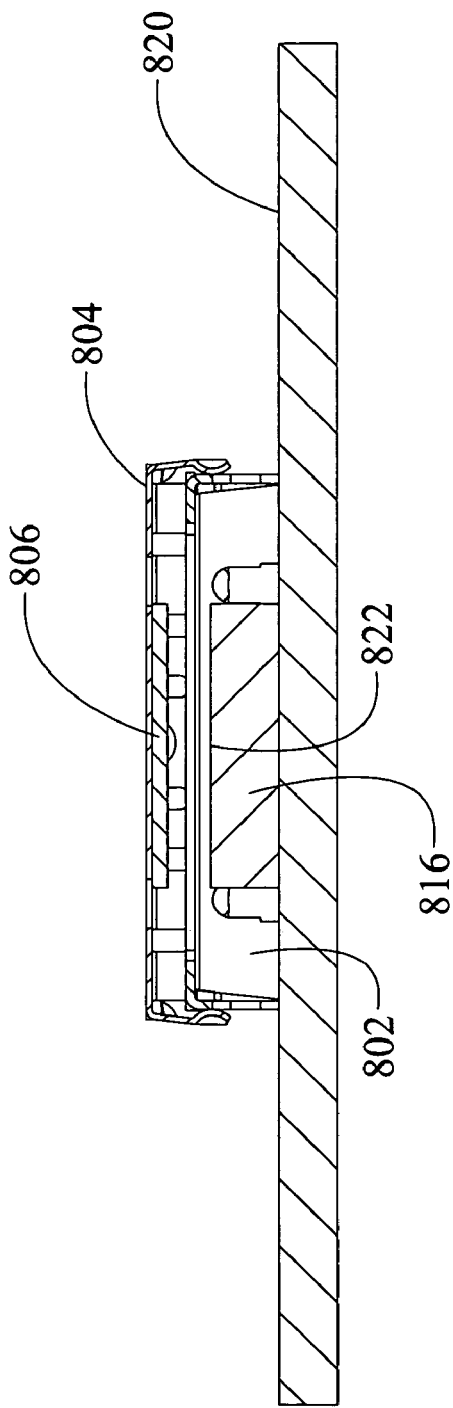
Figure 43:
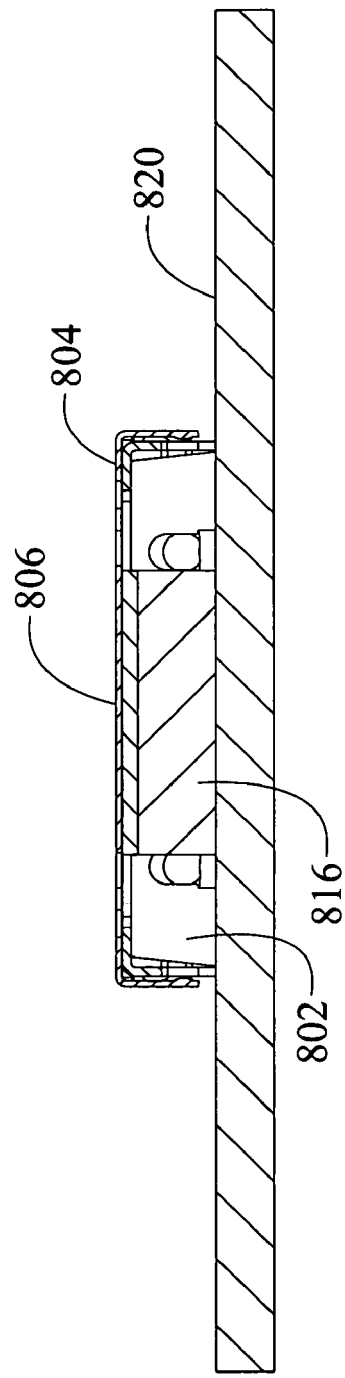

FIG. 41 is an exploded perspective view of an EMI shielding and thermal management assembly where the assembly includes a frame, a cover, and a thermal interface/phase change material for generating force for low thermal impedance, and where the frame and cover may include multi-position latching such that the cover can be attached to the frame in a first or a second latched position according to exemplary embodiments;

FIG. 42 is a view of the assembly shown in FIG. 41 with front portions broken away, and illustrating the assembly disposed over a board-mounted electronic component prior to a solder reflow process; and FIG. 43 is a view of the assembly shown in FIGS. 41 and 42 after undergoing solder reflow such that the thermal interface/phase change material is in a configuration whereby a force can be generated for low thermal impedance.

DETAILED DESCRIPTION

The following description is merely exemplary in nature and is in no way intended to limit the present disclosure, application, or uses.

According to various aspects, exemplary embodiments include EMI shielding and thermal management assemblies capable of providing board level EMI shielding and heat dissipation of one or more electrical components. In various embodiments, an assembly includes a frame and a cover with multi-position latching. In such embodiments, the cover can be attached to the frame in a first latched or open position (e.g., in a first stage prior to reflow). The cover can also be attached to the frame in a second or operational latched position (e.g., in a second stage after reflow). Other aspects relate to components of such assemblies. Further aspects relate to methods of using EMI shielding and thermal management assemblies. Additional aspects relate to methods of making EMI shielding and thermal management assemblies, and methods of making the components thereof.

Various exemplary embodiments include thermally-enhanced EMI shielding assemblies that include frames and covers attachable thereto for providing board level EMI shielding and for electrically grounding the assembly to a board, such as printed circuit board, etc. In some embodiments, a pad or thermal interface material (also referred to herein as a thermal interface) can be disposed or attached to an inside surface of the cover. The thermal interface can be used for facilitating the transfer of heat generated by one or more electronic components to the cover.

In various embodiments, the assembly may also include a thermal management structure for dissipating or spreading heat generated by one or more electronic components of a board. This thermal management structure is also generally referred to herein as a heat sink, heat pipe, or heat spreader. In some embodiments, a thermal interface is disposed generally between the cover and the heat sink/heat spreader. This thermal interface can be used for facilitating the transfer of heat generated from cover to the heat sink/heat spreader. Using a heat sink/heat spreader and a thermal interface can improve thermal performance of the assembly in some embodiments.

Various embodiments include multi-position latching means for allowing a cover to be attached to a frame in a first latched position or a second latched position. This two-position latching can facilitate a surface mount technology (SMT) soldering process. In one particular example, the cover can be engaged to the frame in a first latched or open position such that a gap or spaced distance is provided between the cover and the electronic component(s) (e.g., microelectronic device on a board, etc.) disposed within the interior defined by the cover and the frame. This spaced distance can allow the frame to be placed in relatively intimate contact with a solder paste, thereby facilitating solder reflowing. For example, the frame can be placed into the solder paste at a sufficient depth to allow solder to "wick" or adhere to both sides of each of the frame's contacts during the solder reflow process.

After the soldering process has been completed, the cover may be moved relative to the frame (and board to which the frame is soldered) for attaching the cover to the frame in the second or operational latched position. In this second latched position, a compressive force is generated for compressing the thermal interface generally between the cover and the electronic component(s) for low thermal impedance. This compressive force can cause the thermal interface disposed on the inside of the cover to compress against at least a portion of the electronic component on the board. This compressive contact between the electronic component and the thermal interface creates a portion of an additional heat-conducting path through which heat generated by the electronic component can be conducted through the cover to the board and/or dissipated. That is, heat generated by the electronic component can be conducted to the thermal interface, and then to the cover. From the cover, heat can be conducted to the frame. From the frame, heat can be conducted to the board via the solder joints between the frame and the board. In those embodiments that include a heat sink/heat spreader, heat can also be conducted from the cover to a thermal interface, and then to the heat sink/spreader.

By way of example, one embodiment includes a cover and a frame wherein the cover is pressed vertically downward onto the frame such that at least one locking snap engages and locks into a corresponding opening to thereby engage the cover to the frame in the second latched configuration. In some embodiments, the cover includes the locking snaps or catches (e.g., latches, tabs, detents, protuberances, protrusions, ribs, ridges, ramp-ups, darts, lances, dimples, half-dimples, combinations thereof, etc.) with the frame including the corresponding openings (e.g., recesses, voids, cavities, slots, grooves, holes, depressions, combinations thereof, etc.). In other embodiments, the frame includes the locking snaps or catches, and the cover includes the corresponding openings. In still further embodiments, the cover and frame may both include locking snaps or catches for engaging corresponding openings of the other component.

Other embodiments include thermally-enhanced EMI shielding assemblies using disposable or relative low cost covers. In one example embodiment, a low cost/disposable cover without any thermal interface thereon can be used during the solder reflow process. This low cost/disposable cover can be latched to the frame in the first latched or open position such that a spaced distance is provided between the cover and an electronic component(s) (e.g., microelectronic device on a board, etc.). This spaced distance can allow the frame to be placed in relatively intimate contact with a solder paste, thereby facilitating solder reflowing.

After the soldering reflow process has been completed, the low cost/disposable cover can be removed from the frame (which is now soldered to the board) and be replaced with a replacement cover. Depending on the particular customer, the replacement cover can be relatively immediately attached to the soldered frame, or the replacement cover can be attached to the frame after the customer has inspected the frame, board to which the frame is soldered and/or electrical components mounted on the board. The replacement cover may include a thermal interface disposed on its inside surface. The replacement cover can be latched to the frame in the second or operational latched position. In this second latched position, a compressive force is generated for compressing the thermal interface generally between the cover and the electronic component(s) for low thermal impedance. This compressive force can cause the thermal interface disposed on the inside of the replacement cover to compress against at least a portion of the electronic component on the board. This compressive contact between the electronic component and the thermal interface creates a portion of an additional heat-conducting path through which heat generated by the electronic component can be conducted through the replacement cover to the board and/or dissipated.

In other exemplary embodiments, a combined low-profile EMI shielding and thermal management assembly includes a frame (e.g., a SMT frame, etc.) and a thermal interface that operates or functions as a cover or lid for the frame. In such embodiments, a SMT frame and a metalized thermal interface can provide EMI shielding by grounding the assembly to a board, such as a printed circuit board, etc. In addition, the SMT frame may include side pick-up areas or grippers for facilitating the placement of the frame on a board by using assembly line pick-and-place methods. Further, a thermal interface can also be used for facilitating the transfer of heat generated by the electronic component or components that will be EMI shielded by the assembly. A heat sink/heat spreader can also be used in some embodiments to increase thermal performance of the assembly. After solder reflow, the heat sink/heat spreader can be snapped or pressed into position during the assembly of the phone or other electronic device in which the assembly will be used, to thereby generate force having sufficient magnitude for providing the assembly with low thermal impedance. In various embodiments, the phone or other electronic device is configured to apply sufficient force to the heat sink/heat spreader for providing the assembly with good electrical and thermal interfaces.

Still further exemplary embodiments provide a combined low-profile EMI shielding and thermal management assembly that generally includes a frame, a cover, and a thermal interface/phase change material for generating force for low thermal impedance. In such embodiments, a SMT frame and a cover can provide EMI shielding by grounding the assembly to a board, such as a printed circuit board, etc. The thermal interface/phase change material can be used for facilitating the transfer of heat generated by the electronic component to the cover. The displacement of the thermal interface/phase change material that occurs after cooling from solder reflow temperature to room temperature can generate force sufficient for low thermal impedance. In such embodiments, the assembly can be shipped with the thermal interface/phase change material installed or disposed on the inside surface of the cover. The assembly can then be sent through a solder reflow process. As the board cools, solder used for mounting the frame to the board solidifies. The thermal interface/phase change material also solidifies, but surface tension of the thermal interface/phase change material keeps the thermal interface/phase change material in place. The relatively small movement of the cover results from thermal contraction as the assembly cools. This contraction of the cover can generate a force on the thermal interface/phase change material of sufficient magnitude to provide the assembly with low thermal impedance. In various embodiments, the thickness of the thermal interface/phase change material can be selected based at least in part on the cover height and the component height.

Figure 1:
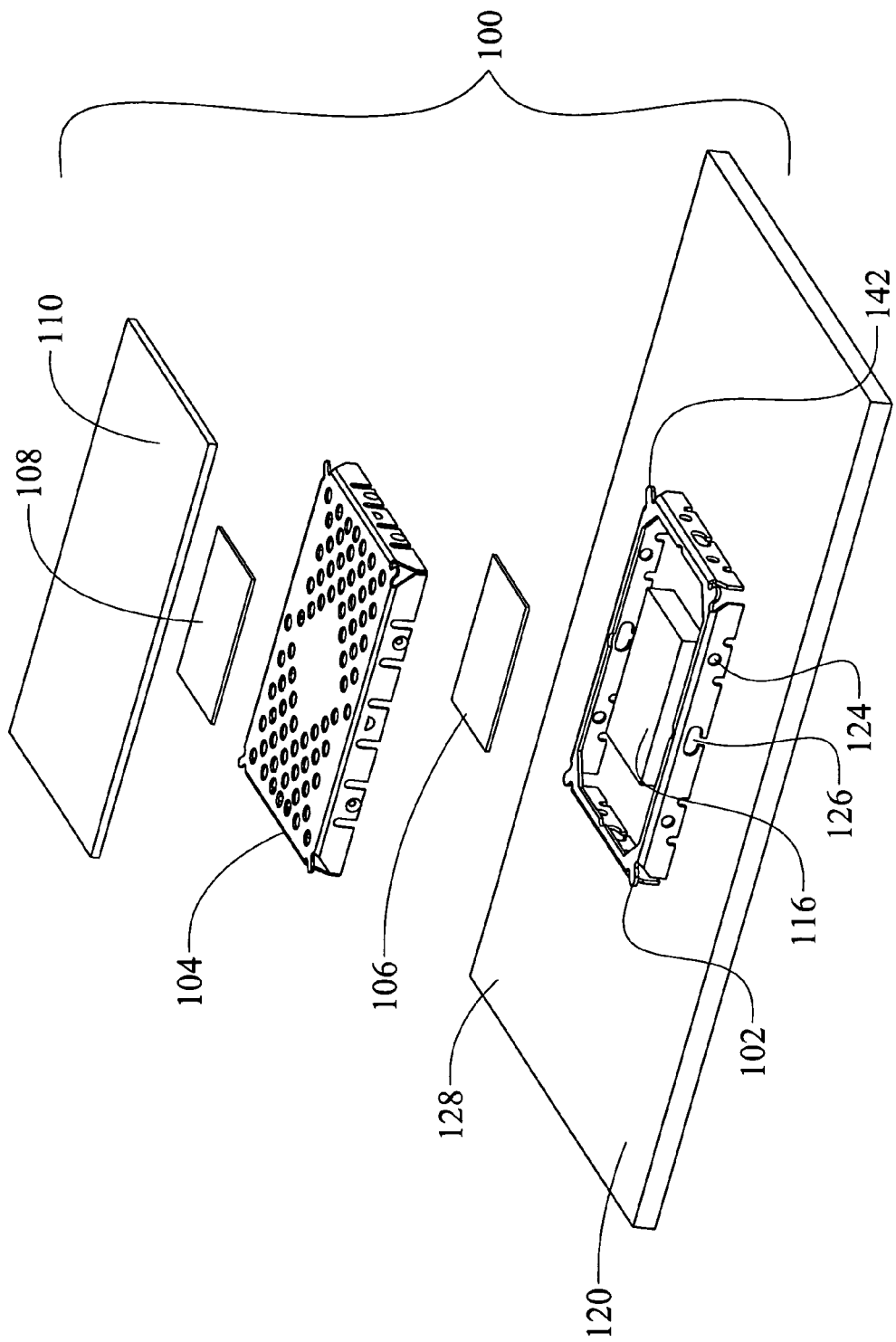
FIG. 1 is an exploded perspective view of an EMI shielding and thermal management assembly including a frame and a cover with multi-position latching such that the cover can be attached to the frame in a first or a second latched position according to exemplary embodiments.

FIG. 1 illustrates an exemplary combined low-profile EMI shielding and thermal management assembly 100 embodying one or more aspects of the present disclosure. As shown, the assembly 100 generally includes a base member or frame 102, a lid or cover 104, a first thermal interface 106, a second thermal interface 108, and a heat sink/heat spreader 110 for improving the spreading or dissipation of heat.

Figure 4:
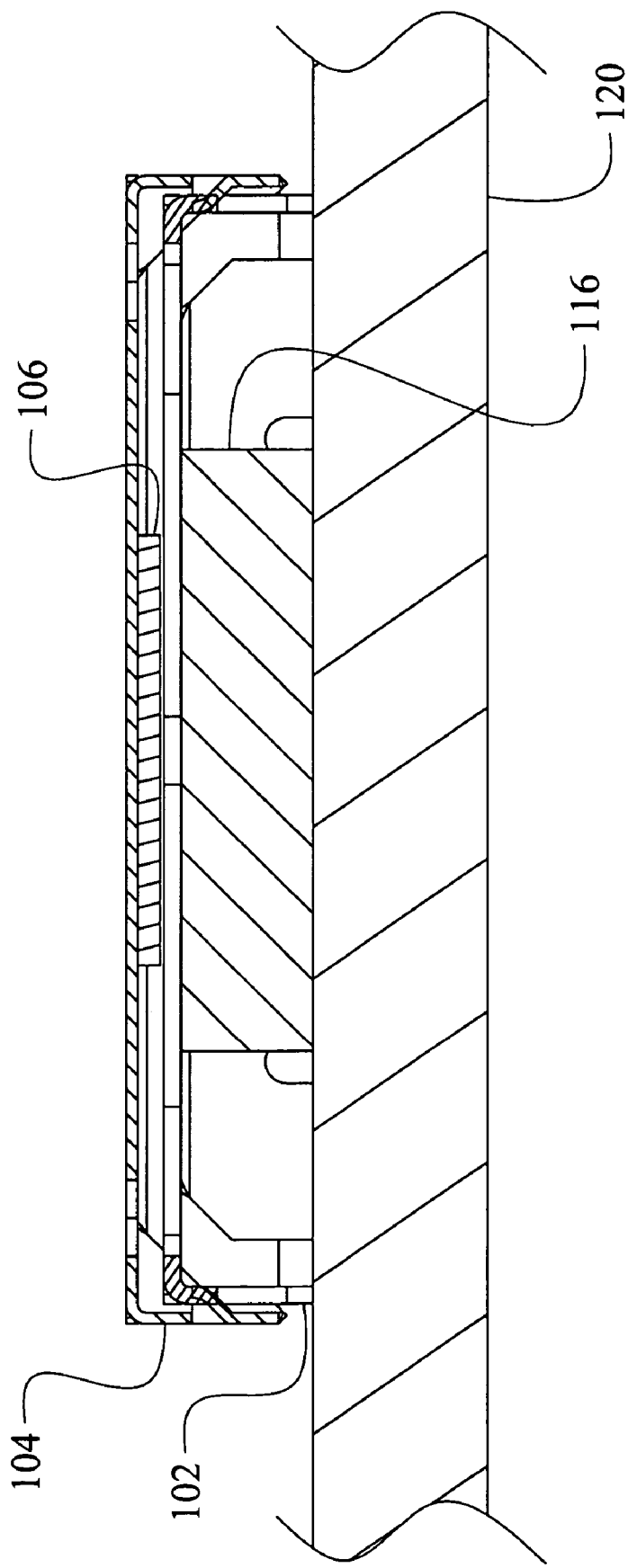
FIG. 4 is a cross-sectional view of the frame and the cover shown in FIGS. 2 and 3 illustrating the cover attached to the frame in a first latched position (e.g., in a first stage prior to reflow) whereby a spaced distance is provided between the electronic component and the thermal interface disposed on the inner surface of the cover.
Figure 5:
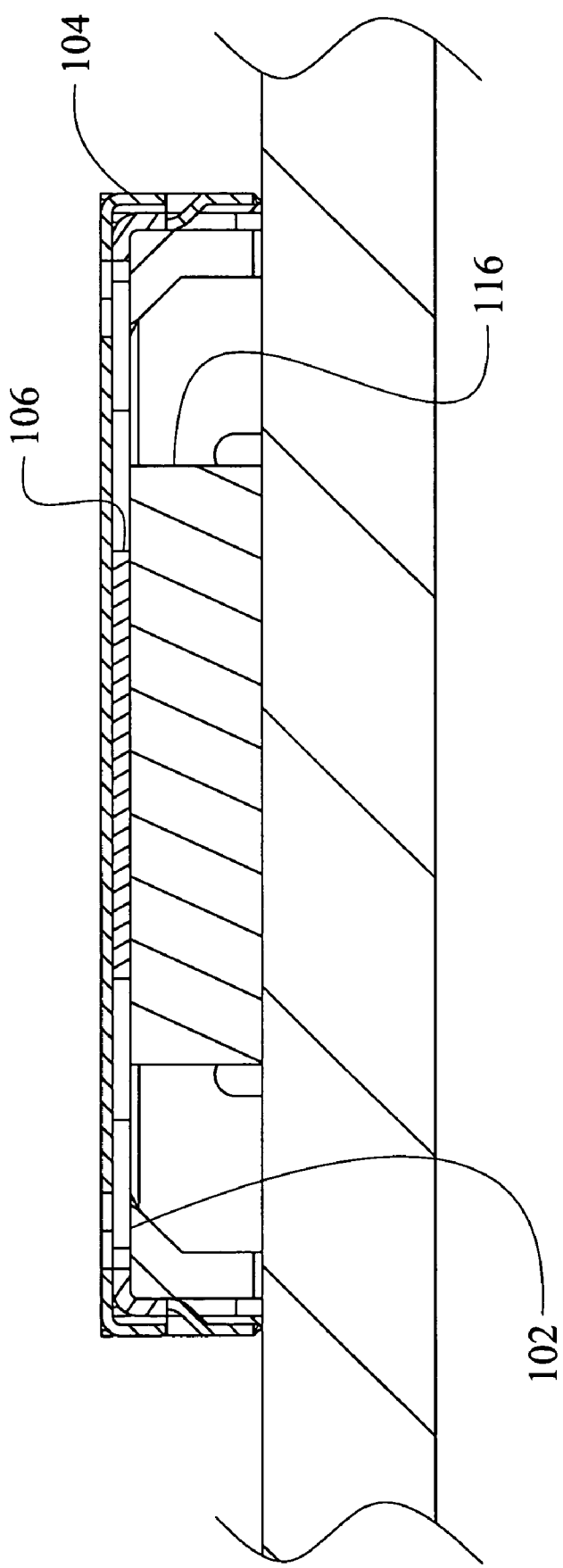
FIG. 5 is a cross-sectional view of the frame and cover shown in FIG. 4 illustrating the cover attached to the frame in a second latched position (e.g., in a second stage after reflow) whereby a compressive force is generated for compressing the thermal interface generally between the cover and the electronic component for low thermal impedance.
Figure 6:
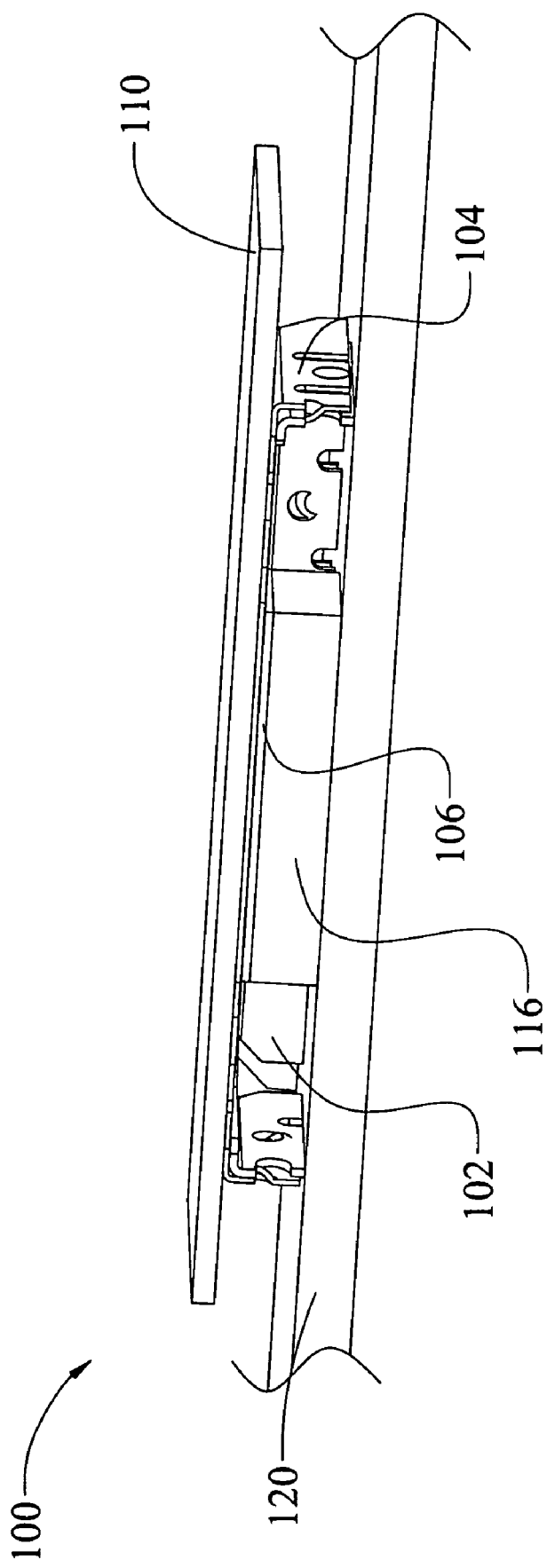
FIG. 6 is a cross-sectional view of the frame and cover shown in FIG. 5 and further illustrating a heat sink/heat spreader with a thermal interface disposed thereon according to exemplary embodiments.

FIGS. 4 through 6 illustrate the assembly 100 disposed over an electronic component 116 of a board 120 (e.g., printed circuit board, etc.), whereby the assembly 100 can EMI shield the electronic component 116 and dissipate heat generated by the electronic component 116. For example, the assembly 100 can shield the electronic component 116 from EMI/RFI emitted from other electronic components and/or inhibit EMI/RFI emitted by the electronic component 116 from interfering with other components. The assembly 100 can be used with a wide range of electronic components and packages, such as integrated circuits mounted on a printed circuit board, etc.

As shown in FIGS. 1 and 3 through 6, the first thermal interface 106 is disposed on an inner surface of the cover or lid 104. Accordingly, the first thermal interface 106 can facilitate the transfer of heat generated by the electronic component 116 to the cover 104. As shown in FIGS. 1 and 6, the second thermal interface 108 is disposed on a surface of the heat sink/heat spreader 110. Accordingly, the second thermal interface 108 can facilitate the transfer of heat from the cover 104 to the heat sink/heat spreader 110.

The first and second thermal interface 106, 108 can be formed from a wide variety of materials, which preferably are better thermal conductors and have higher thermal conductivities than air alone. Accordingly, the thermal interface 106 (with its compressive contact against the electrical component 116) can thus allow for improved heat transfer from the electrical component 116 to the cover 104 as compared to those designs relying solely upon air to define the heat path between the electrical component and the underside of the cover. In some preferred embodiments, the thermal interfaces 106, 108 are formed from T-flex™ 600 series thermal gap filler material commercially available from Laird Technologies, Inc. of Saint Louis, Mo., and, accordingly, have been identified by reference to a trademark of Laird Technologies, Inc. In one particular preferred embodiment, the thermal interfaces 106, 108 comprise T-flex™ 620 thermal gap filer material, which generally includes reinforced boron nitride filled silicone elastomer. By way of further example, other embodiments include thermal interfaces 106, 108 molded from electrically-conductive elastomer. Additional exemplary embodiments include thermal interface materials formed from ceramic particles, ferrite EMI/RFI absorbing particles, metal or fiberglass meshes in a base of rubber, gel, grease or wax, etc. Other suitable thermal interface materials are set forth in the table below. Alternative embodiments, however, can provide an assembly that does not include a first thermal interface 106 and/or a second thermal interface 108.

A wide variety of materials can also be used for the heat sink or heat spreader 110, which are preferably good thermally conducting and, in some embodiments, also good shielding materials. Exemplary materials that can be used include copper and copper-based alloys, beryllium-copper alloys, aluminum, brass, phosphor bronze, etc. In some embodiments, the heat sink/spreader 110 may comprise bare or uncoated metal. In some other embodiments, the heat sink/spreader 110 may comprise a metal coated with a suitable electrically-conductive plating to provide galvanic compatibility with the frame 102.

With continued reference to FIGS. 4 and 5, the cover 104 can be attached to the frame 102 in a first latched position (FIG. 4) or a second latched position (FIG. 5). This two-position latching can help enable surface mount technology (SMT) soldering. In this regard, the cover 104 can be engaged to the frame 102 in the first latched or open position (FIG. 4) such that a gap or spaced distance separates the cover 104 from the top surface of the electronic component 116. This spaced distance can allow the frame 102 to be placed in relatively intimate contact with a solder paste, thereby facilitating solder reflowing. After solder reflowing, the cover 104 can be moved relative to the frame 102 (and the board 120 to which the frame 102 is soldered) for attaching the cover 104 to the frame 102 in the second latched position (FIG. 5). In this second latched position, a compressive force is generated for compressing the first thermal interface 106 generally between the cover 104 and the electronic component 116 for low thermal impedance. This compressive force can cause the first thermal interface 106 disposed on the inside of the cover 104 to compress against at least a portion of the electronic component 116. This compressive contact between the electronic component 116 and the first thermal interface 106 creates a heat-conducting path through which heat generated by the electronic component 116 can be conducted. For example, heat generated by the electronic component 116 can be conducted to the first thermal interface 106, and then to the cover 104. From the cover 104, heat can be conducted to the frame 102. From the frame 102, heat can be conducted to the board 120 via the solder joints between the frame 102 and the board 120. And in the illustrated embodiment of FIGS. 1 and 6 that includes the heat sink/heat spreader 110, heat can also be conducted from the cover 104 to the second thermal interface 108, and then to the heat sink/heat spreader 110.

Figure 3:
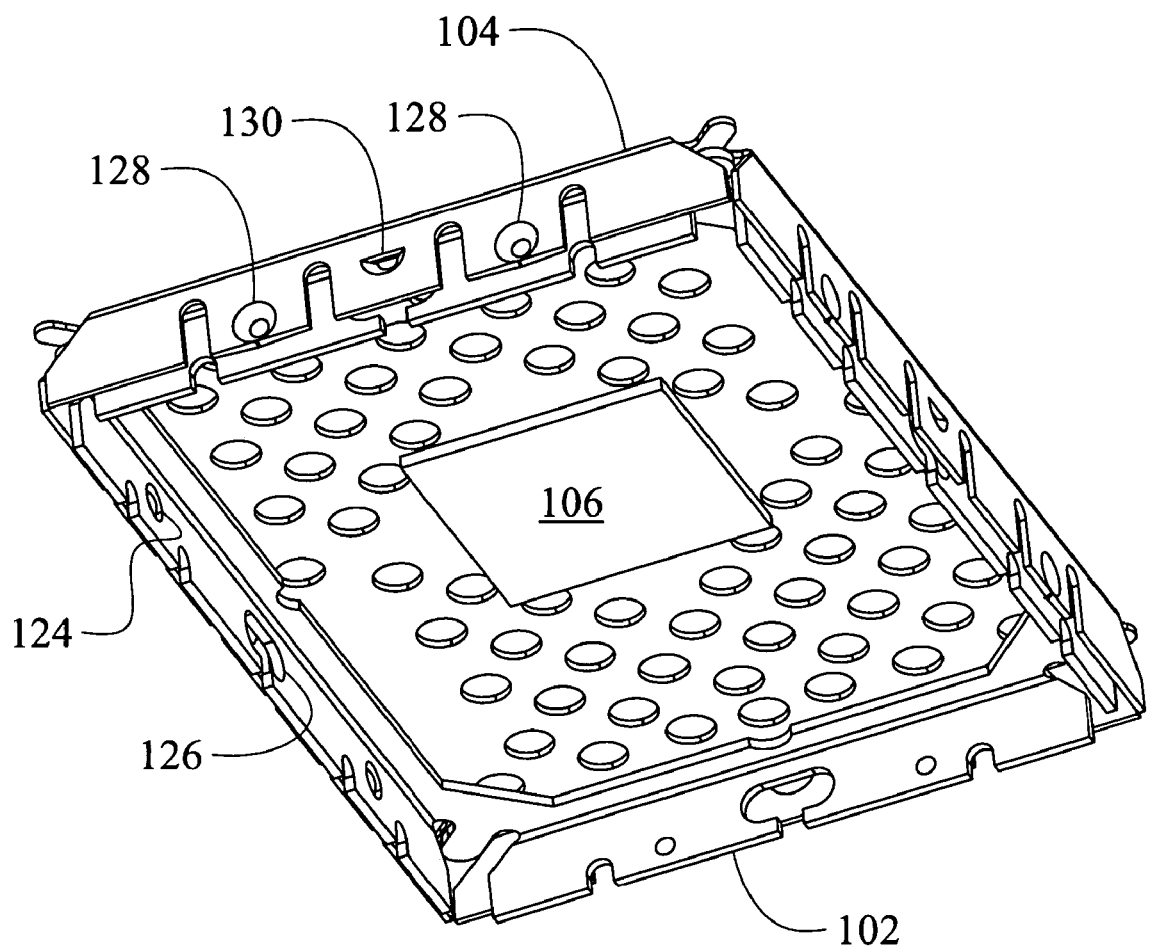
FIG. 3 is a lower perspective view of the frame and cover shown in FIG. 2 and further illustrating a thermal interface disposed on an inner surface of the cover.

Referring to FIG. 3, the frame 102 includes first and second openings 124 and 126. The cover 104 includes detents, protrusions or protuberances 128 and 130 configured to be engagingly received in the corresponding first and second openings 124 and second openings 126 of the frame 102. For the first latched position, the first detents 128 of the cover 104 are engaged (e.g., interlocked or snapped into, etc.) the first openings 124 of the frame 102. But as the cover 104 is moved downwardly relative to the frame 102, the cover's second detents 130 (e.g., shown as half-dimples in this embodiment) then engage (e.g., interlock or snap into, etc.) the corresponding second openings 126 of the frame 102, thereby attaching the cover 104 to the frame 102 in the second latched position. In the second latched position, a mechanical or clamping force is generated that biases the cover 104 downwardly towards the frame 102. This biasing force can provide the assembly 100 with relatively low thermal impedance by causing the first thermal interface 106 to compressively contact against at least a portion of the electronic component 116 (as shown in FIG. 5). In some embodiments, the thermal interface 106 can be configured (e.g., sized, shaped, located, materials, etc.) to be sandwiched under pressure between the cover 104 and the electronic component 116 when the cover 104 is attached to the frame 102 in the second latched position.

Figure 2:
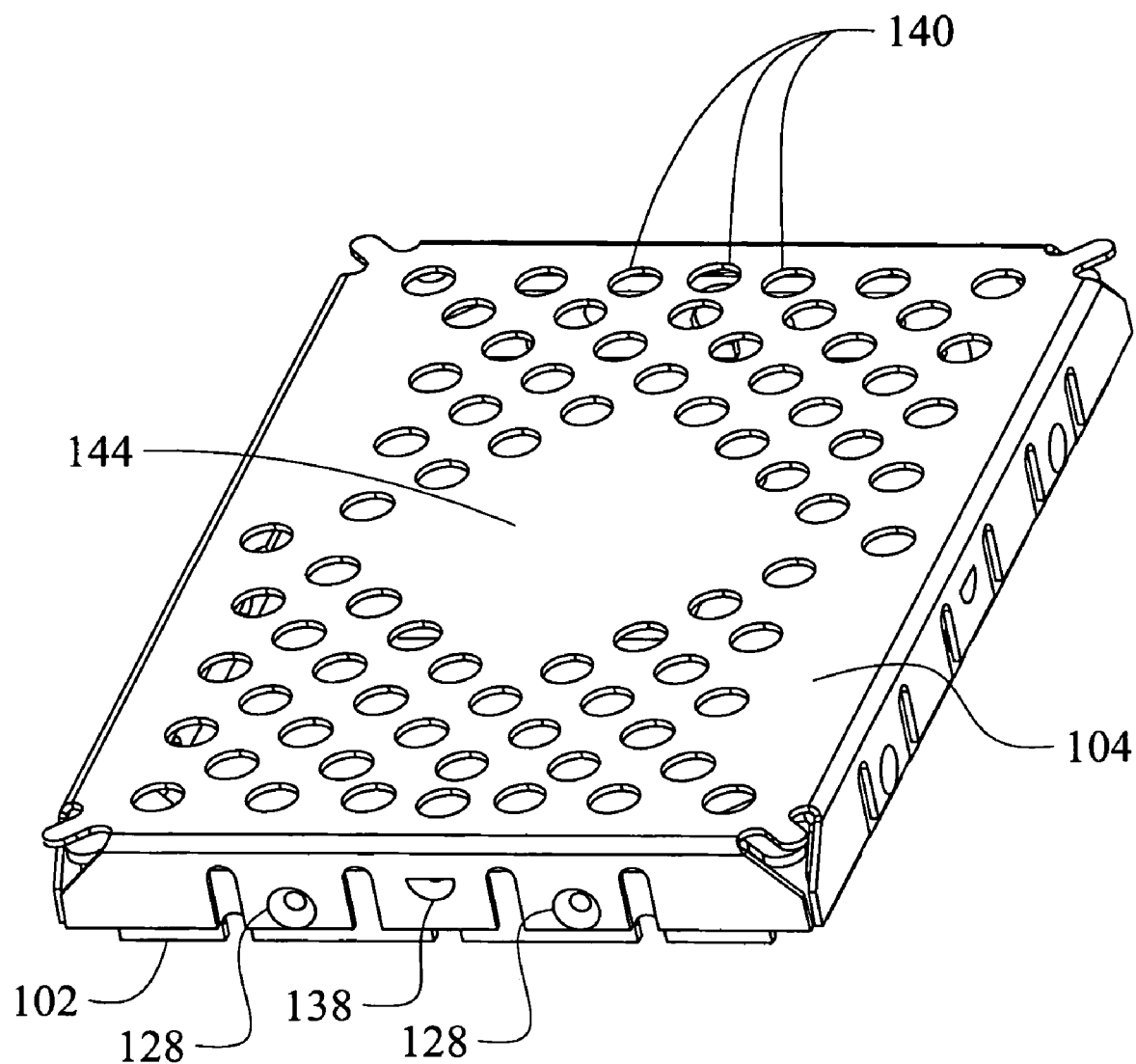
FIG. 2 is a perspective view of the frame and the cover shown in FIG. 1 with the cover attached to the frame in a first latched position (e.g., in a first stage prior to reflow)

With continued reference to FIGS. 1 through 3, the illustrated cover 104 includes a plurality of apertures or holes 140. These holes 140 can facilitate solder reflow heating interiorly of the cover 104, can enable cooling of the electronic component 116, and/or can permit visual inspection of portions of the electronic components beneath the cover 104. In some embodiments, the holes 140 are sufficiently small to inhibit passage of interfering EMI/RFI. The particular number, size, shape, orientation, etc. of the holes 140 can vary depending, for example, on the particular application (e.g., sensitivity of the electronics where more sensitive circuitry may necessitate the use of smaller diameter holes, etc.).

Figure 13:
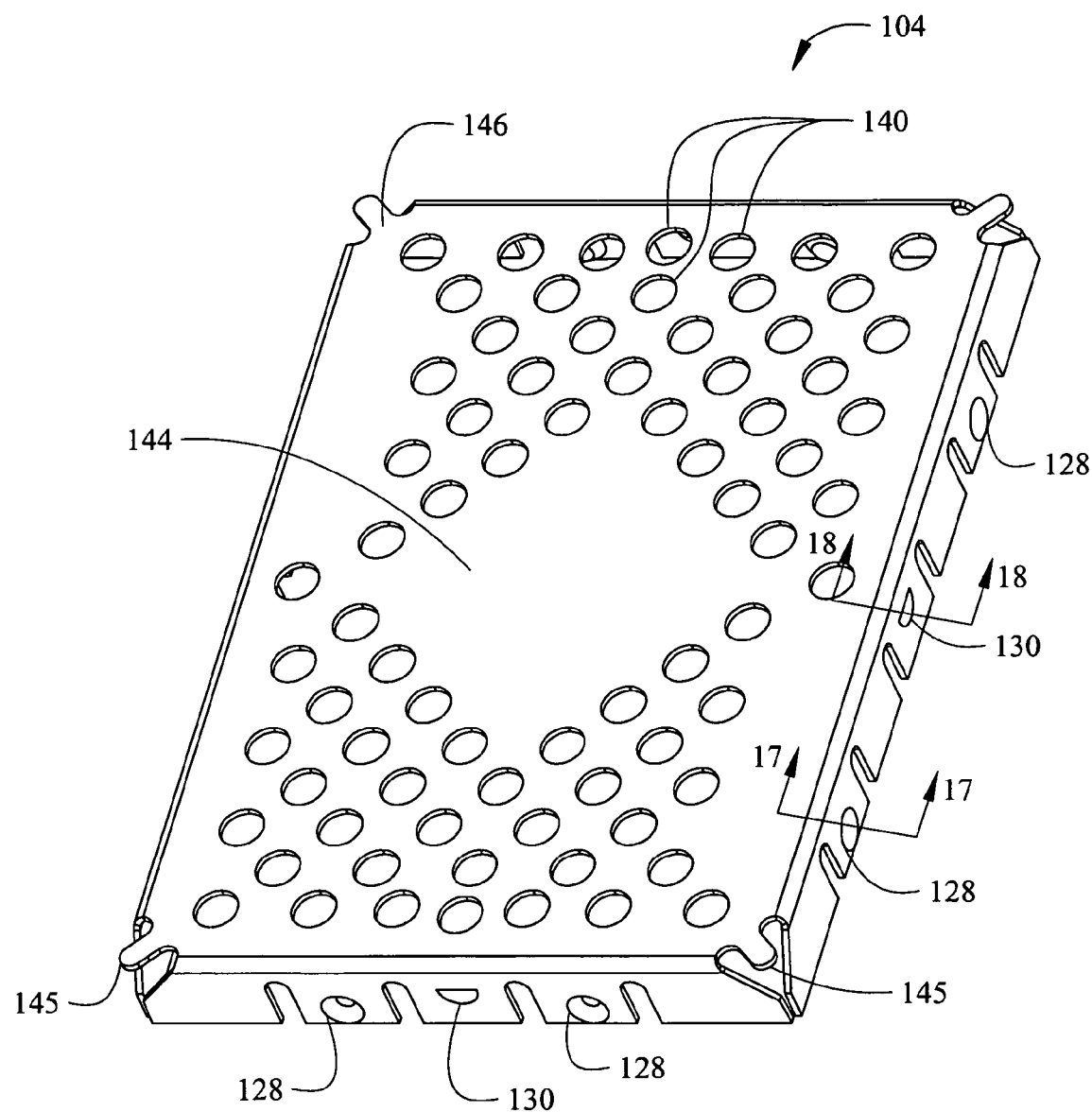
FIG. 13 is a perspective view of the cover shown in FIGS. 1 through 6.
Figure 14:
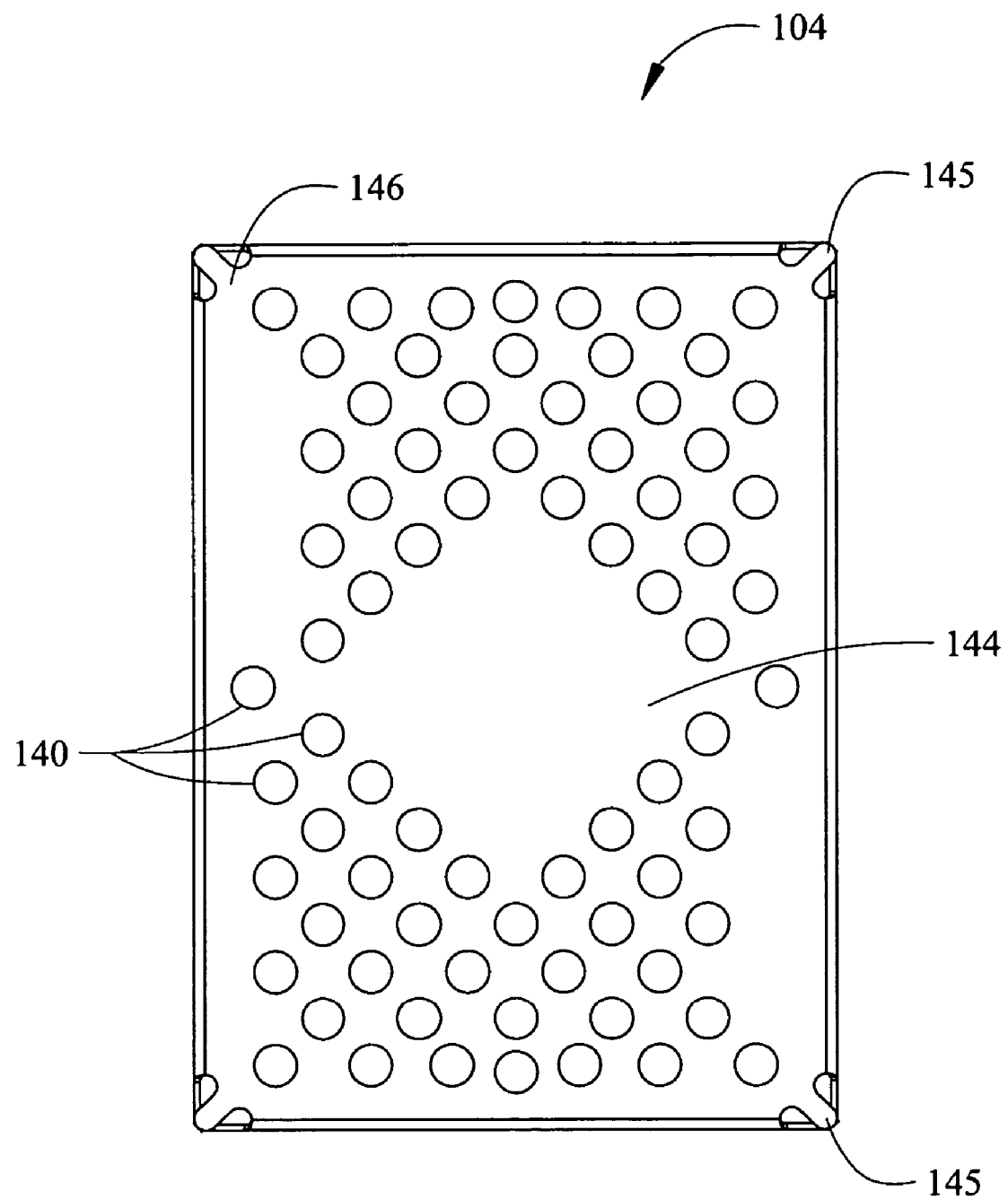
FIG. 14 is an upper plan view of the cover shown in FIG. 13.
Figure 15:
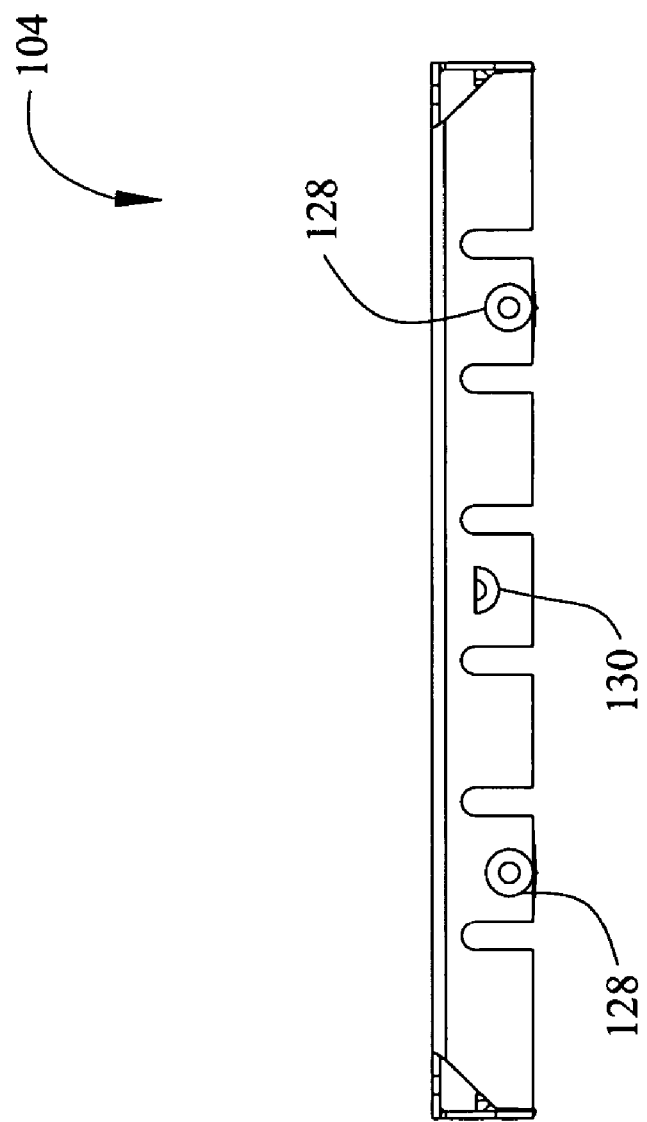
FIG. 15 is a side elevation view of the cover shown in FIG. 13.
Figure 16:
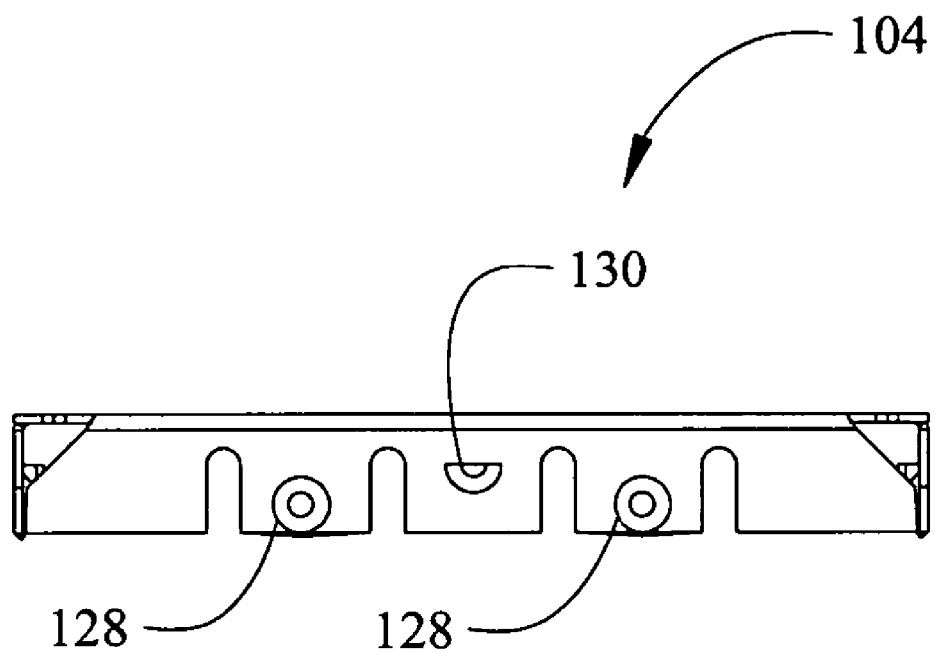
FIG. 16 is a front elevation view of the cover shown in FIG. 13.
Figure 17:
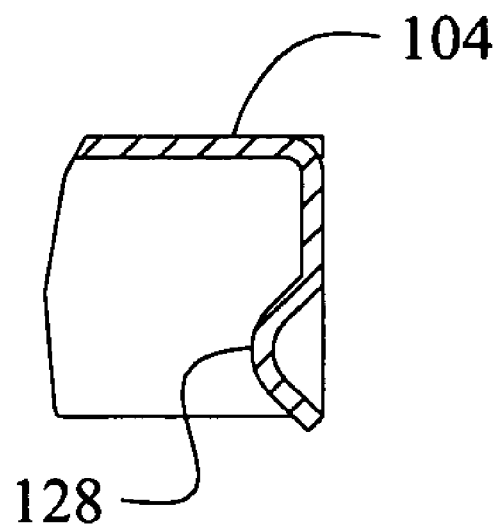
FIG. 17 is a partial cross-sectional view of the cover taken along the line 17-17 in FIG. 13 and illustrating one of the cover's detents that is used for latching the cover in the first latched position to the frame shown in FIGS. 7 through 11.
Figure 18:
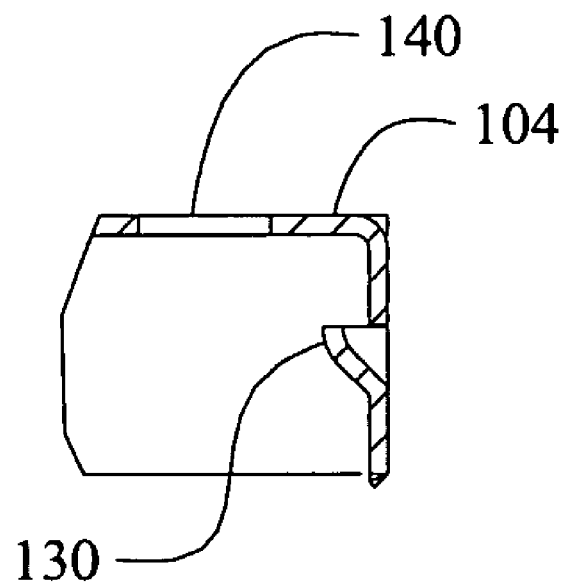
FIG. 18 is a partial cross-sectional view of the cover taken along the line 18-18 in FIG. 13 and illustrating one of the cover's detents that is used for latching the cover in the second latched position to the frame shown in FIGS. 7 through 11.

In addition, the frame 102 and/or the cover 104 can be configured to allow for handling by pick-and-place equipment (e.g., vacuum pick-and-place equipment, etc.). For example, FIGS. 13 and 14 illustrate the cover 104 having a pick-up area 144. In addition, the cover 104 is also shown with a plurality of tabs 145 at the corners 146. In some embodiments, the corners 146 and/or tabs 145 can facilitate handling of the cover 104, for example, during fabrication of the cover 104 through a progressive die stamping process. Alternatively, other manufacturing methods can also be used for making the cover 104.

Figure 7:
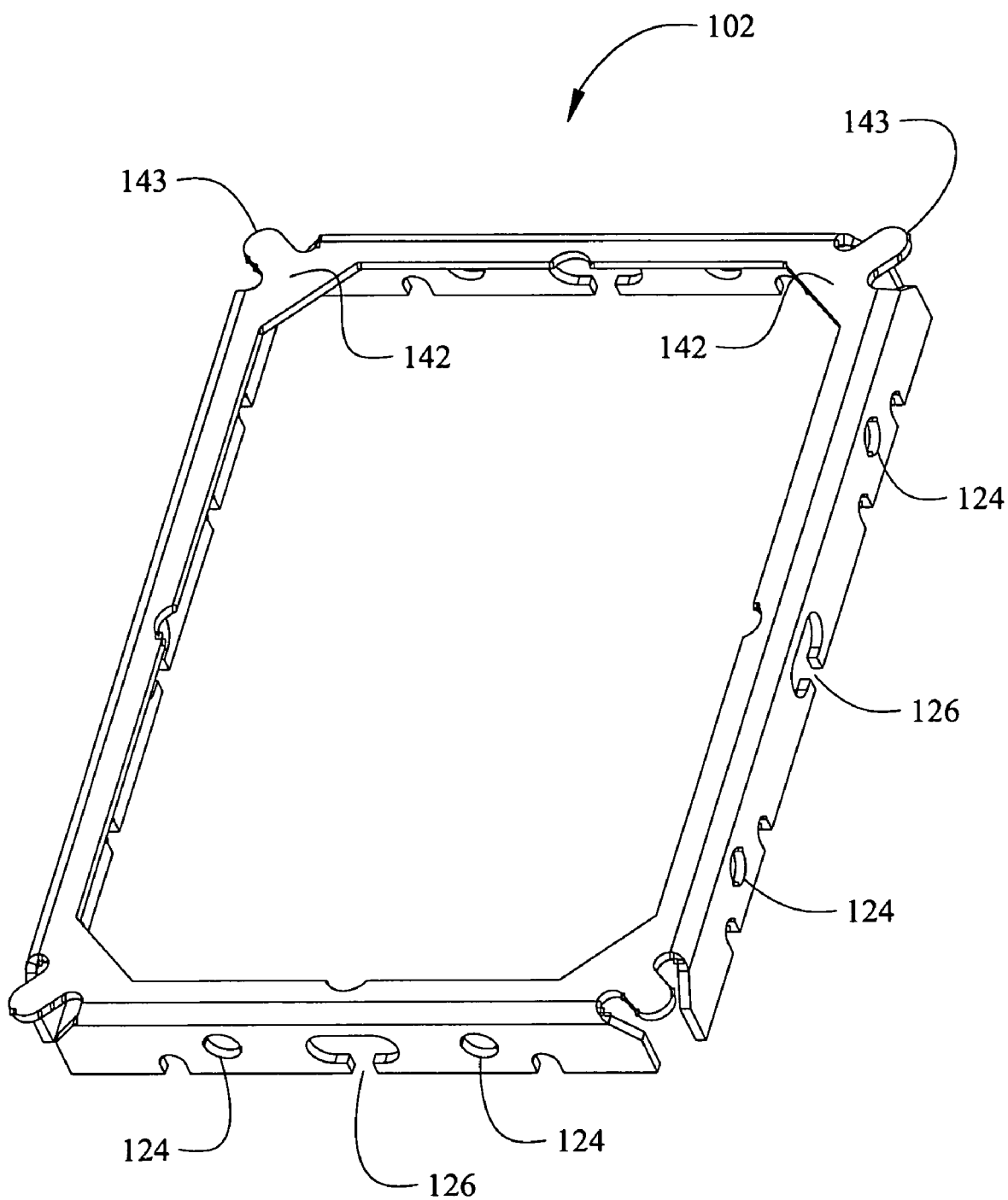
FIG. 7 is a perspective view of the frame shown in FIGS. 1 through 6.
Figure 8:
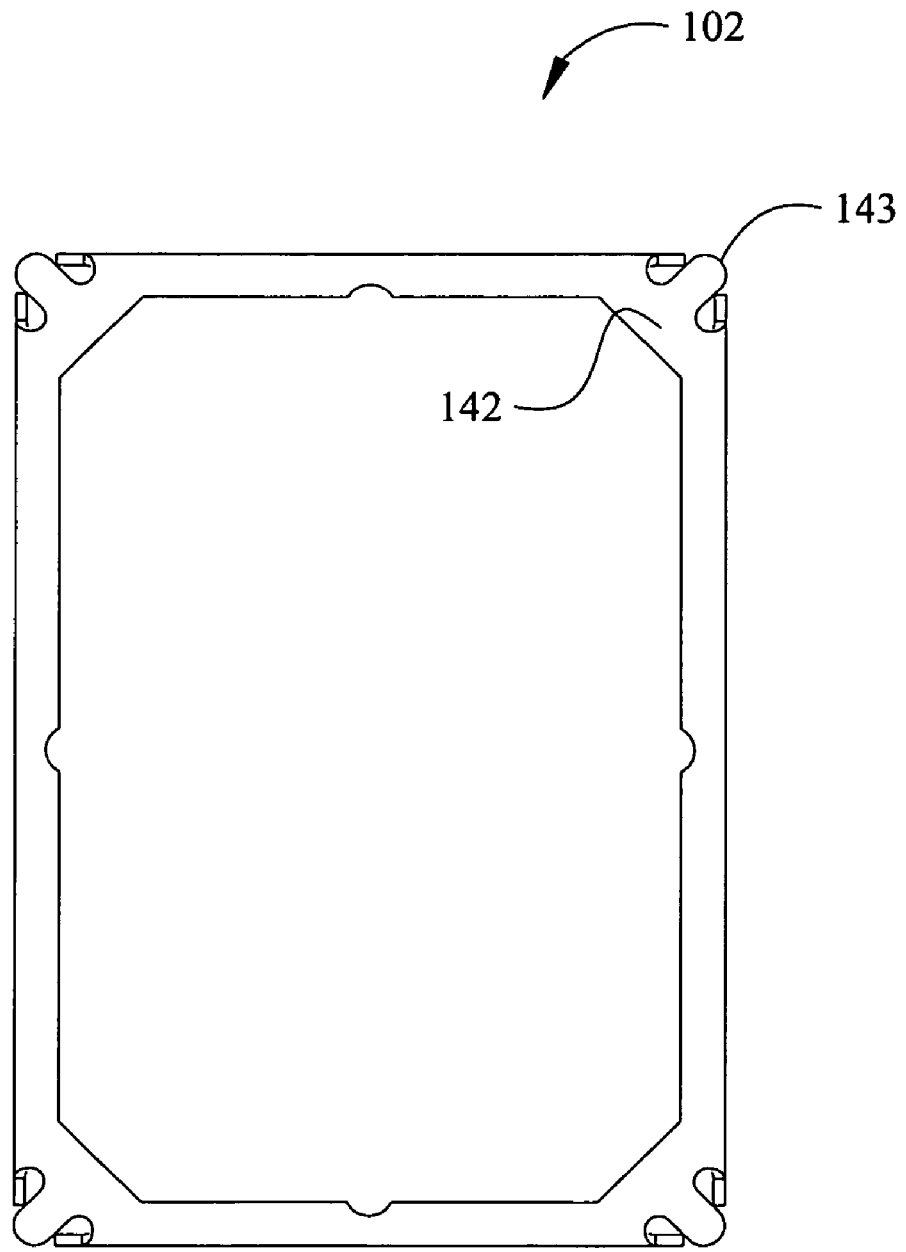
FIG. 8 is an upper plan view of the frame shown in FIG. 7.
Figure 9:
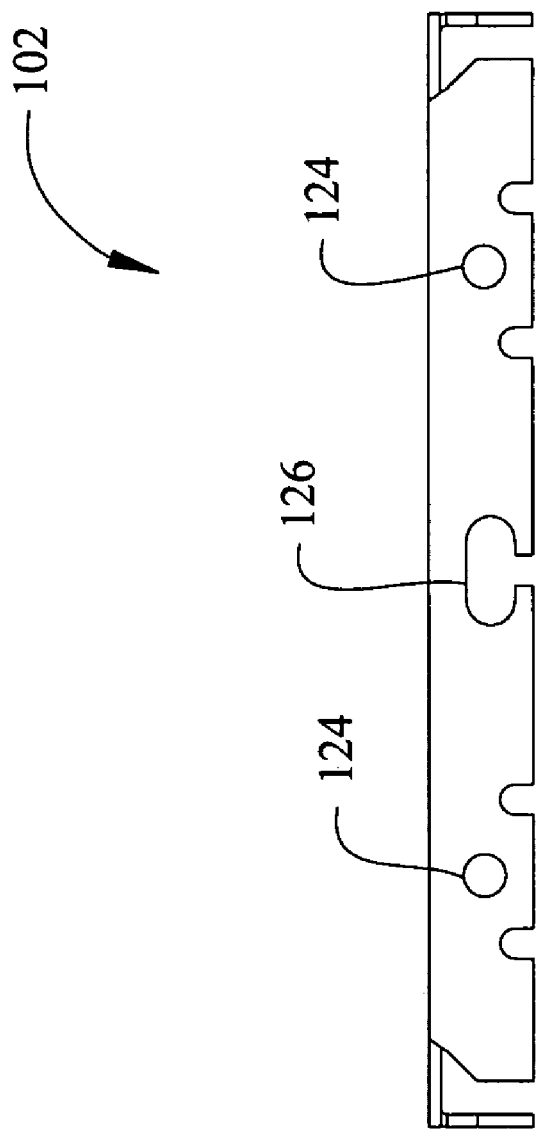
FIG. 9 is a side elevation view of the frame shown in FIG. 7.
Figure 10:
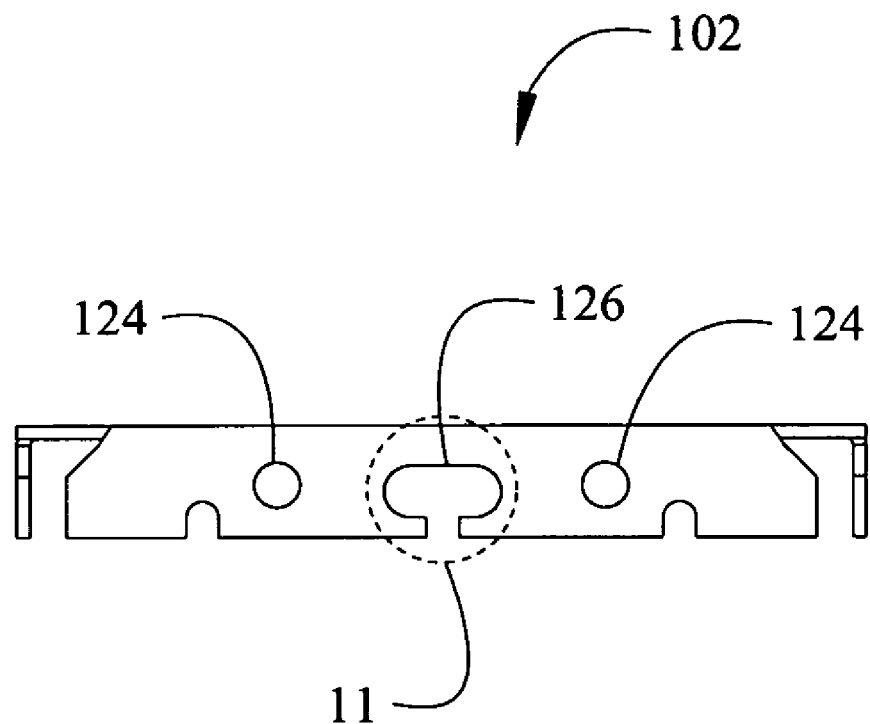
FIG. 10 is a front elevation view of the frame shown in FIG. 7.
Figure 11:
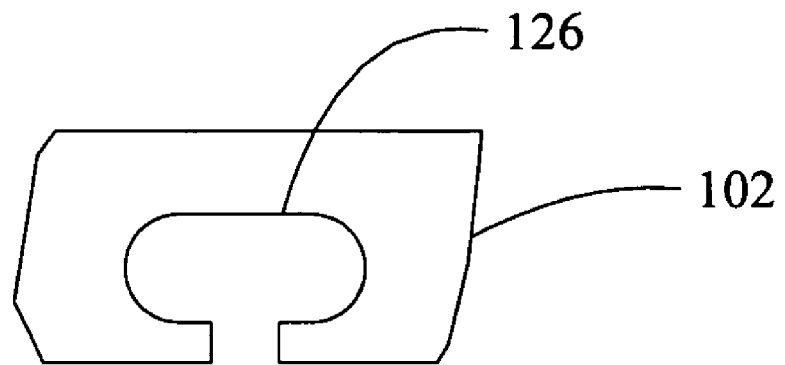
FIG. 11 is a elevation view of the portion designated 11 in FIG. 10.
Figure 40:
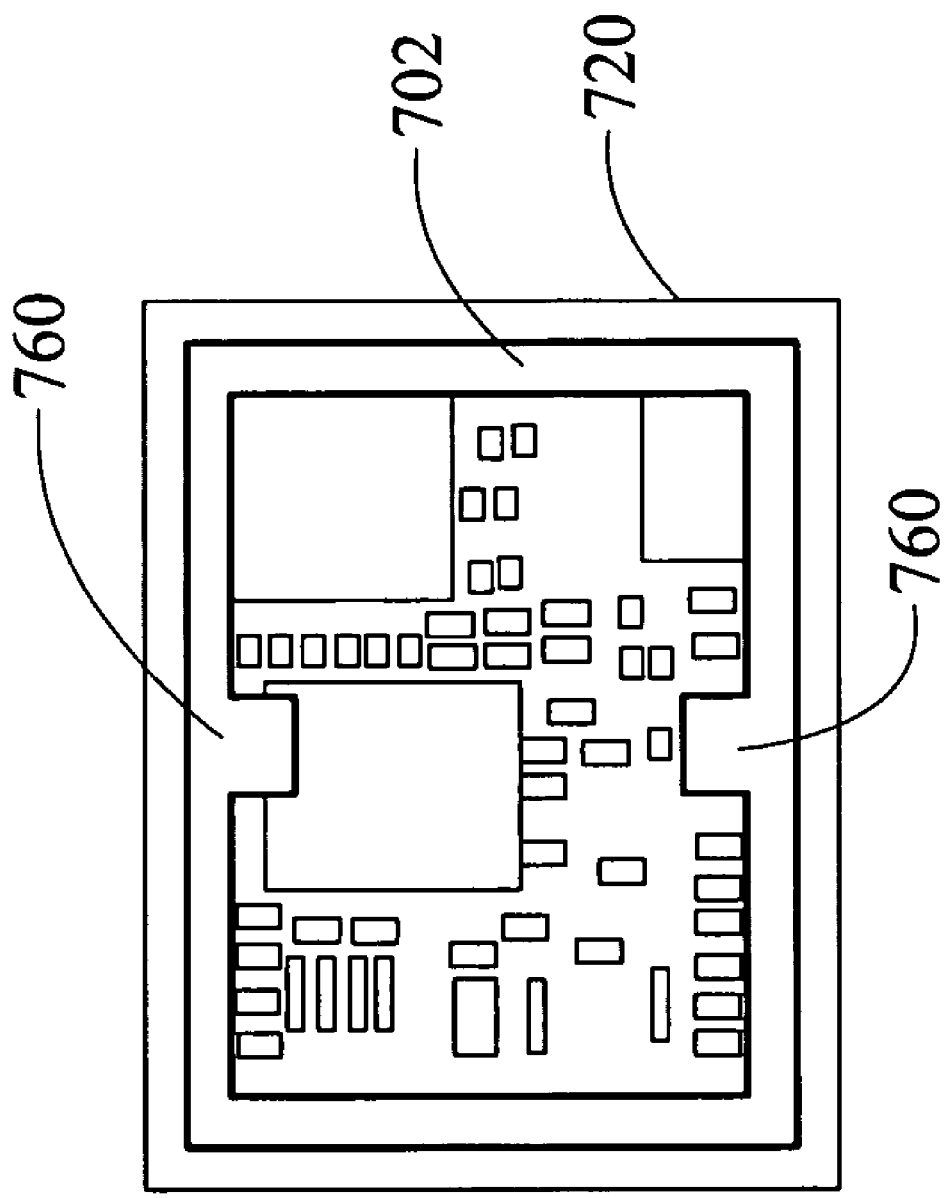
FIG. 40 is an upper plan view of a frame placed on a printed circuit board where the frame includes gripper areas according to exemplary embodiments.

FIGS. 7 and 8 illustrate the frame 102 with areas 142 at each corner. Also shown in FIGS. 7 and 8, the frame 102 also includes tabs 143 at the corners. Additionally, or alternatively, the frame 102 can include areas 143 similar to what is shown in FIG. 40, where the frame 702 includes pick-up areas 760. In some embodiments, the areas 142 and/or tabs 143 can facilitate handling of the frame 102, for example, during fabrication of the frame 102 through a progressive die stamping process. Alternatively, other manufacturing methods can also be used for making the frame 102.

Accordingly, the frame 102 and cover 104 may be individually handled manually and/or by pick-and-place equipment in some embodiments. After the cover 104 has been assembled to the frame 102, the cover 104 and frame 102 may be collectively handled manually or by pick-and-place equipment (e.g., vacuum pick-and-place equipment, etc.) via the cover's pick-up area 144 and/or the cover's corners 146.

As shown in FIGS. 1 through 3, the frame 102 and cover 104 are both generally rectangular. Alternative embodiments can include a frame and/or a cover having more or less than four peripheral walls and/or peripheral walls in other rectangular configurations or non-rectangular configurations (e.g., triangular, hexagonal, circular, other polygonal shapes, other rectangular configurations than what is shown in figures, etc.). Further embodiments can include peripheral walls having more or less openings and/or more or less detents than what are disclosed in the figures.

Figure 12:
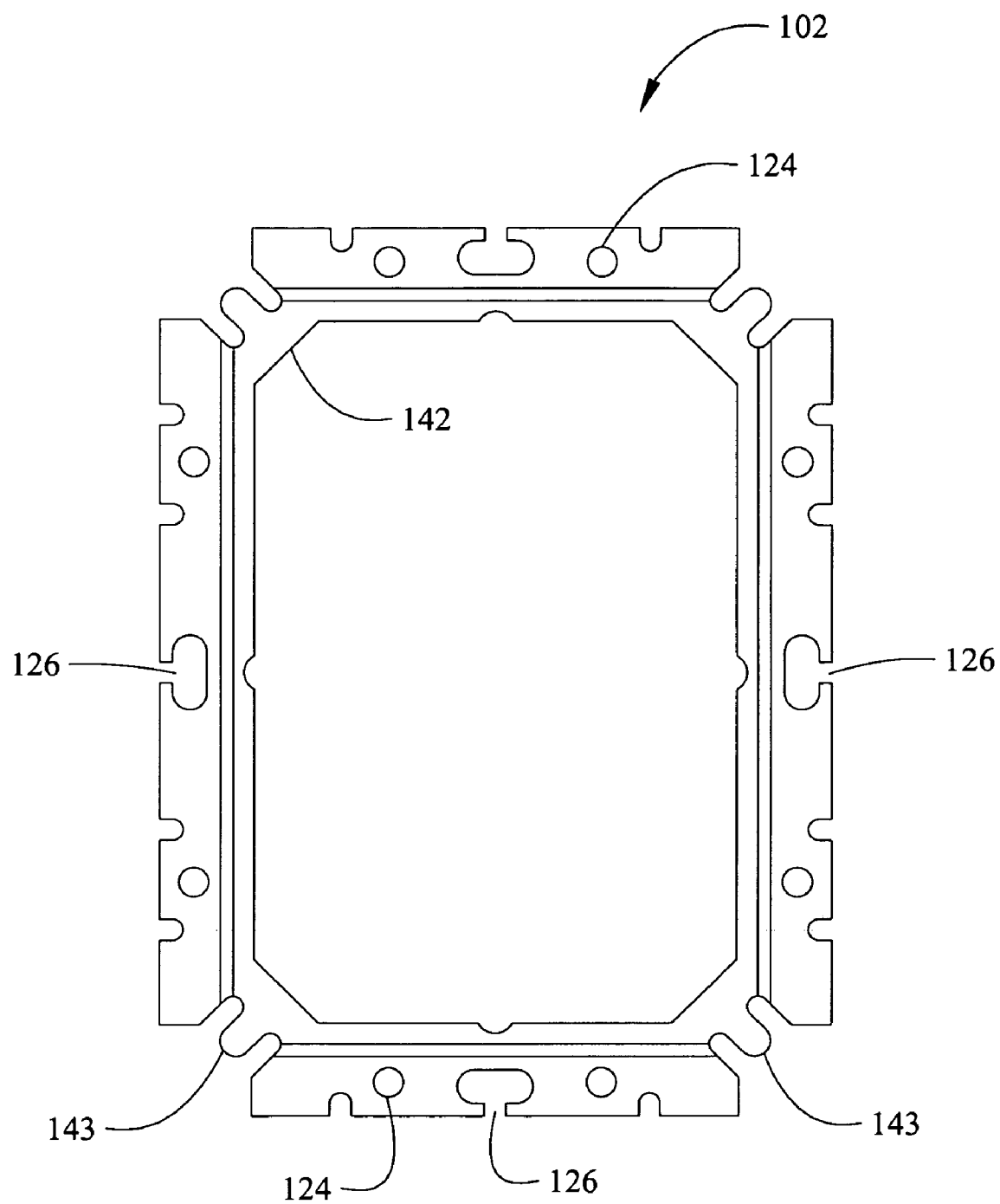
FIG. 12 is a plan view of a blank including a flat pattern profile that can be used to make the frame shown in FIGS. 7 through 11 according to exemplary embodiments.

In various embodiments, the frame 102 can be integrally or monolithically formed as a single component. For example, FIG. 12 illustrates an exemplary blank that can be used for making the frame 102. In this particular embodiment, the frame 102 can be formed by stamping in a piece of material a flat profile pattern for the frame 102. As shown in FIG. 12, the stamped profile for the frame 102 includes openings 124, 126 and tabs 143. After stamping the flat pattern profile for the frame 102 into the piece of material, the wall portions may then be folded or bent generally perpendicular as shown in FIGS. 7 through 10. Even though the frame 102 can be formed integrally in this example, such is not required for all embodiments. For example, other embodiments of the frame may include tabs or wall portions that are discrete components separately attached to the frame, for example, by welding, adhesives, among other suitable methods. Alternative configurations (e.g., shapes, sizes, etc.), materials, and manufacturing methods (e.g., drawing, etc.) can be used for making the frame 102.

A wide range of materials can be used for the frame 102, which are preferably suitably solderable for surface mount technology reflow operations. Exemplary materials that can be used for the frame include nickel-silver alloys, copper-nickel alloys, cold rolled steel, stainless steel, tin-plated cold rolled steel, tin-plated copper alloys, carbon steel, brass, copper, aluminum, copper-beryllium alloys, phosphor bronze, steel, combinations thereof, among other suitable electrically conductive materials. In one exemplary embodiment, a frame 102 is formed from a sheet of nickel-silver alloy having a thickness of about 0.20 millimeter. The materials and dimensions provided herein are for purposes of illustration only, as the assembly and components thereof can be configured from different materials and/or with different dimensions depending, for example, on the particular application, such as the component to be shielded, space considerations within the overall apparatus, EMI shielding and heat dissipation needs, and other factors.

Figure 19:
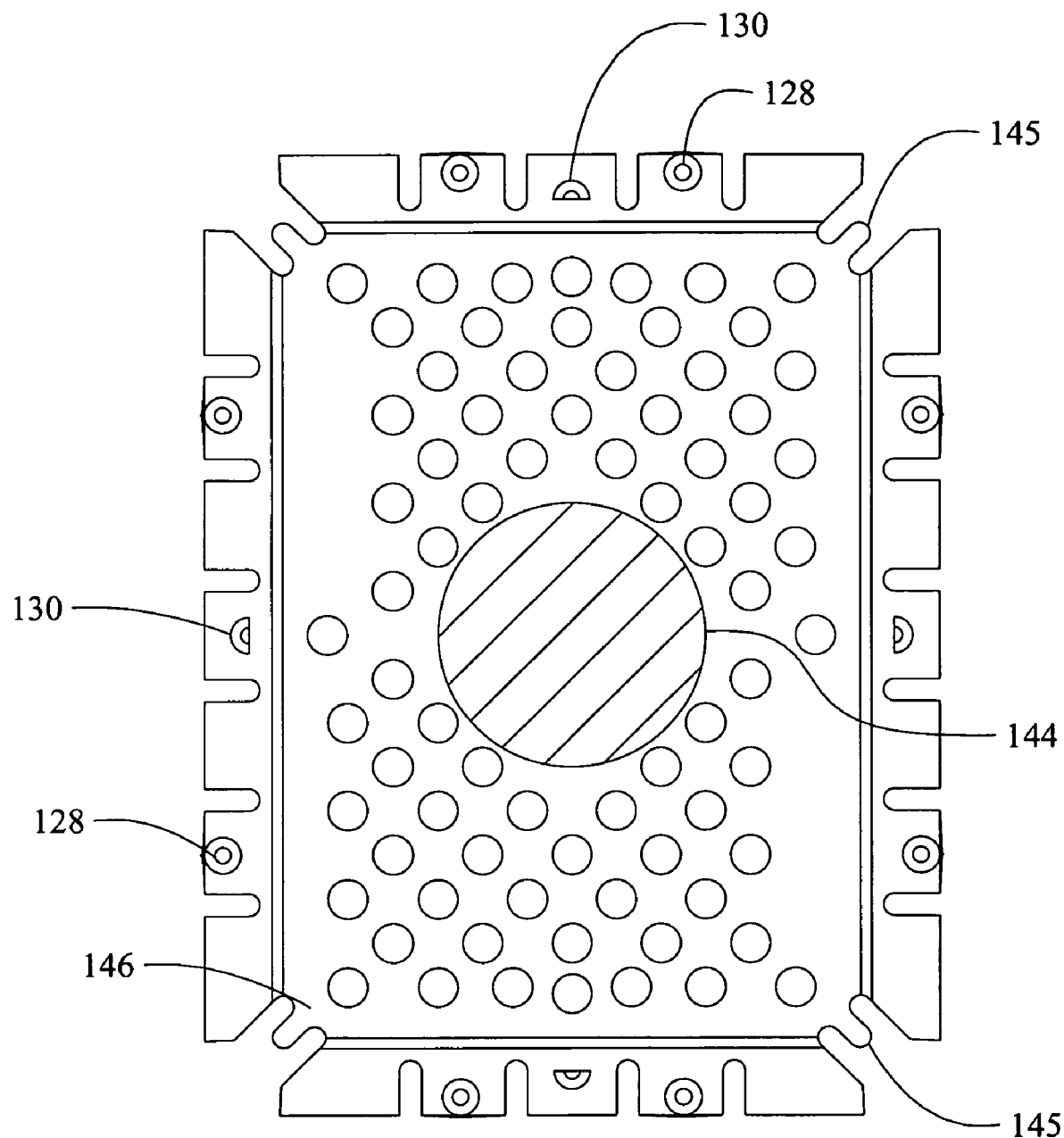
FIG. 19 is a plan view of a blank including a flat pattern profile that can be used to make the cover shown in FIGS. 13 through 18 according to exemplary embodiments.

In various embodiments, the cover 104 can be integrally or monolithically formed as a single component. For example, FIG. 19 illustrates an exemplary blank that can be used for making the cover 104. In this particular embodiment, the cover 104 can be formed by stamping in a piece of material a flat profile pattern for the cover 104. As shown in FIG. 19, the stamped profile for the cover 104 includes detents 228, 230, holes 140, and tabs 145. After stamping the flat pattern profile for the cover 104 into the piece of material, the wall portions may then be folded or bent generally perpendicular as shown in FIGS. 13 through 16. Even though the cover 104 can be formed integrally in this example, such is not required for all embodiments. For example, other embodiments may include tabs, wall portions, and/or protuberances that are discrete components separately attached to the cover 104, for example, by welding, adhesives, among other suitable methods. Alternative configurations (e.g., shapes, sizes, etc.), materials, and manufacturing methods (e.g., drawing, etc.) can be used for making the cover 104.

A wide range of materials can be used for the cover 104, such as nickel-silver alloys, copper-nickel alloys, cold rolled steel, stainless steel, tin-plated cold rolled steel, tin-plated copper alloys, carbon steel, brass, copper, aluminum, copper-beryllium alloys, phosphor bronze, steel, combinations thereof, among other suitable electrically conductive materials. In one exemplary embodiment, a cover 104 is formed from a sheet of nickel-silver alloy having a thickness of about 0.13 millimeter. The materials and dimensions provided herein are for purposes of illustration only, as the assembly and components thereof can be configured from different materials and/or with different dimensions depending, for example, on the particular application, such as the component to be shielded, space considerations within the overall apparatus, EMI shielding and heat dissipation needs, and other factors.

Figure 20:
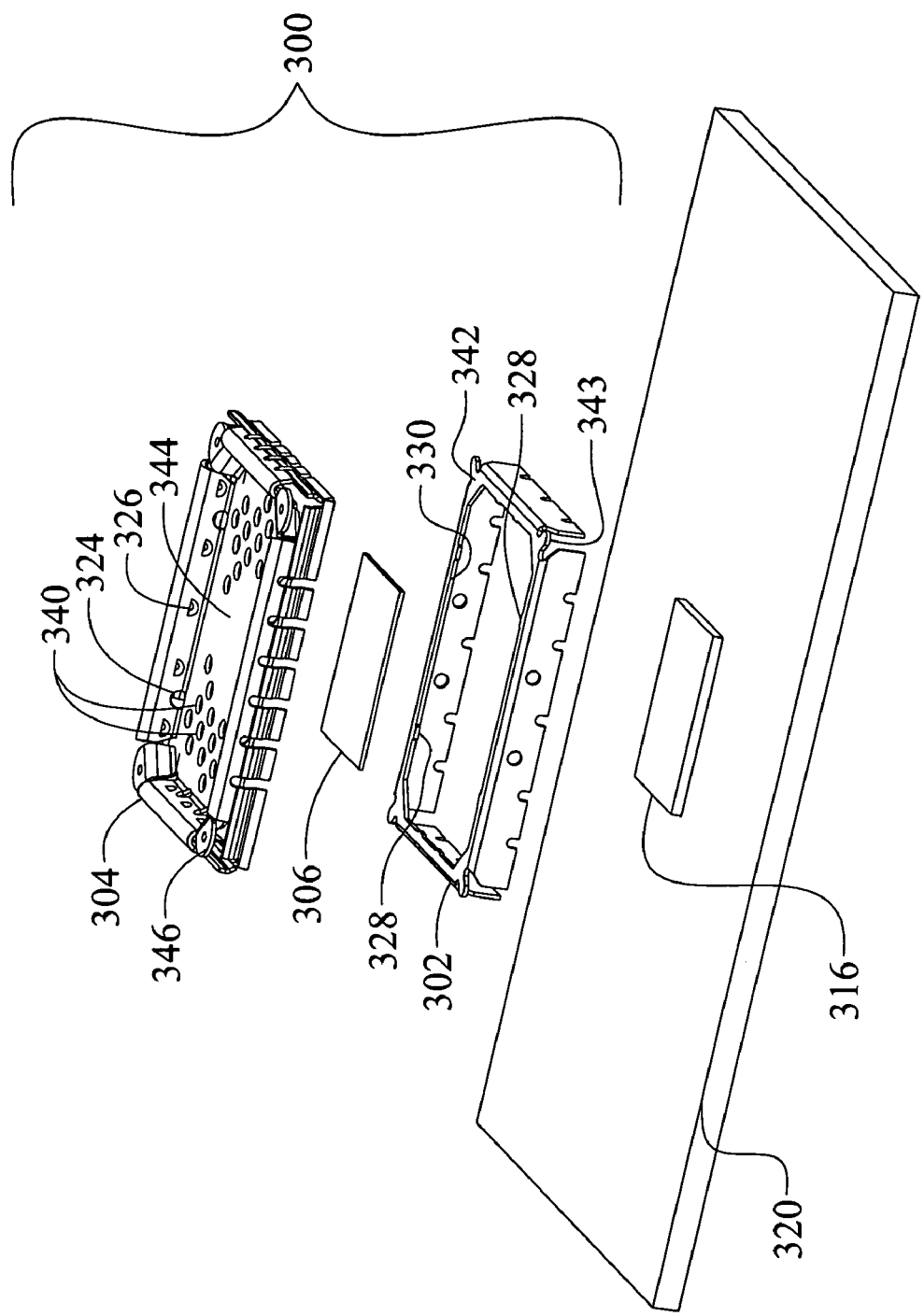
FIG. 20 is an exploded perspective view of another embodiment of an EMI shielding and thermal management assembly including a frame and a cover with multi-position latching.

FIGS. 20 through 25 illustrate another embodiment of a combined low-profile EMI shielding and thermal management assembly 300 embodying one or more aspects of the present disclosure. As shown in FIG. 20, the assembly 300 generally includes a base member or frame 302, a lid or cover 304, and a first thermal interface 306.

Figure 25:
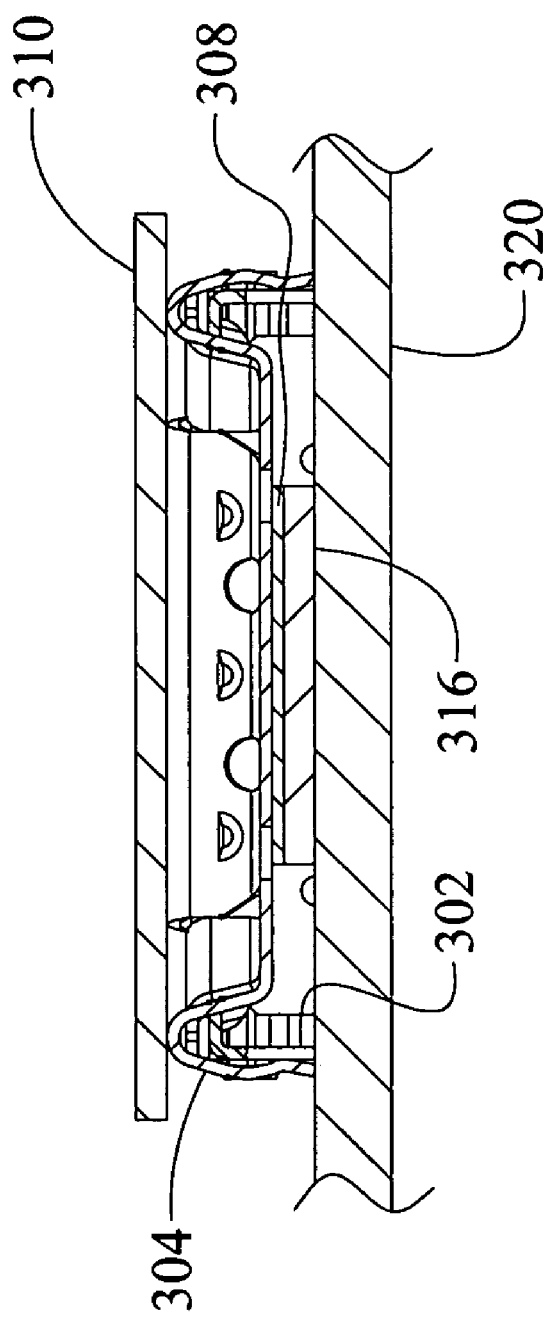
FIG. 25 is a cross-sectional view of the frame and cover shown in FIG. 24 and further illustrating a heat sink/heat spreader with a thermal interface disposed thereon according to exemplary embodiments.

As shown in FIG. 25, some embodiments of the assembly 300 also include a heat sink/heat spreader 310 for spreading and/or dissipating heat. A second thermal interface may be disposed generally between the cover 304 and the heat sink/heat spreader 310 to facilitate heat conduction and transfer from the cover 304 to the heat sink/spreader 310. Using the heat sink/heat spreader 310 and a second thermal interface can improve the spreading or dissipation of heat.

Figure 23:
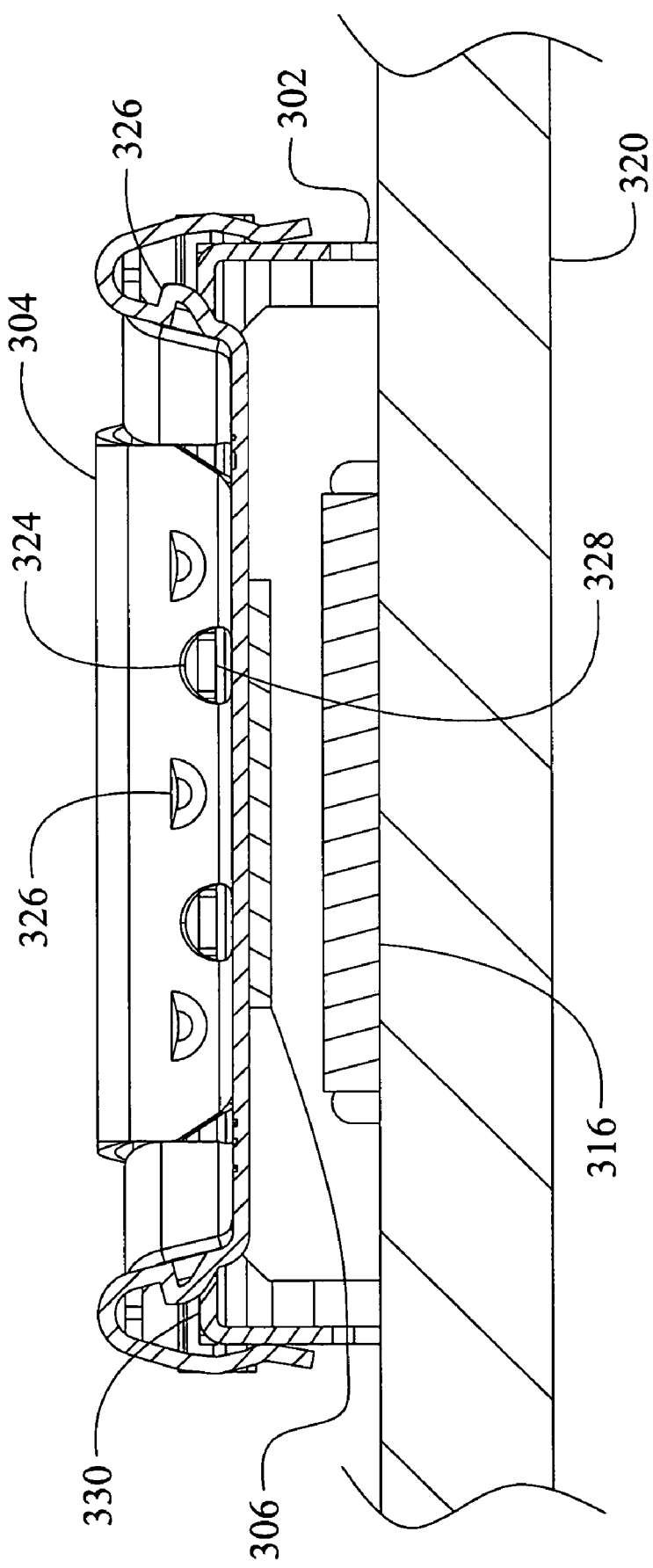
FIG. 23 is a cross-sectional view of the frame and the cover shown in FIGS. 21 and 22 illustrating the cover attached to the frame in a first latched position (e.g., in a first stage prior to reflow) whereby a spaced distance is provided between the electronic component and the thermal interface disposed on the inner surface of the cover.
Figure 24:
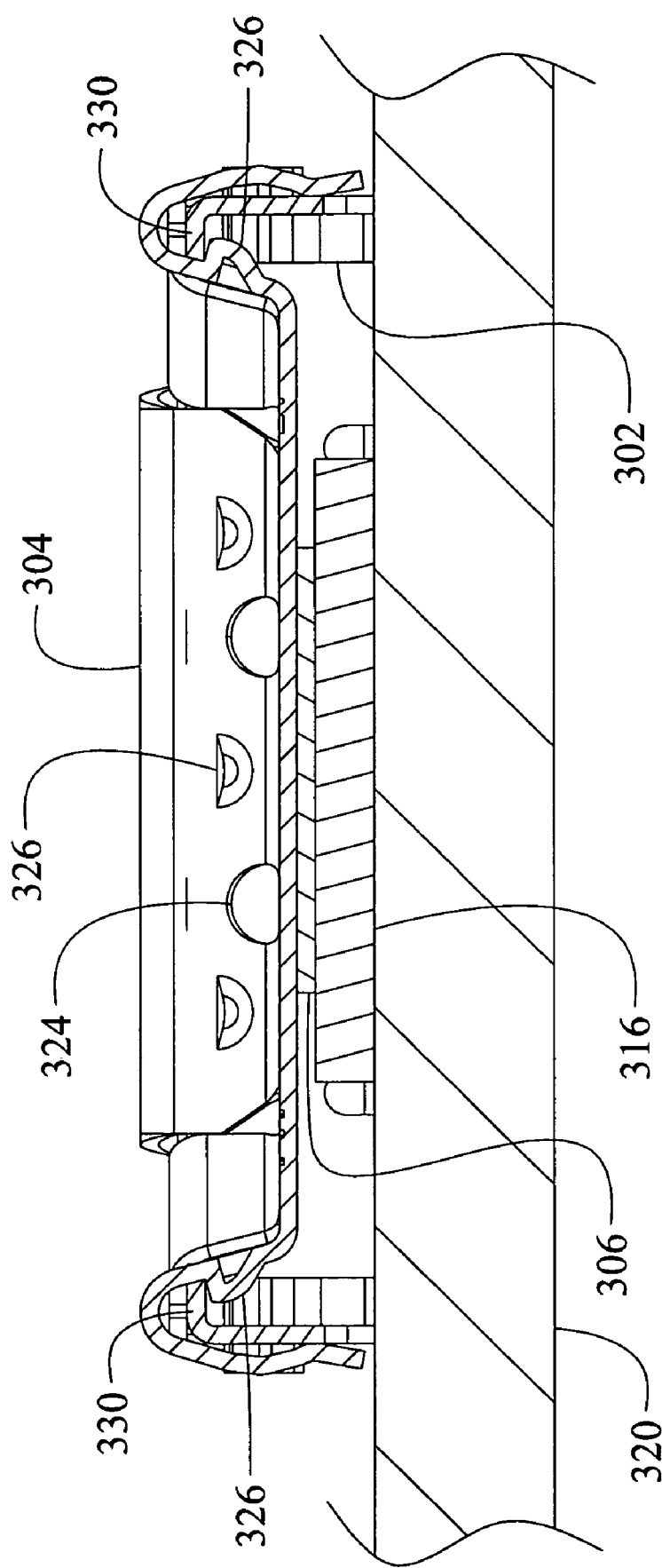
FIG. 24 is a cross-sectional view of the frame and cover shown in FIG. 23 illustrating the cover attached to the frame in a second latched position (e.g., in a second stage after reflow) whereby a compressive force is generated for compressing the thermal interface generally between the cover and the electronic component for low thermal impedance.

FIGS. 23 through 25 illustrate the assembly 300 disposed over an electronic component 316 of a board 320 (e.g., printed circuit board, etc.), whereby the assembly 300 can EMI shield the electronic component 316 and also dissipate heat generated by the electronic component 316. For example, the assembly 300 can shield the electronic component 316 from EMI/RFI emitted from other electronic components and/or inhibit EMI/RFI emitted by the electronic component 316 from interfering with other components. The assembly 300 can be used with a wide range of electronic components and packages, such as integrated circuits mounted on a printed circuit board, etc.

Figure 22:
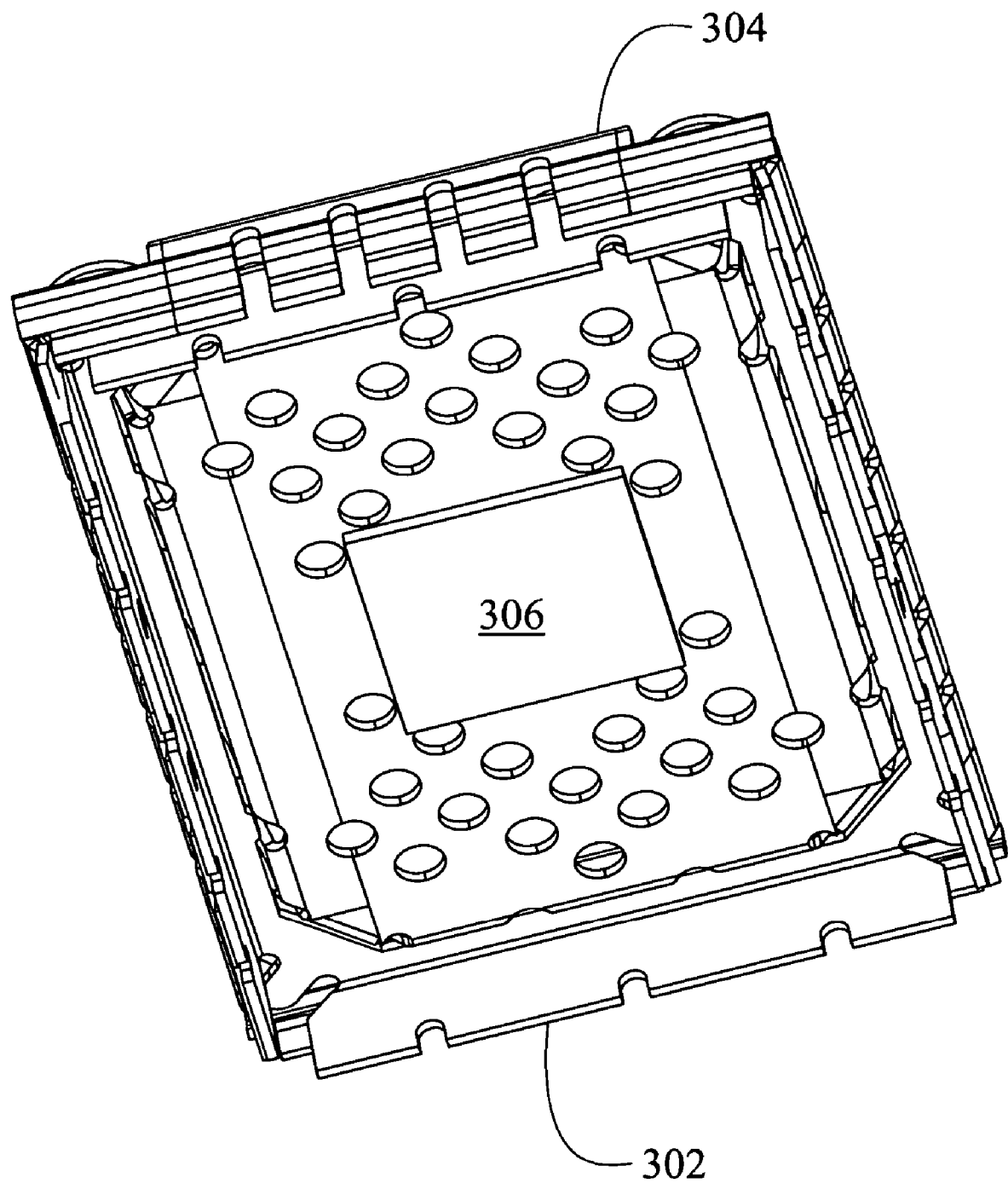
FIG. 22 is a lower perspective view of the frame and cover shown in FIG. 21 and further illustrating a thermal interface disposed on an inner surface of the cover.

As shown in FIG. 22, the first thermal interface 306 can be disposed on an inner surface of the cover 304. Accordingly, the first thermal interface 306 can facilitate the transfer of heat generated by the electronic component 316 to the cover 304. A wide variety of materials can be used for a thermal interface of assembly 300, which are preferably better thermal conductors and have higher thermal conductivities than air alone. Accordingly, the thermal interface 306 (with its compressive contact against the electrical component 316) can thus allow for improved heat transfer from the electrical component 316 to the cover 304 as compared to those designs relying solely upon air to define the heat path between the electrical component and the underside of the cover. Some preferred embodiments include a thermal interface formed from T-flex™ 600 series thermal gap filler material commercially available from Laird Technologies, Inc. of Saint Louis, Mo. In one particular preferred embodiment, the thermal interface 306 comprises T-flex™ 620 thermal gap filer material, which generally includes reinforced boron nitride filled silicone elastomer. By way of further example, other embodiments include thermal interfaces molded from electrically-conductive elastomer. Additional exemplary embodiments include thermal interface materials formed from ceramic particles, ferrite EMI/RFI absorbing particles, metal or fiberglass meshes in a base of rubber, gel, grease or wax, etc. Other suitable thermal interface materials are set forth in the table below. Alternative embodiments, however, can provide an assembly that does not include any such thermal interfaces.

A wide variety of materials can also be used for the heat sink/heat spreader 310, which are preferably good thermally conducting and, in some embodiments, also good shielding materials. Exemplary materials that can be used for the heat sink/heat spreader 310 include copper and copper-based alloys, beryllium-copper alloys, aluminum, brass, phosphor bronze, etc. In some embodiments, the heat sink/heat spreader 310 may comprise bare or uncoated metal. In some other embodiments, the heat sink/heat spreader 310 may comprise a metal coated with a suitable electrically-conductive plating to provide galvanic compatibility with the frame 302.

With continued reference to FIGS. 23 and 24, the cover 304 can be attached to the frame 302 in a first latched position (FIG. 23) or a second latched position (FIG. 24). This two-position latching can help enable surface mount technology (SMT) soldering. In this regard, the cover 304 can be engaged to the frame 302 in the first latched or open position (FIG. 23) such that a gap or spaced distance separates the cover 304 and the top of the electronic component 316. This spaced distance can allow the frame 302 to be placed in relatively intimate contact with a solder paste, thereby facilitating solder reflowing. After the soldering process has been completed, the cover 304 can be moved relative to the frame 302 (and board 320 to which the frame 302 is soldered) to the second or operational latched position (FIG. 24).

In this second latched position, a compressive force is generated for compressing the thermal interface 306 generally between the cover 304 and the electronic component 316 for low thermal impedance. This compressive force can cause the thermal interface 306 disposed on the inside of the cover 304 to compress against at least a portion of the electronic component 316. This compressive contact between the electronic component 316 and the thermal interface 306 creates a heat-conducting path through which heat generated by the electronic component 316 can be conducted. For example, heat generated by the electronic component 316 can be conducted to the thermal interface 306, and then to the cover 304. From the cover 304, heat can be conducted to the frame 302. From the frame 302, heat can be conducted to the board 320 via the solder joints between the frame 302 and the board 320. And in the illustrated embodiment of FIG. 25 that includes the heat sink/heat spreader 310, heat can also be conducted from the cover 304 to a second thermal interface, and then to the heat sink/heat spreader 310.

When the cover 304 is in the first latched position (FIG. 23), detents 328 of the frame 302 are engaged with corresponding openings 324 of the cover 304. As shown in FIG. 20, the frame's detents 328 are disposed along an inner perimeter lip 330 of the frame 302. In the first latched position (FIG. 23), detents 326 (shown as half-dimples in the illustrated embodiment) of the cover 304 are generally beneath the frame's inner perimeter lip 330.

From the first latched position, the cover 304 may be relatively moved downward onto the frame 302. As shown in FIG. 24, this relative movement between the cover 304 and frame 302 can position the frame's inner perimeter lip 330 generally above the cover's detents 326. The frame lip 330 can interlocking engage with the upper portion of the cover's detents 326, thereby attaching the cover 304 to the frame 302 in the second latched position. In the second latched position, a mechanical or clamping force is generated biasing the cover 304 downwardly towards the frame 302. This biasing force can provide the assembly 300 with relatively low thermal impedance by causing the thermal interface 306 to compressively contact against at least a portion of the electronic component 316 (as shown in FIG. 24). In some embodiments, the thermal interface 306 can be configured (e.g., sized, shaped, located, materials, etc.) to be sandwiched under pressure between the cover 304 and the electronic component 316 when the cover 304 is attached to the frame 302 in the second latched position.

The illustrated cover 304 includes apertures or holes 340. These holes 340 can facilitate solder reflow heating interiorly of the cover 304, can enable cooling of the electronic component 316, and/or can permit visual inspection of portions of the electronic components beneath the cover 304. In some embodiments, the holes 340 are sufficiently small to inhibit passage of interfering EMI/RFI. The particular number, size, shape, orientation, etc. of the holes 340 can vary depending, for example, on the particular application (e.g., sensitivity of the electronics where more sensitive circuitry may necessitate the use of smaller diameter holes, etc.).

In addition, the frame 302 and/or the cover 304 can be configured to allow for handling by pick-and-place equipment (e.g., vacuum pick-and-place equipment, etc.). For example, FIG. 20 illustrates the cover 304 having a pick-up area 344. In addition, the cover 304 is also shown with a tab 345 at each corner 346. In some embodiments, the corners 346 and/or tabs 345 can facilitate handling of the cover 304, for example, during fabrication of the cover 304 through a progressive die stamping process. Alternatively, other manufacturing methods can also be used for making the cover 304.

FIG. 20 illustrates the frame 302 with an area 342 at each corner. Also shown in FIG. 20, the frame 302 includes tabs 343 at the corners. Additionally, or alternatively, the frame 302 can include areas similar to what is shown in FIG. 40, where the frame 702 includes pick-up areas 760. In some embodiments, the areas 342 and/or tabs 343 can facilitate handling of the frame 302, for example, during fabrication of the frame 302 through a progressive die stamping process. Alternatively, other manufacturing methods can also be used for making the frame 302.

Accordingly, the frame 302 and cover 304 may be individually handled manually and/or by pick-and-place equipment in some embodiments. After the cover 304 has been assembled to the frame 302, the cover 304 and frame 302 may be collectively handled manually or by pick-and-place equipment (e.g., vacuum pick-and-place equipment, etc.) via the cover's pick-up area 344 and/or the cover's corners 346.

Figure 21:
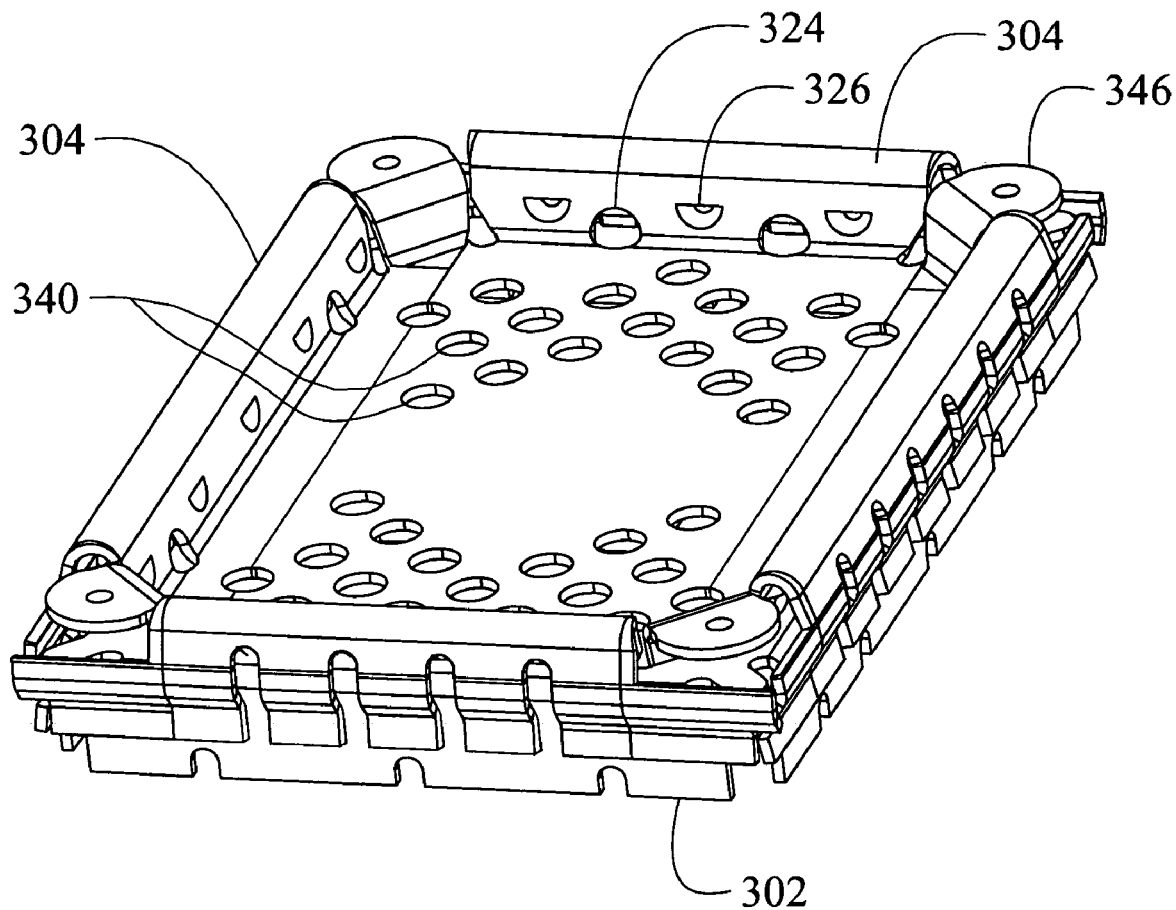
FIG. 21 is a perspective view of the frame and the cover shown in FIG. 20 with the cover attached to the frame in a first latched position (e.g., in a first stage prior to reflow)

As shown in FIGS. 20 through 22, the frame 302 and cover 304 are both generally rectangular. Alternative embodiments can include a frame and/or a cover having more or less than four peripheral walls and/or peripheral walls in other rectangular configurations or non-rectangular configurations (e.g., triangular, hexagonal, circular, other polygonal shapes, other rectangular configurations than what is shown in figures, etc.). Further embodiments can include peripheral walls having more or less openings and/or more or less detents than what are disclosed in the figures.

In various embodiments, the frame 302 can be integrally or monolithically formed as a single component. In such embodiments, the frame 302 can be formed by stamping in a piece of material a flat profile pattern for the frame 302. After stamping the partial flat pattern profile for the frame 302 in the piece of material, the wall portions may then be folded or bent generally perpendicular as shown in FIG. 20. Even though the frame 302 can be formed integrally in this example, such is not required for all embodiments. For example, other embodiments may include detents or protuberances that are discrete components separately attached to the frame 302, for example, by welding, adhesives, among other suitable methods. Alternative configurations (e.g., shapes, sizes, etc.), materials, and manufacturing methods (e.g., drawing, etc.) can be used for making the frame 302.

A wide range of materials can be used for the frame 302, which are preferably suitably solderable for surface mount technology reflow operations. Exemplary materials that can be used for the frame include nickel-silver alloys, copper-nickel alloys, cold rolled steel, stainless steel, tin-plated cold rolled steel, tin-plated copper alloys, carbon steel, brass, copper, aluminum, copper-beryllium alloys, phosphor bronze, steel, combinations thereof, among other suitable electrically conductive materials.

In various embodiments, the cover 304 can be integrally or monolithically formed as a single component. In such embodiments, the cover 304 can be formed by stamping in a piece of material a flat profile pattern for the cover 304. After stamping the flat pattern profile for the cover 304 in the piece of material, the wall portions may then be folded or bent as shown in FIG. 20. Even though the cover 304 can be formed integrally in this example, such is not required for all embodiments. For example, other embodiments may have detents that are discrete components separately attached to the cover 304, for example, by welding, adhesives, among other suitable methods. Alternative configurations (e.g., shapes, sizes, etc.), materials, and manufacturing methods (e.g., drawing, etc.) can be used for making the cover 304.

A wide range of materials can be used for the cover 304, such as nickel-silver alloys, copper-nickel alloys, cold rolled steel, stainless steel, tin-plated cold rolled steel, tin-plated copper alloys, carbon steel, brass, copper, aluminum, copper-beryllium alloys, phosphor bronze, steel, combinations thereof, among other suitable electrically conductive materials.

FIGS. 26 through 31 illustrate another embodiment of a combined EMI shielding and thermal management assembly 400 embodying one or more aspects of the present disclosure. As shown, the assembly 400 generally includes a base member or frame 402 and a lid or cover 404, and a first thermal interface 406. Some embodiments may also include a heat sink/heat spreader. In embodiments that do include a heat sink/heat spread, a second thermal interface may be disposed between the cover and the heat sink/heat spreader.

Figure 28:
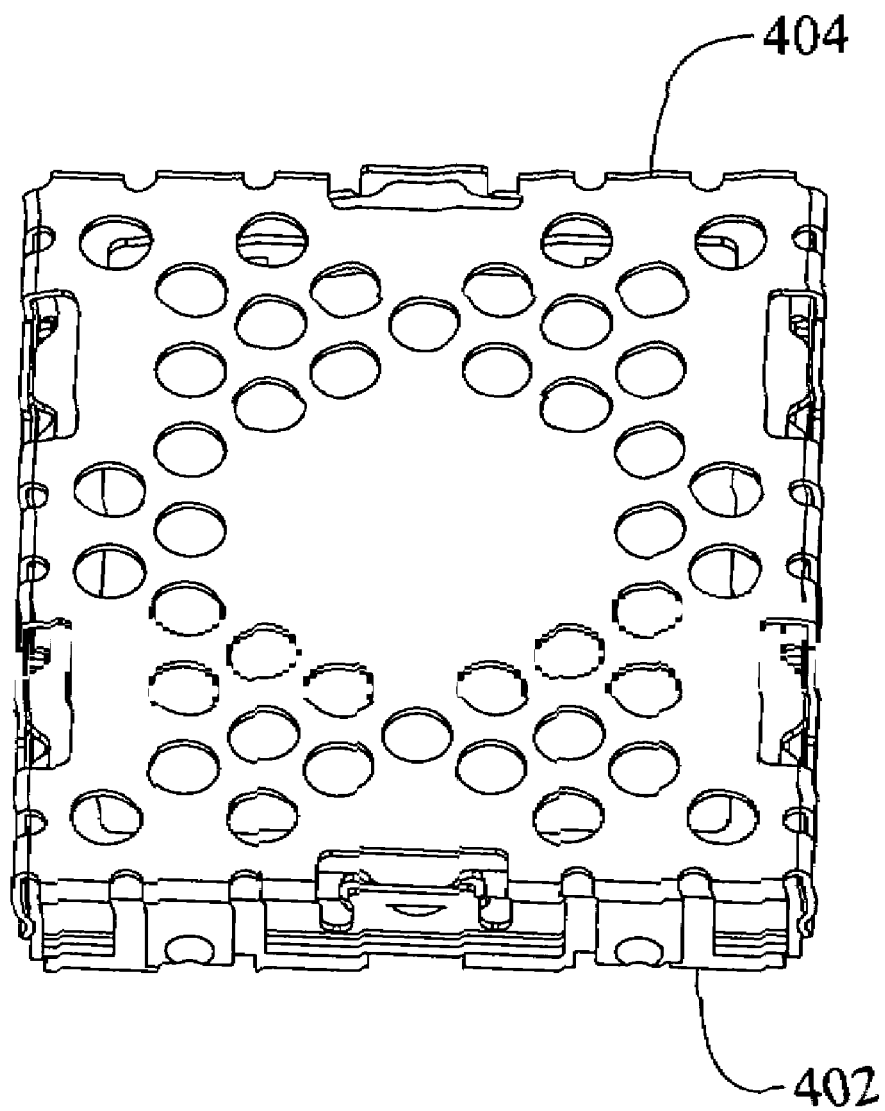
FIG. 28 is a perspective view of the frame and cover shown in FIGS. 26 and 27 illustrating the cover attached to the frame in a second latched position (e.g., in a second stage after reflow)
Figure 30:
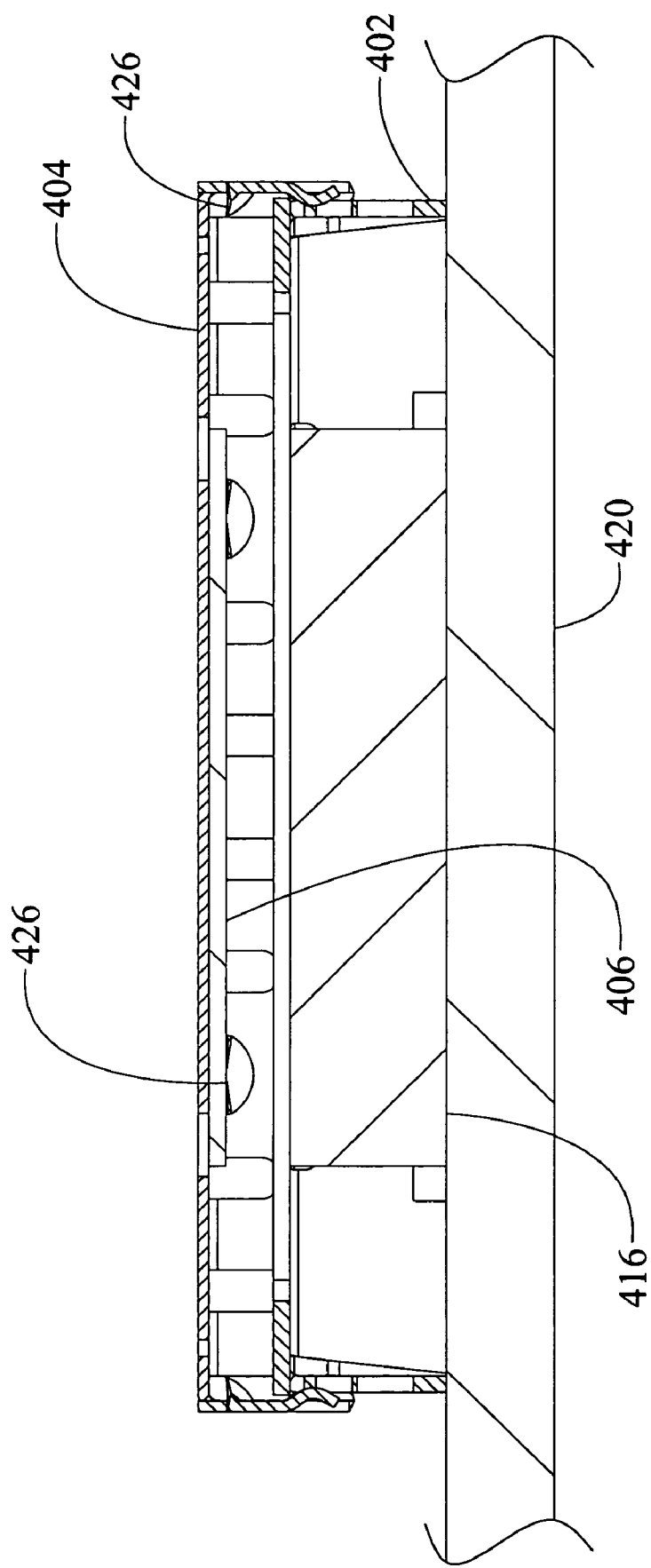
FIG. 30 is a cross-sectional view of the frame and the cover shown in FIGS. 26 through 29 illustrating the cover attached to the frame in a first latched position (e.g., in a first stage prior to reflow) whereby a spaced distance is provided between the electronic component and the thermal interface disposed on the inner surface of the cover.
Figure 31:
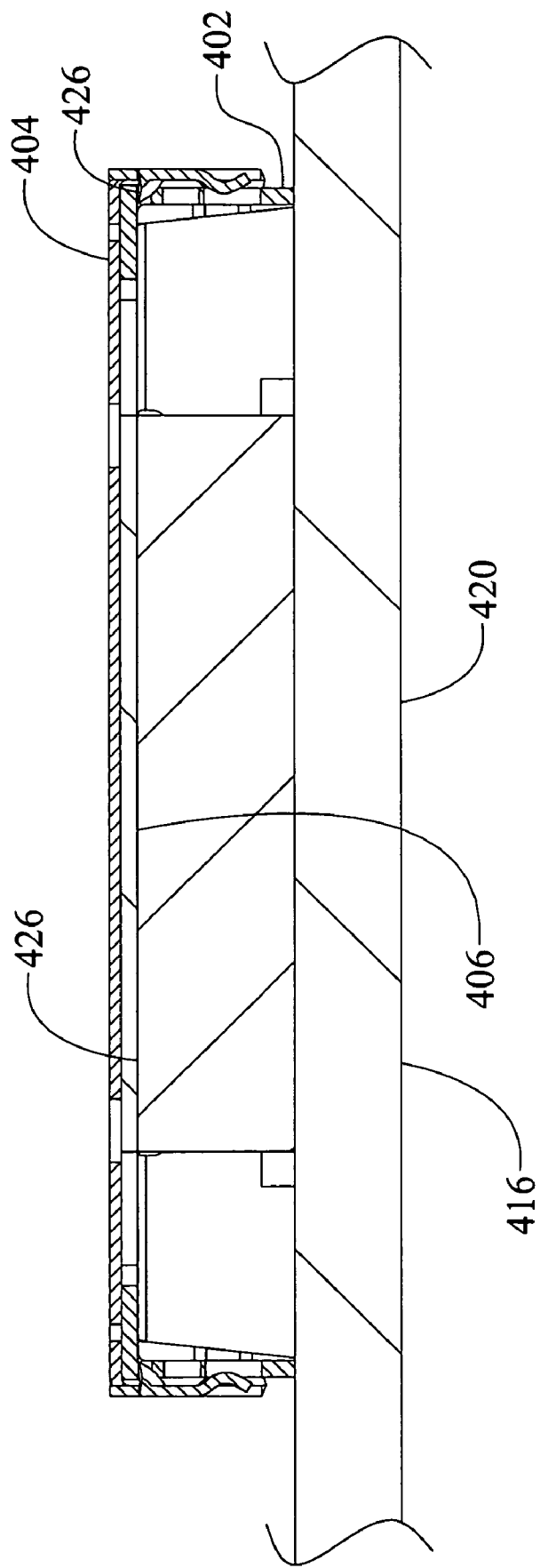
FIG. 31 is a cross-sectional view of the frame and cover shown in FIG. 30 illustrating the cover attached to the frame in a second latched position (e.g., in a second stage after reflow) whereby a compressive force is generated for compressing the thermal interface generally between the cover and the electronic component for low thermal impedance.

The frame 402 and cover 404 are configured such that the cover 404 can be attached to the frame 402 in a first latched position (FIGS. 27 and 30) and a second latched position (FIGS. 28 and 31). In some embodiments, the first latched position represents the assembly 400 at a first stage prior to reflow soldering of the frame 402 to the board 420, and the second latched position represents the assembly 400 at a second stage after reflow soldering has been completed. This two-position latching can help enable surface mount technology (SMT) soldering. In this regard, the cover 404 can be engaged to the frame 402 in the first latched or open position such that a gap or spaced distance separates the cover 404 and the top of the electronic component 416. This spaced distance can allow the frame 402 to be placed in relatively intimate contact with a solder paste, thereby facilitating solder reflow. After the soldering process has been completed, the cover 404 can be moved relative to the frame 402 (and board 420 to which the frame 402 is soldered) to the second or operational latched position.

In this second latched position, a compressive force is generated for compressing the thermal interface 406 generally between the cover 404 and the electronic component 416 for low thermal impedance. This compressive force can cause the thermal interface 406 to compress against at least a portion of the electronic component 416. This compressive contact between the electronic component 416 and the thermal interface 406 creates a heat-conducting path through which heat generated by the electronic component 416 can be conducted. For example, heat generated by the electronic component 416 can be conducted to the thermal interface 406, and then to the cover 404. From the cover 404, heat can be conducted to the frame 402. From the frame 402, heat can be conducted to the board 420 via the solder joints mounting the frame 402 to the board 420. In some embodiments, the thermal interface 406 can be configured (e.g., sized, shaped, located, materials, etc.) to be sandwiched under pressure between the cover 404 and the electronic component 416 when the cover 404 is attached to the frame 402 in the second latched position.

Figure 26:
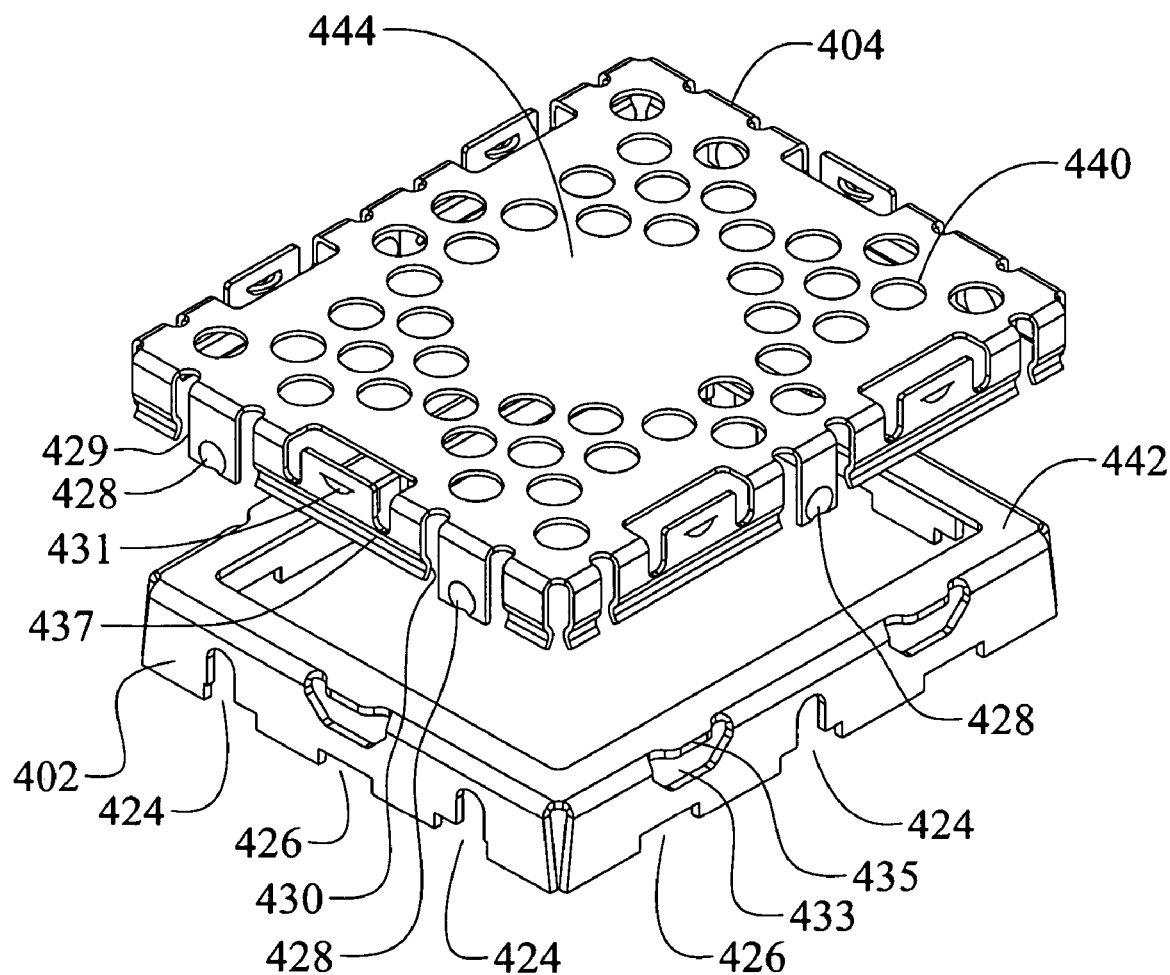
FIG. 26 is an exploded perspective view of a frame and cover for another embodiment of an EMI shielding and thermal management assembly, where the frame and cover are configured with multi-position latching such that the cover can be attached to the frame in a first or a second latched position according to exemplary embodiments.
Figure 27:
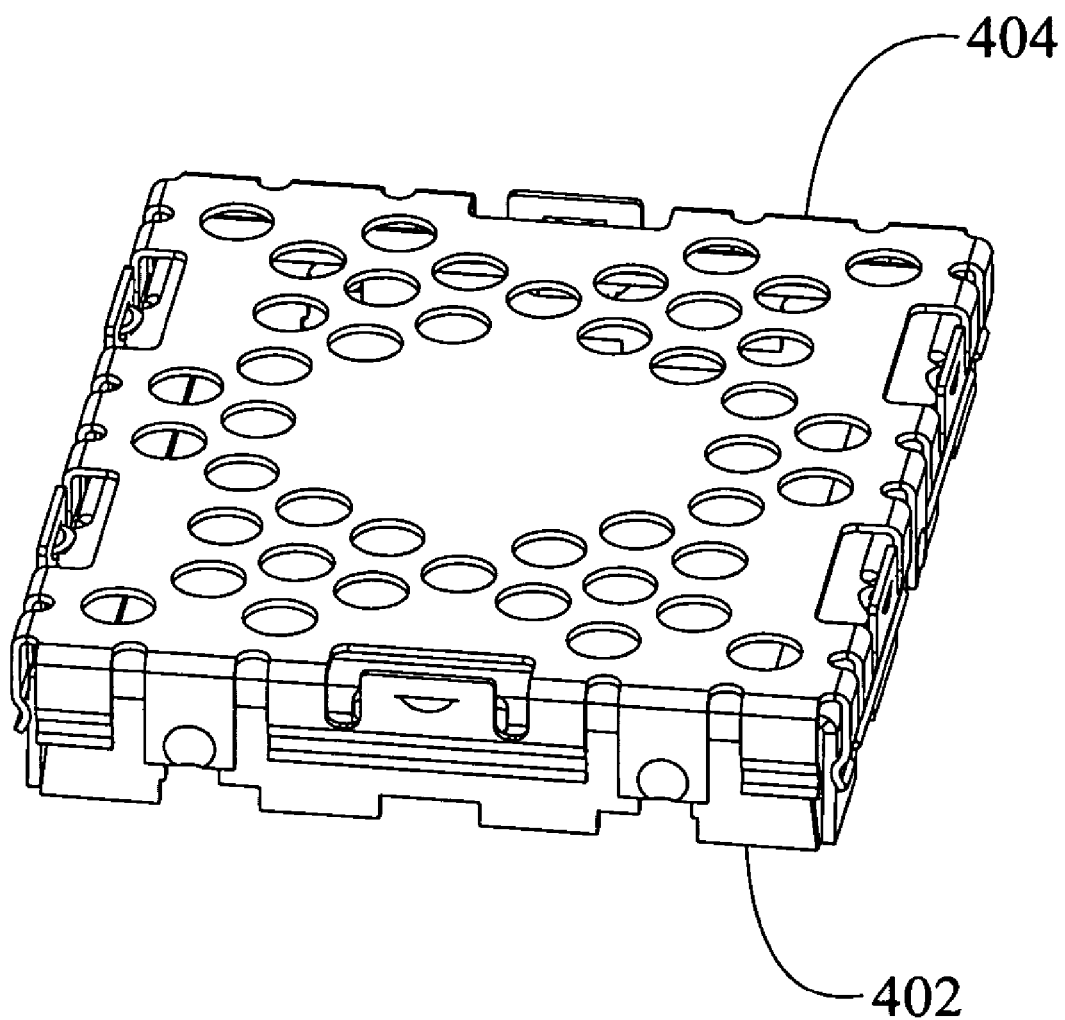
FIG. 27 is a perspective view of the frame and cover shown in FIG. 26 illustrating the cover attached to the frame in a first latched position (e.g., in a first stage prior to reflow)

When the cover 404 is in the first latched position (FIGS. 27 and 30), detents 428 of the cover 404 are engaged with corresponding openings 424 of the frame 402. As shown in FIG. 26, the cover's detents 428 are defined by inwardly extending dimples on wall portions 429. Alternatively, the cover 404 can include other means for engaging the openings 424 of the frame 402 to thereby attach the cover 404 to the frame 402 in the first latched position.

From the first latched position, the cover 404 may be moved relatively downward onto the frame 402 into the second latched position shown in FIGS. 28 and 31. In the second latched position, detents 430 of the cover 404 are engaged within corresponding openings 426 of the frame 402. In addition, detents 431 of the cover 404 are engaged with corresponding openings 433 such that the upper portions of the cover's detents 431 are interlockingly engaged with outwardly protruding lip portions 435 of the frame 402.

As shown in FIG. 26, the cover's detents 430 are defined by lower inwardly curved portions of wall portions 437. The cover's detents 431 are defined by inwardly extending half-dimples of the wall portions 437. The lower rounded portions of the half-dimples can operate as camming surfaces for urging the cover's wall portions 437 outwardly away from the frame 402, to thereby facilitate the engagement of the cover's detents 431 with the frame's protruding lip portions 435. The outward movement of the cover's wall portions 437 allows the upper portion of the cover's detents 431 to be positioned underneath the frame's lip portions 435. At which point, the cover's wall portions 437 may then resiliently spring or snap inwardly, thereby interlocking the cover's detents 431 under the frame's lip portions 435. Also shown in FIG. 26, the frame's lip portions 435 are disposed along an outer perimeter or rim of the frame 402. Alternatively, the cover 404 and/or frame 402 can include other means for allowing the cover 404 to be attached to the frame 402 in the second latched position.

In addition, this particular embodiment also allows for ready and easy release and removal of the cover 404 from the frame 402, for example, to access (e.g., repair, reworking, replacement, visual inspection, etc.) to the electronic component 416 through the opening or window of the frame 404. The cover 404 may subsequently be reattached to the frame 404, or a new cover may be attached to the frame 402.

To remove the cover 404, the cover's wall portions 437 can be flexed or rotated outwardly relative to the frame 402 to thereby move the cover's detents 431 out from underneath the frame's protruding lip portions 435. By way of example only, this can be accomplished by applying a force for moving the cover 404 away from the frame 402. For example, a force may be applied to the cover 404 by inserting a tool or a fingernail into the holes 440 in the cover 402, among other possible ways (e.g., applying force to tabs of a cover).

With the relative movement of the cover 404 away from the frame 402, the upper rounded portions of the cover's detents 430 can operate as camming surfaces for urging the cover's wall portions 437 outwardly away from the frame 402, to thereby disengage the cover's detents 431 from the frame's protruding lip portions 435. After disengagement of the cover's detents 431 out from under the frame's protruding lip portions 435, the cover 404 can be lifted off the frame 402. In one particular embodiment, the cover 404 may be relatively easily removed from the frame 402 by applying a force of only about one and one-half pounds or seven Newtons. Accordingly, the cover 404 can be easily removed from the frame 404 without requiring any severing or breaking off of any portion of the cover 404 or the frame 402. Because of the relatively low force required to remove the cover 404, such embodiments allow the cover 404 to be removed without damaging the circuit board 420 or frame 402. Accordingly, the same cover 404 may subsequently be reattached to the frame 402, or a new cover may be assembled onto the frame 402.

When the assembly 400 is disposed over the electronic component 416 of the board 420 as shown in FIGS. 30 and 31, the assembly 400 can EMI shield the electronic component 416 and also dissipate heat generated by the electronic component 416. For example, the assembly 400 can shield the electronic component 416 from EMI/RFI emitted from other electronic components and/or inhibit EMI/RFI emitted by the electronic component 416 from interfering with other components. The assembly 400 can be used with a wide range of electronic components and packages, such as integrated circuits mounted on a printed circuit board, etc.

Figure 29:
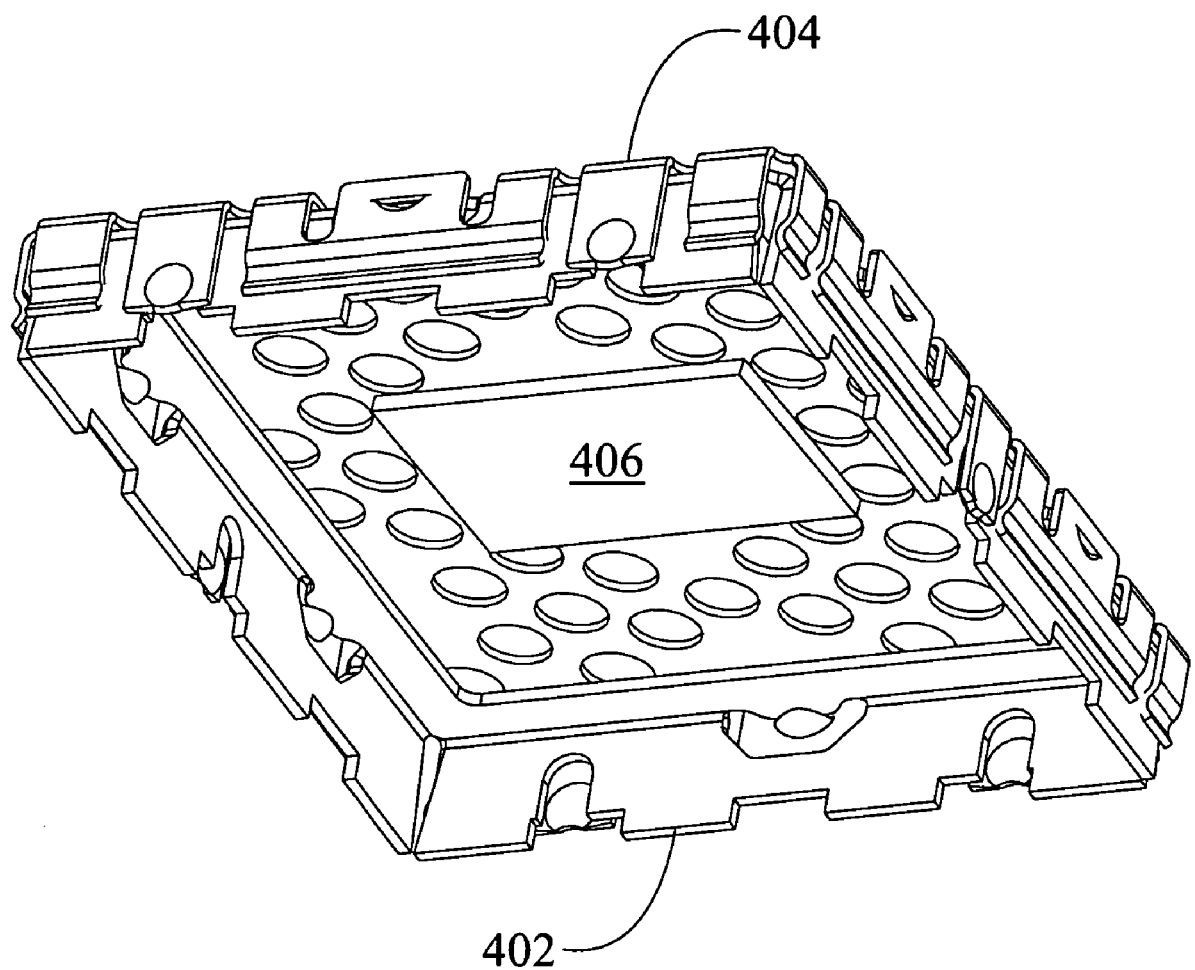
FIG. 29 is a lower perspective view of the frame and cover shown in FIG. 28 illustrating a thermal interface disposed on an inner surface of the cover.

As shown in FIG. 29, the first thermal interface 406 can be disposed on an inner surface of the cover 404. Accordingly, the first thermal interface 406 can facilitate the transfer of heat generated by the electronic component 416 to the cover 404. A wide variety of materials can be used for a thermal interface of assembly 400, which are preferably better thermal conductors and have higher thermal conductivities than air alone. Accordingly, the thermal interface 406 (with its compressive contact against the electrical component 416) can thus allow for improved heat transfer from the electrical component 416 to the cover 404 as compared to those designs relying solely upon air to define the heat path between the electrical component and the underside of the cover. Some preferred embodiments include a thermal interface formed from T-flex™ 600 series thermal gap filler material commercially available from Laird Technologies, Inc. of Saint Louis, Mo. In one particular preferred embodiment, the thermal interface 406 comprises T-flex™ 620 thermal gap filer material, which generally includes reinforced boron nitride filled silicone elastomer. By way of further example, other embodiments include thermal interfaces molded from electrically-conductive elastomer. Additional exemplary embodiments include thermal interface materials formed from ceramic particles, ferrite EMI/RFI absorbing particles, metal or fiberglass meshes in a base of rubber, gel, grease or wax, etc. Other suitable thermal interface materials are set forth in the table below. Alternative embodiments, however, can provide an assembly that does not include any such thermal interfaces.

The illustrated cover 404 includes apertures or holes 440, which as described above, may facilitate removal of the cover 404 from the frame 402. The holes 440 can also facilitate solder reflow heating interiorly of the cover 404, can enable cooling of the electronic component 416, and/or can permit visual inspection of portions of the electronic components beneath the cover 404. In some embodiments, the holes 440 are sufficiently small to inhibit passage of interfering EMI/RFI. The particular number, size, shape, orientation, etc. of the holes 440 can vary depending, for example, on the particular application (e.g., sensitivity of the electronics where more sensitive circuitry may necessitate the use of smaller diameter holes, etc.).

In addition, the frame 402 and/or the cover 404 can be configured to allow for handling by pick-and-place equipment. As shown in FIG. 26, the cover 404 includes a pick-up area 444. In some embodiments, the cover 404 may also include tabs along the sides and/or corners thereof (e.g., tabs 145 of cover 104 shown in FIG. 13). In such embodiments, providing the cover with pick-up areas and/or carrying tabs can facilitate handling of the cover, for example, during fabrication of the cover through a progressive die stamping process. Alternatively, other manufacturing methods can also be used for making the cover.

The frame 402 may also include areas 442 at each corner and/or other areas (e.g., pick-up areas 760 of frame 702 in FIG. 40, etc.). As another example, the frame 402 may also include tabs along the sides and/or at the corners thereof (e.g., tabs 143 of frame 102 shown in FIGS. 7 and 8). In such embodiments, providing the frame with areas and/or carrying tabs can facilitate handling of the frame, for example, during fabrication of the frame through a progressive die stamping process. Alternatively, other manufacturing methods can also be used for making the frame.

Accordingly, some embodiments of the frame 402 and cover 404 enable individual handling manually and/or by pick-and-place equipment in some embodiments. After the cover 404 has been assembled to the frame 402, the cover 404 and frame 402 may also be collectively handled by pick-and-place equipment, for example, via the cover's pick-up area 444.

As shown in FIGS. 26 and 29, the frame 402, cover 404, and thermal interface 406 are generally rectangular. Alternative embodiments can include other rectangular configurations or non-rectangular configurations (e.g., triangular, hexagonal, circular, other polygonal shapes, other rectangular configurations than what is shown in figures, etc.). Further embodiments can include frames and/or covers having peripheral walls with more or less openings and/or more or less detents than what are disclosed in the figures.

In various embodiments, the frame 402 can be integrally or monolithically formed as a single component. In such embodiments, the frame 402 can be formed by stamping in a piece of material a flat profile pattern for the frame 402. After stamping the partial flat pattern profile for the frame 402 in the piece of material, the wall portions may then be folded or bent generally perpendicular as shown in FIG. 26. Even though the frame 402 can be formed integrally in this example, such is not required for all embodiments. Alternative configurations (e.g., shapes, sizes, etc.), materials, and manufacturing methods (e.g., drawing, etc.) can be used for making the frame 402.

A wide range of materials can be used for the frame 402, such as nickel-silver alloys, copper-nickel alloys, cold rolled steel, stainless steel, tin-plated cold rolled steel, tin-plated copper alloys, carbon steel, brass, copper, aluminum, copper-beryllium alloys, phosphor bronze, steel, combinations thereof, among other suitable electrically conductive materials.

In various embodiments, the cover 404 can be integrally or monolithically formed as a single component. In such embodiments, the cover 404 can be formed by stamping in a piece of material a flat profile pattern for the cover 404. After stamping the flat pattern profile for the cover 404 in the piece of material, the wall portions may then be folded or bent as shown in FIG. 26. Even though the cover 404 can be formed integrally in this example, such is not required for all embodiments. Alternative configurations (e.g., shapes, sizes, etc.), materials, and manufacturing methods (e.g., drawing, etc.) can be used for making the cover 404.

A wide range of materials can be used for the cover 404, such as nickel-silver alloys, copper-nickel alloys, cold rolled steel, stainless steel, tin-plated cold rolled steel, tin-plated copper alloys, carbon steel, brass, copper, aluminum, copper-beryllium alloys, phosphor bronze, steel, combinations thereof, among other suitable electrically conductive materials.

FIGS. 32 through 37 illustrate another embodiment of a combined EMI shielding and thermal management assembly 500 embodying one or more aspects of the present disclosure. As shown, the assembly 500 generally includes a base member or frame 502 and a lid or cover 504, and a first thermal interface 506. Some embodiments may also include a heat sink/heat spreader. In embodiments that do include a heat sink/heat spread, a second thermal interface may be disposed between the cover and the heat sink/heat spreader.

Figure 34:
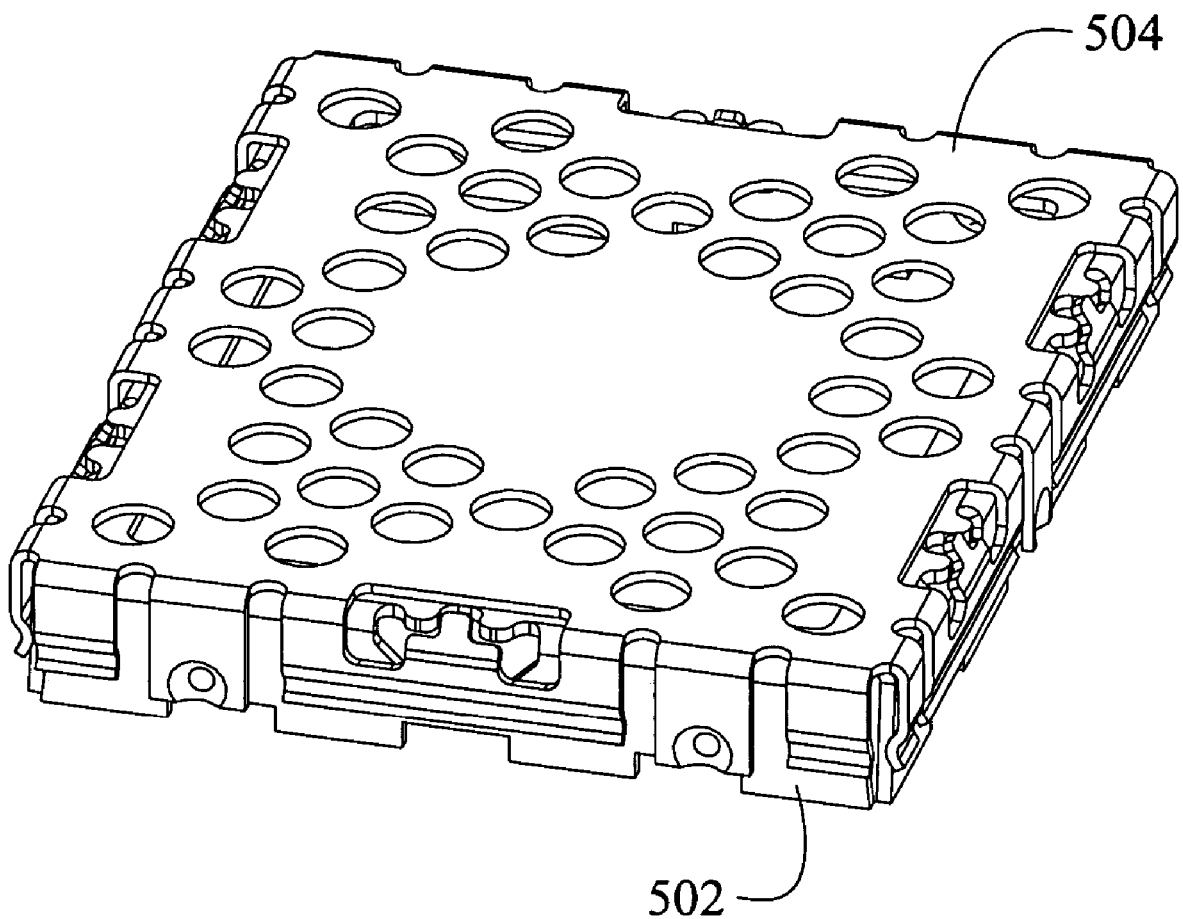
FIG. 34 is a perspective view of the frame and cover shown in FIGS. 32 and 33 illustrating the cover attached to the frame in a second latched position (e.g., in a second stage after reflow)
Figure 36:
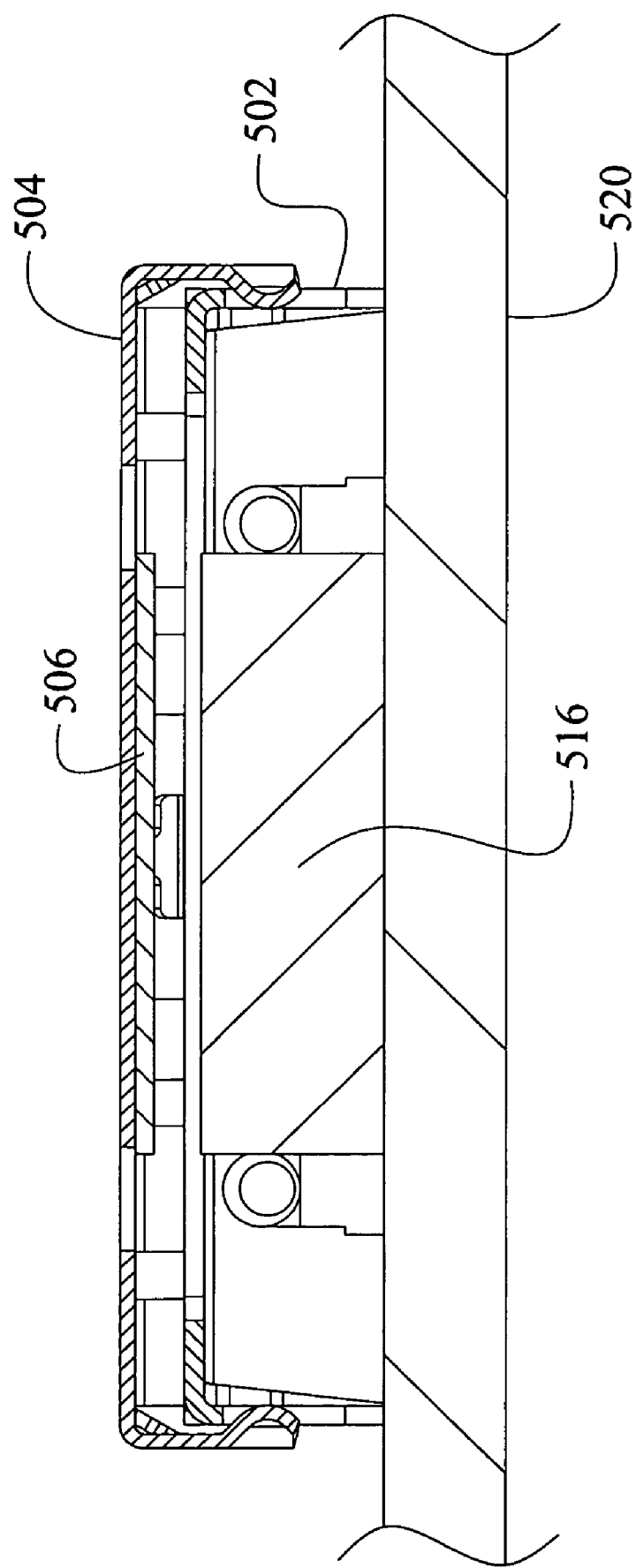
FIG. 36 is a cross-sectional view of the frame and the cover shown in FIGS. 32 through 35 illustrating the cover attached to the frame in a first latched position (e.g., in a first stage prior to reflow) whereby a spaced distance is provided between the electronic component and the thermal interface disposed on the inner surface of the cover.
Figure 37:
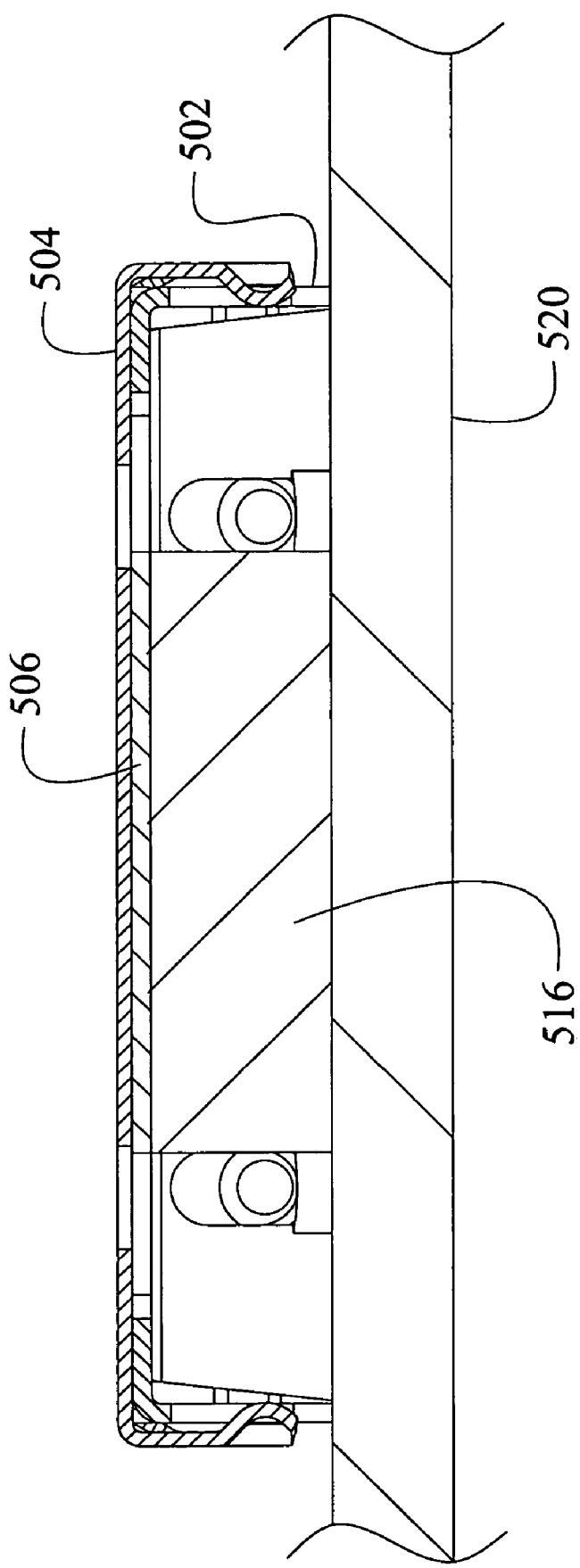
FIG. 37 is a cross-sectional view of the frame and cover shown in FIG. 36 illustrating the cover attached to the frame in a second latched position (e.g., in a second stage after reflow) whereby a compressive force is generated for compressing the thermal interface generally between the cover and the electronic component for low thermal impedance.

The frame 502 and cover 504 are configured such that the cover 504 can be attached to the frame 502 in a first latched position (FIGS. 33 and 36) and a second latched position (FIGS. 34 and 37). In some embodiments, the first latched position represents the assembly 500 at a first stage prior to reflow soldering of the frame 502 to the board 520, and the second latched position represents the assembly 500 at a second stage after reflow soldering has been completed. This two-position latching can help enable surface mount technology (SMT) soldering. In this regard, the cover 504 can be engaged to the frame 502 in the first latched or open position such that a gap or spaced distance separates the cover 504 and the top of the electronic component 516. This spaced distance can allow the frame 502 to be placed in relatively intimate contact with a solder paste, thereby facilitating solder reflow. After the soldering process has been completed, the cover 504 can be moved relative to the frame 502 (and board 520 to which the frame 502 is soldered) to the second or operational latched position.

In this second latched position, a compressive force is generated for compressing the thermal interface 506 generally between the cover 504 and the electronic component 516 for low thermal impedance. This compressive force can cause the thermal interface 506 to compress against at least a portion of the electronic component 516. This compressive contact between the electronic component 516 and the thermal interface 506 creates a heat-conducting path through which heat generated by the electronic component 516 can be conducted. For example, heat generated by the electronic component 516 can be conducted to the thermal interface 506, and then to the cover 504. From the cover 504, heat can be conducted to the frame 502. From the frame 502, heat can be conducted to the board 520 via the solder joints mounting the frame 502 to the board 520. In some embodiments, the thermal interface 506 can be configured (e.g., sized, shaped, located, materials, etc.) to be sandwiched under pressure between the cover 504 and the electronic component 516 when the cover 504 is attached to the frame 502 in the second latched position.

Figure 32:
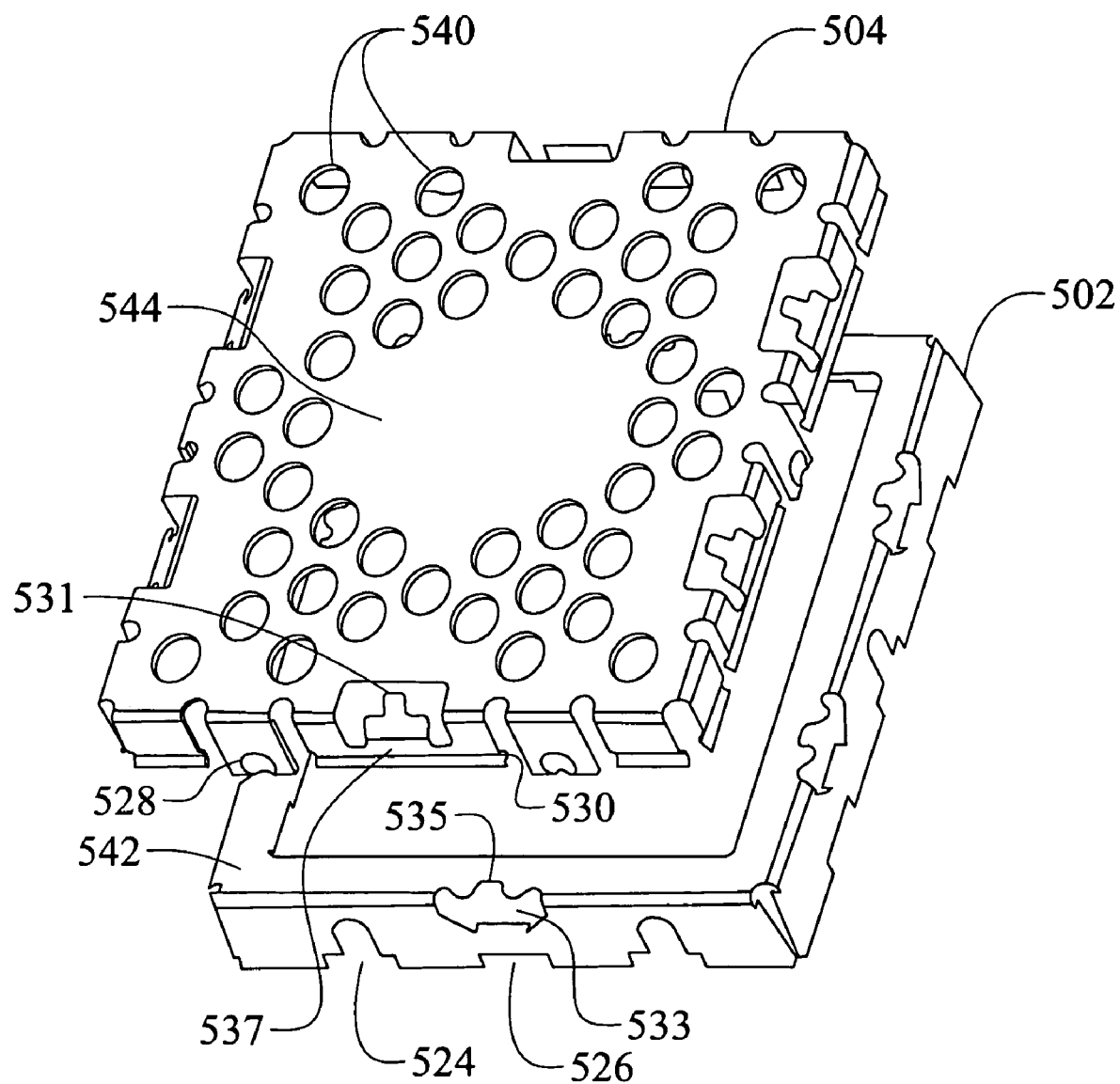
FIG. 32 is an exploded perspective view of a frame and cover for another embodiment of an EMI shielding and thermal management assembly, where the frame and cover are configured with multi-position latching such that the cover can be attached to the frame in a first or a second latched position according to exemplary embodiments.
Figure 33:
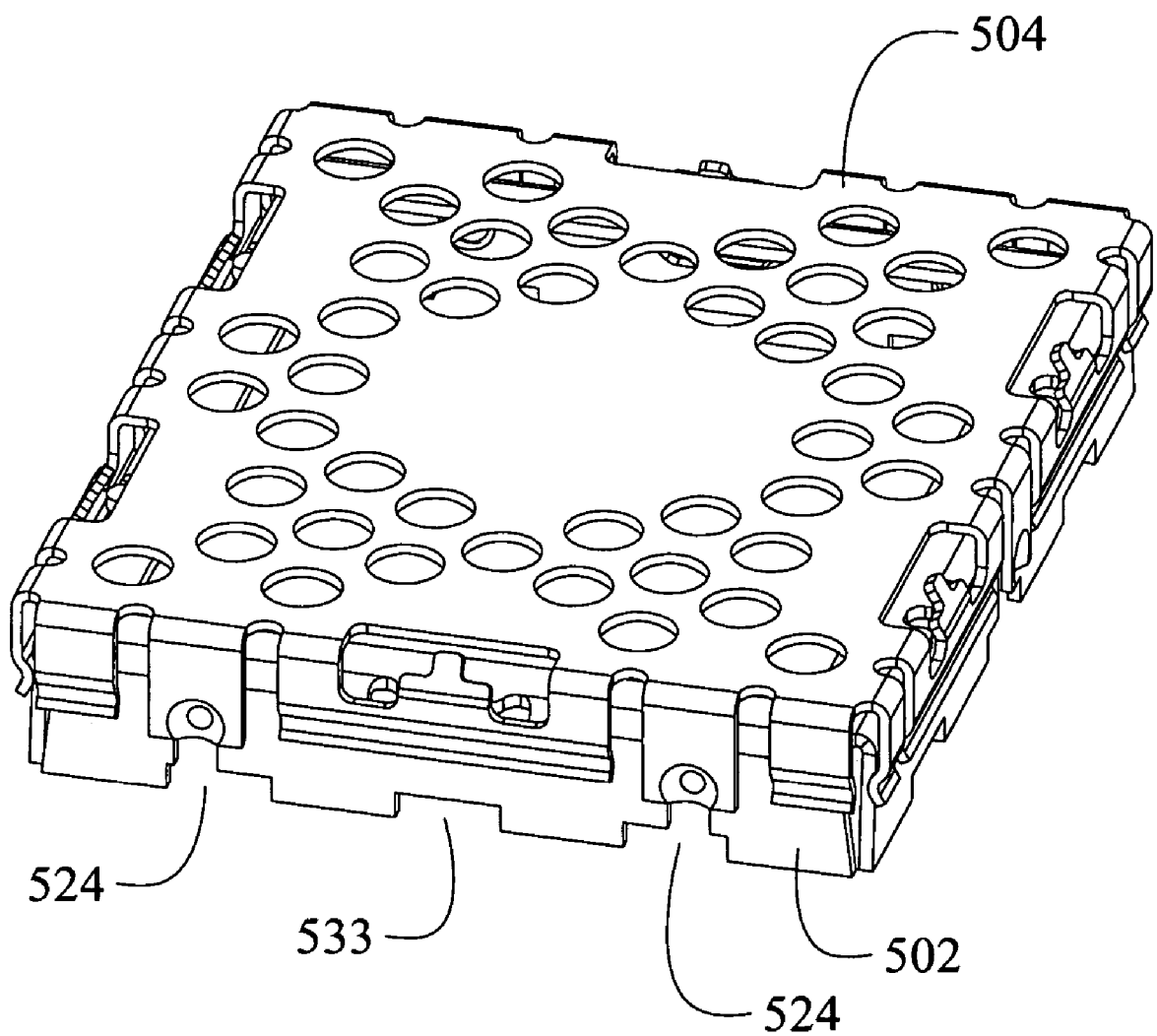
FIG. 33 is a perspective view of the frame and cover shown in FIG. 32 illustrating the cover attached to the frame in a first latched position (e.g., in a first stage prior to reflow)

When the cover 504 is in the first latched position (FIGS. 33 and 36), detents 528 of the cover 504 are engaged with corresponding openings 524 of the frame 502. As shown in FIG. 32, the cover's detents 528 are defined by inwardly extending dimples on wall portions 529. Alternatively, the cover 504 can include other means for engaging the openings 524 of the frame 502 to thereby attach the cover 504 to the frame 502 in the first latched position.

From the first latched position, the cover 504 may be moved relatively downward onto the frame 502 into the second latched position shown in FIGS. 34 and 37. In the second latched position, detents 530 of the cover 504 are engaged within corresponding openings 526 of the frame 502. In addition, tabs 531 of the cover 504 are engaged with corresponding openings 533 such that the cover's tabs 531 are interlockingly engaged under lip portions 535 of the frame 502.

As shown in FIG. 32, the cover's detents 530 are defined by lower inwardly curved portions of wall portions 537. The cover's tabs 531 are defined by upper portions of the wall portions 537. The lower rounded portions of the detents 530 can operate as camming surfaces for urging the cover's wall portions 537 outwardly away from the frame 502, to thereby facilitate the engagement of the cover's tabs 531 with the frame's lip portions 535. The outward movement of the cover's wall portions 537 allows the cover's tabs 531 to be positioned underneath the frame's lip portions 535. At which point, the cover's wall portions 537 may then resiliently spring or snap inwardly, thereby interlocking the cover's tabs 531 under the frame's lip portions 535. Also shown in FIG. 32, the frame's lip portions 535 are disposed along an outer perimeter or rim of the frame 502. Alternatively, the cover 504 and/or frame 502 can include other means for allowing the cover 504 to be attached to the frame 502 in the second latched position.

In addition, this particular embodiment also allows for ready and easy release and removal of the cover 504 from the frame 502, for example, to access (e.g., repair, reworking, replacement, visual inspection, etc.) the electronic component 516 through the opening or window of the frame 504. The cover 504 may subsequently be reattached to the frame 504, or a new cover may be attached to the frame 502.

To remove the cover 504, the cover's wall portions 537 can be flexed or rotated outwardly relative to the frame 502 to thereby move the cover's tabs 531 out from underneath the frame's lip portions 535. By way of example only, this can be accomplished by applying a force for moving the cover 504 away from the frame 502. For example, a force may be applied to the cover 504 by inserting a tool or a fingernail into the holes 540 in the cover 502, among other possible ways (e.g., applying force to carrying tabs of a cover).

With the relative movement of the cover 504 away from the frame 502, the upper rounded portions of the cover's detents 530 can operate as camming surfaces for urging the cover's wall portions 537 outwardly away from the frame 502, to thereby disengage the cover's tabs 531 from the frame's lip portions 535. After disengagement of the cover's tabs 531 out from under the frame's lip portions 535, the cover 504 can be lifted off the frame 502. In one particular embodiment, the cover 504 may be relatively easily removed from the frame 502 by applying a force of only about one and one-half pounds or seven Newtons. Accordingly, the cover 504 can be easily removed from the frame 504 without requiring any severing or breaking off of any portion of the cover 504 or the frame 502. Because of the relatively low force required to remove the cover 504, such embodiments allow the cover 504 to be removed without damaging the circuit board 520 or frame 502. Accordingly, the same cover 504 may subsequently be reattached to the frame 502, or a new cover may be assembled onto the frame 502.

When the assembly 500 is disposed over the electronic component 516 of the board 520 as shown in FIGS. 36 and 37, the assembly 500 can EMI shield the electronic component 516 and also dissipate heat generated by the electronic component 516. For example, the assembly 500 can shield the electronic component 516 from EMI/RFI emitted from other electronic components and/or inhibit EMI/RFI emitted by the electronic component 516 from interfering with other components. The assembly 500 can be used with a wide range of electronic components and packages, such as integrated circuits mounted on a printed circuit board, etc.

Figure 35:
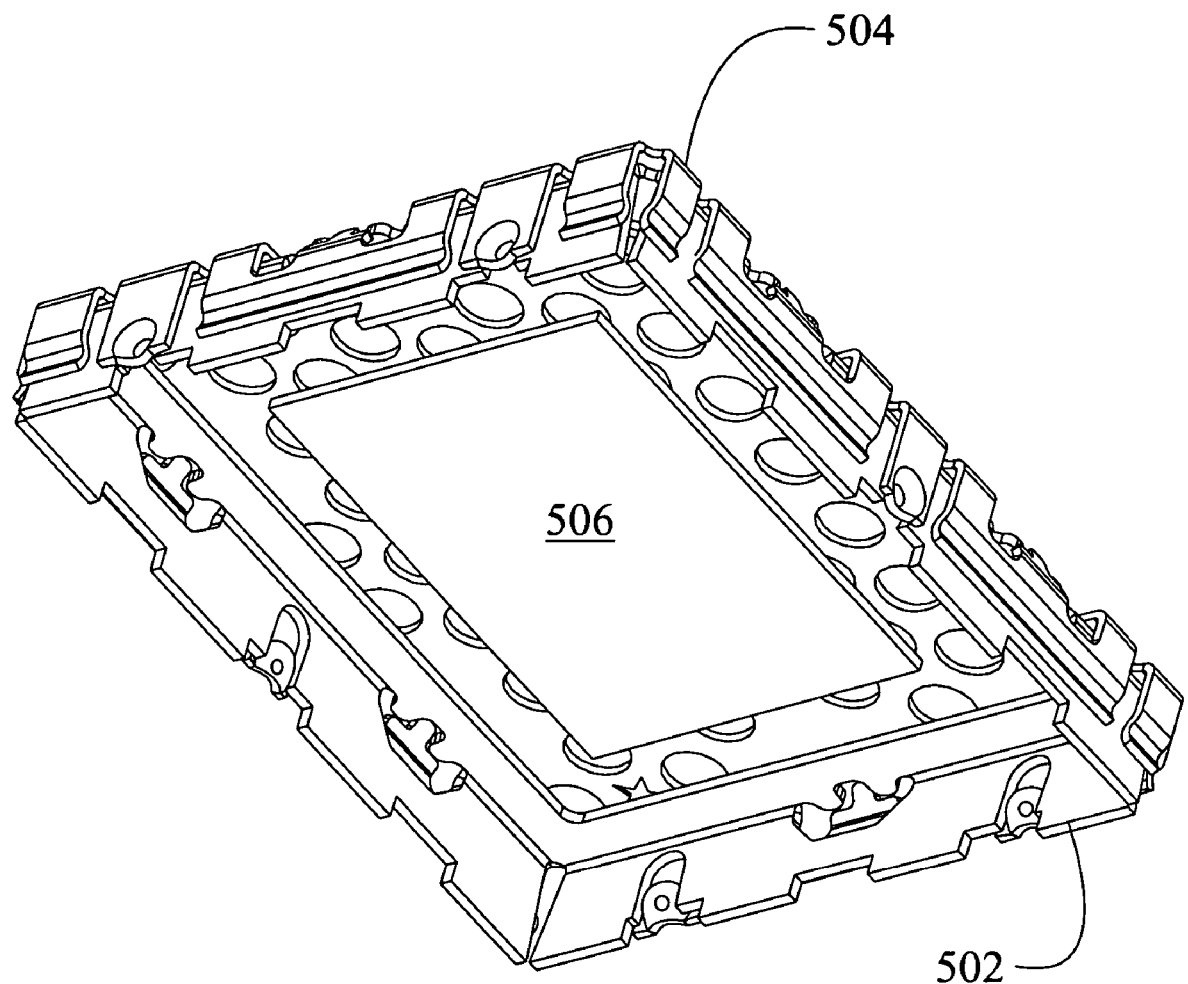
FIG. 35 is a lower perspective view of the frame and cover shown in FIG. 34 illustrating a thermal interface disposed on an inner surface of the cover.

As shown in FIG. 35, the first thermal interface 506 can be disposed on an inner surface of the cover 504. Accordingly, the first thermal interface 506 can facilitate the transfer of heat generated by the electronic component 516 to the cover 504. A wide variety of materials can be used for a thermal interface of assembly 500, which are preferably better thermal conductors and have higher thermal conductivities than air alone. Accordingly, the thermal interface 506 (with its compressive contact against the electrical component 516) can thus allow for improved heat transfer from the electrical component 516 to the cover 504 as compared to those designs relying solely upon air to define the heat path between the electrical component and the underside of the cover. Some preferred embodiments include a thermal interface formed from T-flex™ 600 series thermal gap filler material commercially available from Laird Technologies, Inc. of Saint Louis, Mo. In one particular preferred embodiment, the thermal interface 506 comprises T-flex™ 620 thermal gap filer material, which generally includes reinforced boron nitride filled silicone elastomer. By way of further example, other embodiments include thermal interfaces molded from electrically-conductive elastomer. Additional exemplary embodiments include thermal interface materials formed from ceramic particles, ferrite EMI/RFI absorbing particles, metal or fiberglass meshes in a base of rubber, gel, grease or wax, etc. Other suitable thermal interface materials are set forth in the table below. Alternative embodiments, however, can provide an assembly that does not include any such thermal interfaces.

The illustrated cover 504 includes apertures or holes 540, which as described above, may facilitate removal of the cover 504 from the frame 502. The holes 540 can also facilitate solder reflow heating interiorly of the cover 504, can enable cooling of the electronic component 516, and/or can permit visual inspection of portions of the electronic components beneath the cover 504. In some embodiments, the holes 540 are sufficiently small to inhibit passage of interfering EMI/RFI. The particular number, size, shape, orientation, etc. of the holes 540 can vary depending, for example, on the particular application (e.g., sensitivity of the electronics where more sensitive circuitry may necessitate the use of smaller diameter holes, etc.).

In addition, the frame 502 and/or the cover 504 can be configured to allow for handling by pick-and-place equipment. As shown in FIG. 32, the cover 504 includes a pick-up area 544. In some embodiments, the cover 504 may also include tabs along the sides and/or at the corners thereof (e.g., tabs 145 of cover 104 shown in FIG. 13). In such embodiments, providing the cover with pick-up areas and/or carrying tabs can facilitate handling of the cover, for example, during fabrication of the cover through a progressive die stamping process. Alternatively, other manufacturing methods can also be used for making the cover.

The frame 502 can include areas 542 at each corner and/or other areas (e.g., pick-up areas 760 of frame 702 in FIG. 40, etc.). As another example, the frame 502 may also include tabs along the sides and/or at the corners thereof (e.g., tabs 143 of frame 102 shown in FIGS. 7 and 8). In such embodiments, providing the frame with areas and/or carrying tabs can facilitate handling of the frame, for example, during fabrication of the frame through a progressive die stamping process. Alternatively, other manufacturing methods can also be used for making the frame.

Accordingly, some embodiments of the frame 502 and cover 504 enable individual handling manually and/or or by pick-and-place equipment in some embodiments. After the cover 504 has been assembled to the frame 502, the cover 504 and frame 502 may also be collectively handled by pick-and-place equipment, for example, via the cover's pick-up area 544.

As shown in FIGS. 32 and 35, the frame 502, cover 504, and thermal interface 506 are generally rectangular. Alternative embodiments can include other rectangular configurations or non-rectangular configurations (e.g., triangular, hexagonal, circular, other polygonal shapes, other rectangular configurations than what is shown in figures, etc.). Further embodiments can include frames and/or covers having peripheral walls with more or less openings and/or more or less detents than what are disclosed in the figures.

In various embodiments, the frame 502 can be integrally or monolithically formed as a single component. In such embodiments, the frame 502 can be formed by stamping in a piece of material a flat profile pattern for the frame 502. After stamping the partial flat pattern profile for the frame 502 in the piece of material, the wall portions may then be folded or bent generally perpendicular as shown in FIG. 32. Even though the frame 502 can be formed integrally in this example, such is not required for all embodiments. Alternative configurations (e.g., shapes, sizes, etc.), materials, and manufacturing methods (e.g., drawing, etc.) can be used for making the frame 502.

A wide range of materials can be used for the frame 502, such as nickel-silver alloys, copper-nickel alloys, cold rolled steel, stainless steel, tin-plated cold rolled steel, tin-plated copper alloys, carbon steel, brass, copper, aluminum, copper-beryllium alloys, phosphor bronze, steel, combinations thereof, among other suitable electrically conductive materials.

In various embodiments, the cover 504 can be integrally or monolithically formed as a single component. In such embodiments, the cover 504 can be formed by stamping in a piece of material a flat profile pattern for the cover 504. After stamping the flat pattern profile for the cover 504 in the piece of material, the wall portions may then be folded or bent as shown in FIG. 32. Even though the cover 504 can be formed integrally in this example, such is not required for all embodiments. Alternative configurations (e.g., shapes, sizes, etc.), materials, and manufacturing methods (e.g., drawing, etc.) can be used for making the cover 504.

A wide range of materials can be used for the cover 504, such as nickel-silver alloys, copper-nickel alloys, cold rolled steel, stainless steel, tin-plated cold rolled steel, tin-plated copper alloys, carbon steel, brass, copper, aluminum, copper-beryllium alloys, phosphor bronze, steel, combinations thereof, among other suitable electrically conductive materials.

Figure 38:
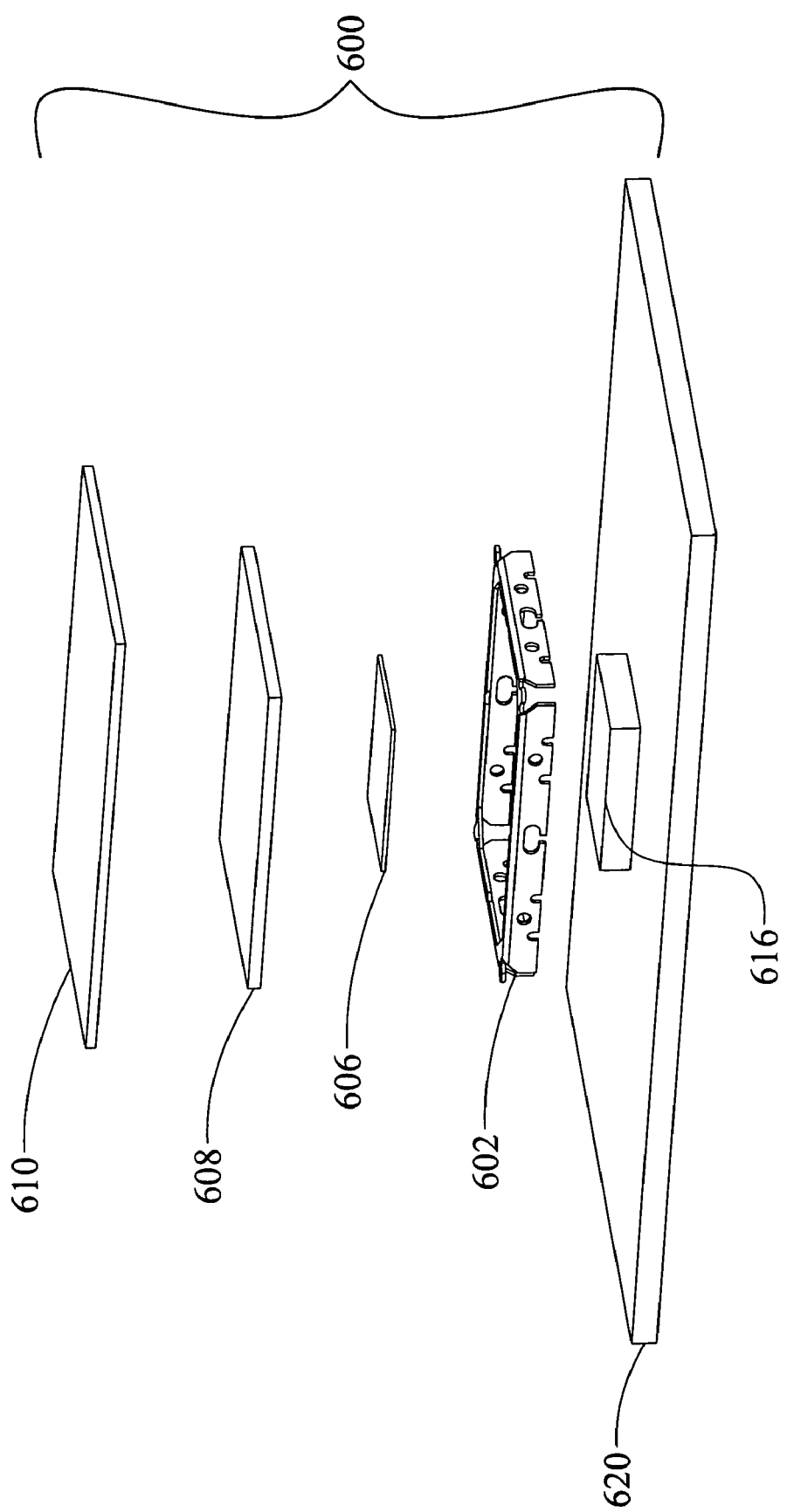
FIG. 38 is an exploded perspective view of a low-profile assembly capable of providing board level EMI shielding and thermal management where the assembly includes a frame, a non-electrically conductive thermal interface, and a metalized or electrically-conductive thermal interface material that functions as a cover for the frame according to exemplary embodiments.
Figure 39:
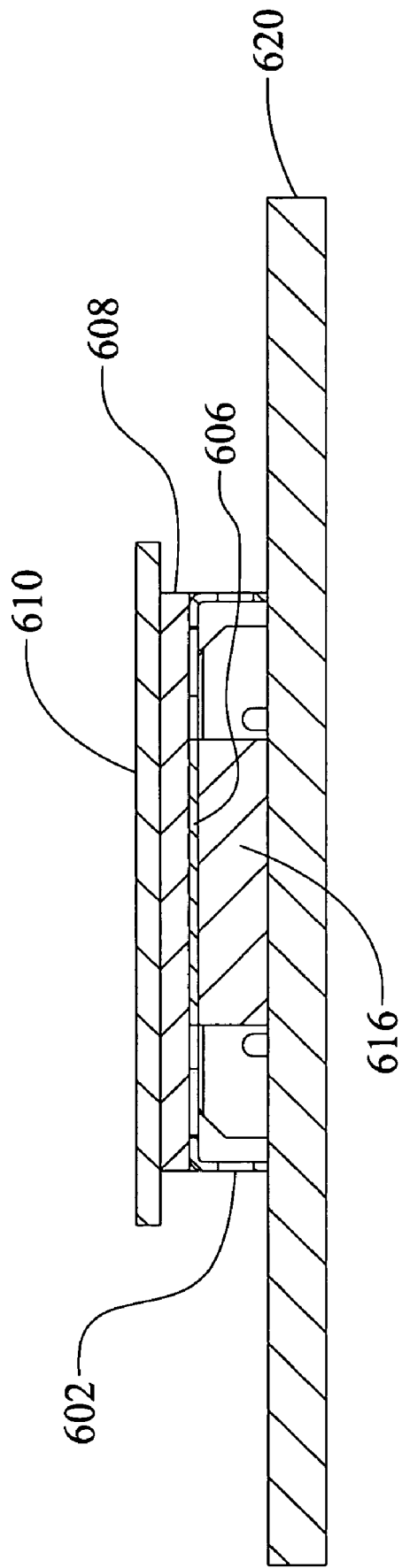
FIG. 39 is a view of the assembly shown in FIG. 38 with front portions broken away, and illustrating the assembly disposed over a board-mounted electronic component for providing shielding and heat dissipation.

FIGS. 38 and 39 illustrate another embodiment of a combined EMI shielding and thermal management assembly 600 embodying one or more aspects of the present disclosure. As shown in FIG. 38, the assembly 600 generally includes a base member or frame 602, a non-electrically conductive thermal interface material 606, a metalized or electrically-conductive thermal interface material 608, and a heat sink/spreader 610 for spreading and/or dissipating heat. In this particular embodiment, the metalized or electrically-conductive thermal interface material also functions as a cover for the frame 602.

FIG. 39 illustrates the assembly 600 disposed over an electronic component 616 of a board 620 (e.g., printed circuit board, etc.), whereby the assembly 600 can shield the electronic component 616 and dissipate heat generated by the electronic component 616. For example, the assembly 600 can shield the electronic component 616 from EMI/RFI emitted from other electronic components and/or inhibit EMI/RFI emitted by the electronic component 616 from interfering with other components. The assembly 600 can be used with a wide range of electronic components and packages, such as integrated circuits mounted on a printed circuit board, etc.

A wide variety of materials can be used for the thermal interface 606. In various embodiments, the thermal interface 606 is molded from electrically-conductive elastomer. Alternative embodiments can include a thermal interface formed from ceramic particles, ferrite EMI/RFI absorbing particles, metal or fiberglass meshes in a base of rubber, gel, grease or wax, etc. Other suitable thermal interface materials are set forth in the table below.

A wide variety of materials can also be used for the metallized thermal interface 608, which are preferably materials having good thermally conducting and shielding properties. Exemplary materials that can be used for the metallized thermal interface 608 include metallized silicone-based materials. In one particular embodiment, the metallized thermal interface 608 is formed from T-flex™ 300 series thermal conductive gap filler material having a relatively hard metallized liner. T-flex™ 300 series materials are commercially available from Laird Technologies, Inc. of Saint Louis, Mo., and, accordingly, have been identified by reference to a trademark of Laird Technologies, Inc. Generally, T-flex™ 300 series materials can include silicone gel combined with a ceramic powder.

A wide variety of materials can also be used for the heat sink/heat spreader 610, which are preferably good thermally conducting and, in some embodiments, also good EMI shielding materials. Exemplary materials that can be used for the heat sink/heat spreader 610 include copper and copper-based alloys, beryllium-copper alloys, aluminum, brass, phosphor bronze, etc. In some embodiments, the heat sink/heat spreader 610 may comprise bare or uncoated metal. In some other embodiments, the heat sink/heat spreader 610 may comprise a metal coated with a suitable electrically-conductive plating to provide galvanic compatibility with the metallized thermal interface 608.

FIG. 39 illustrates the assembly 600 after being snapped or pressed into position, for example, during the assembly of a cellular phone (or other electronic device) such that a force is generated of sufficient magnitude for providing the assembly 600 with low thermal impedance and good electrical and thermal interfaces. In such embodiments, the assembly 600 and/or the electronic device (e.g., cellular phone, other cellular communication device, etc.) can be designed such that sufficient force is applied to the heat sink/heat spreader 610 after the assembly 600 has been installed within the electronic device. For example, in some embodiments, the clamping or engagement force is generated by an external body (e.g., plastic housing of a cellular communication device, etc.) during assembly, wherein the clamping force has sufficient magnitude for biasing the heat sink/heat spreader 610 and metallized thermal interface 608 generally towards the frame 602 for providing the assembly 600 with low thermal impedance.

As shown in FIG. 38, the frame 602, thermal interface 606, metallized thermal interface 608, and heat sink/heat spreader 610 are all shown with generally rectangular configurations. Alternatively, other embodiments can include a combined shielding and thermal management assembly having one or more components with other rectangular configurations or non-rectangular configurations (e.g., triangular, hexagonal, circular, other polygonal shapes, other rectangular configurations than what is shown in figures, etc.).

In various embodiments, the frame 602 can be integrally or monolithically formed as a single component, for example by stamping and forming, drawing, progressive die process, etc. Alternative configurations (e.g., shapes, sizes, etc.), materials, and manufacturing methods (e.g., drawing, etc.) can be used for making the frame 602. A wide range of materials can be used for the frame 602, such as nickel-silver alloys, copper-nickel alloys, cold rolled steel, stainless steel, tin-plated cold rolled steel, tin-plated copper alloys, carbon steel, brass, copper, aluminum, copper-beryllium alloys, phosphor bronze, steel, combinations thereof, among other suitable electrically conductive materials.

FIGS. 41 through 43 illustrate another exemplary embodiment of a combined EMI shielding and thermal management assembly 800 embodying one or more aspects of the present disclosure. As shown, the assembly 800 generally includes a base member or frame 802, a lid or cover 804, and a thermal interface/phase change material 806. Some embodiments of the assembly 800 may also include a heat sink/heat spreader. In embodiments that do include a heat sink/heat spread, a thermal interface may be disposed between the cover and the heat sink/heat spreader.

The frame 802 and cover 804 may be configured such that cover 804 can be attached to the frame 802 in a first or second latched position. The frame 802 and cover 804 may include mounting features that allow cover 804 can be attached to the frame 802 in a first latched position and a second latched position. By way of example only, the frame 802 and cover 804 may be substantially identical to any of the frame and cover combinations described and shown herein (e.g., frame 102 and cover 104 shown in FIG. 1, frame 302 and cover 304 shown in FIG. 20, frame 402 and cover 404 shown in FIG. 26, frame 502 and 504 shown in FIG. 32, etc.). Stated differently, any one or more of the above-described assemblies 100 (FIG. 1), 300 (FIG. 20), 400 (FIG. 26), 500 (FIG. 32) may include a thermal interface/phase change material.

Alternatively, some embodiments include a frame, a cover, and a thermal interface/phase change material, but which do not include the multi-latching features allowing the cover to be attached to the frame in a first or a second latched position.

FIGS. 42 and 43 illustrate the assembly 800 disposed over an electronic component 816 of a board 820 (e.g., printed circuit board, etc.), whereby the assembly 800 can shield the electronic component 816 and dissipate heat generated by the electronic component 816. For example, the assembly 800 can shield the electronic component 816 from EMI/RFI emitted from other electronic components and/or inhibit EMI/RFI emitted by the electronic component 816 from interfering with other components. The assembly 800 can be used with a wide range of electronic components and packages, such as integrated circuits mounted on a printed circuit board, etc.

The thermal interface/phase change material 806 can be disposed on an inner surface of the cover 804. Accordingly, the thermal interface/phase change material 806 can facilitate the transfer of heat generated by the electronic component 816 to the cover 804.

The thermal interface/phase change material 806 can be formed from a wide variety of materials, which preferably are better thermal conductors and have higher thermal conductivities than air alone. Accordingly, the thermal interface/phase change material 806 (with its compressive contact against the electrical component 816) can thus allow for improved heat transfer from the electrical component 816 to the cover 804 as compared to those designs relying solely upon air to define the heat path between the electrical component and the underside of the cover. Some embodiments include thermal interface/phase change materials that comprise solid and/or semi-solid pads at room temperature that melt at operating temperatures from intimate contact on the mating surfaces to produce low thermal resistance. Exemplary preferred embodiments include the thermal interface/phase change material 806 comprising a T-pcm™ 580 series thermal phase change material commercially available from Laird Technologies, Inc. of Saint Louis, Mo., and, accordingly, have been identified by reference to a trademark of Laird Technologies, Inc. In one particular preferred embodiment, the thermal interface/phase change material 806 comprises T-pcm™ 583 thermal phase change material, which generally comprises non-reinforced film. By way of further example, other embodiments include one or more thermal interface/phase change material formed from wax-like, wax and/or resin based systems that are filled with suitable thermally-conductive particles including alumina, aluminum nitride, boron nitride, diamond, graphite, and/or metal particles. The particular material, location, and thickness selected for the thermal interface/phase change material 806 can be based at least in part on the particular application, such as the height of the cover 804 relative to the height of the electronic component 816.

With continued reference to FIG. 42, the cover 804 can be attached to the frame 802 such that, before the assembly 800 undergoes solder reflow, a gap or spaced distance 822 separates the cover 804 from the top of the electronic component 816. With the gap 822 present, the assembly 800 may undergo solder reflow. The solder reflow process can be performed at sufficiently high temperatures such that the thermal interface/phase change material 806 undergoes a phase change and becomes more liquidus (or at least become less solid). With cooling, the solder used for mounting the frame 802 to the board 820 solidifies, the thermal interface/phase change material 806 becomes more solid, and the cover 804 thermally contracts. As the cover 804 thermally contracts and the thermal interface/phase change material 806 becomes more solid, surface tension of the thermal interface/phase change material 806 generally keeps or maintains the thermal interface/phase change material 806 in place, thus resulting in relative movement between the cover 804 and the thermal interface/phase change material 806.

This relative movement and contraction of the cover 804 can generate a force on the thermal interface/phase change material 806, which preferably has sufficient force magnitude for providing the assembly 800 with low thermal impedance. For example, some embodiments include the thermal interface/phase change material 806 being configured (e.g., sized, located, formed of materials, etc.) such that the thermal interface/phase change material 806 is sandwiched under pressure between the cover 804 and the electronic component 816 after cooling. In such embodiments, the compressive force can cause the thermal interface/phase change material 806 to compress against at least a portion of the electronic component 816 on the board 820, as shown in FIG. 43.

The contact between the electronic component 816 and the thermal interface/phase change material 806 can create a heat-conducting path through which heat generated by the electronic component 316 can be conducted. That is, heat generated by the electronic component 816 can be conducted to the thermal interface/phase change material 806, and then to the cover 804. From the cover 804, heat can be conducted to the frame 802. From the frame 802, heat can be conducted to the board 820 via the solder joints between the frame 802 and the board 820. In those embodiments that include a heat sink/heat spreader, heat can also be conducted from the cover 804 to the heat sink/heat spreader via a thermal interface (in some embodiments) disposed between the heat sink/heat spreader and the cover 804.

As shown in FIG. 41, the illustrated cover 804 includes apertures or holes 840. These holes 840 can facilitate solder reflow heating interiorly of the cover 804, can enable cooling of the electronic component 816, and/or can permit visual inspection of portions of the electronic components beneath the cover 804. In some embodiments, the holes 840 are sufficiently small to inhibit passage of interfering EMI/RFI. The particular number, size, shape, orientation, etc. of the holes 840 can vary depending, for example, on the particular application (e.g., sensitivity of the electronics where more sensitive circuitry may necessitate the use of smaller diameter holes, etc.).

In addition, the frame 802 and/or the cover 804 can be configured to allow for handling by pick-and-place equipment. As shown in FIG. 41, the cover 804 includes a pick-up area 844. In some embodiments, the cover 804 may also include tabs at the corners and/or along the sides thereof (e.g., tabs 145 of cover 104 shown in FIG. 13). In such embodiments, providing the cover with pick-up areas and/or carrying tabs can facilitate handling of the cover, for example, during fabrication of the cover through a progressive die stamping process. Alternatively, other manufacturing methods can also be used for making the cover.

The frame 802 can include areas similar to the pick-up areas 760 of frame 702 in FIG. 40, etc. As another example, the frame 802 may also include tabs or carrying corners (e.g., tabs 143 of frame 102 shown in FIGS. 7 and 8). In such embodiments, providing the frame with areas and/or carrying tabs can facilitate handling of the frame, for example, during fabrication of the frame through a progressive die stamping process. Alternatively, other manufacturing methods can also be used for making the frame.

Accordingly, some embodiments of the frame 802 and cover 804 enable individual handling manually and/or by pick-and-place equipment in some embodiments. After the cover 804 has been assembled to the frame 802, the cover 804 and frame 802 may also be collectively handled by pick-and-place equipment, for example, via the cover's pick-up area 844.

As shown in FIG. 41, the frame 802, cover 804, and thermal interface/phase change material 806 are generally rectangular. Alternative embodiments can include other rectangular configurations or non-rectangular configurations (e.g., triangular, hexagonal, circular, other polygonal shapes, other rectangular configurations than what is shown in figures, etc.). Further embodiments can include frames and/or covers having peripheral walls with more or less openings and/or more or less detents than what are disclosed in the figures.

In various embodiments, the frame 802 can be integrally or monolithically formed as a single component. In such embodiments, the frame 802 can be formed by stamping in a piece of material a flat profile pattern for the frame 802. After stamping the partial flat pattern profile for the frame 802 in the piece of material, the wall portions may then be folded or bent generally perpendicular as shown in FIG. 41. Even though the frame 802 can be formed integrally in this example, such is not required for all embodiments. Alternative configurations (e.g., shapes, sizes, etc.), materials, and manufacturing methods (e.g., drawing, etc.) can be used for making the frame 802.

A wide range of materials can be used for the frame 802, such as nickel-silver alloys, copper-nickel alloys, cold rolled steel, stainless steel, tin-plated cold rolled steel, tin-plated copper alloys, carbon steel, brass, copper, aluminum, copper-beryllium alloys, phosphor bronze, steel, combinations thereof, among other suitable electrically conductive materials.

In various embodiments, the cover 804 can be integrally or monolithically formed as a single component. In such embodiments, the cover 804 can be formed by stamping in a piece of material a flat profile pattern for the cover 804. After stamping the flat pattern profile for the cover 804 in the piece of material, the wall portions may then be folded or bent as shown in FIG. 41. Even though the cover 804 can be formed integrally in this example, such is not required for all embodiments. For example, other embodiments may have detents that are discrete components separately attached to the cover 804, for example, by welding, adhesives, among other suitable methods. Alternative configurations (e.g., shapes, sizes, etc.), materials, and manufacturing methods (e.g., drawing, etc.) can be used for making the cover 804.

A wide range of materials can be used for the cover 804, such as nickel-silver alloys, copper-nickel alloys, cold rolled steel, stainless steel, tin-plated cold rolled steel, tin-plated copper alloys, carbon steel, brass, copper, aluminum, copper-beryllium alloys, phosphor bronze, steel, combinations thereof, among other suitable electrically conductive materials.

The table below lists various exemplary thermal interface materials that may be used as a thermal interface material in any one or more embodiments described and/or shown herein. These example thermal interface materials are commercially available from Laird Technologies, Inc. of Saint Louis, Mo., and, accordingly, have been identified by reference to trademarks of Laird Technologies, Inc. This table is provided for purposes of illustration only and not for purposes of limitation.

| Name | Construction Composition | Type | Thermal Conductivity [W/mK] | Thermal Impedance [° C.-cm$^2$/W] | Pressure of Thermal Impedance Measurement [kPa] |
|---|---|---|---|---|---|
| T-flex ™ 620 | Reinforced boron nitride filled silicone elastomer | Gap Filler | 3.0 | 2.97 | 69 |
| T-flex ™ 640 | Boron nitride filled silicone elastomer | Gap Filler | 3.0 | 4.0 | 69 |
| T-flex ™ 660 | Boron nitride filled silicone elastomer | Gap Filler | 3.0 | 8.80 | 69 |
| T-flex ™ 680 | Boron nitride filled silicone elastomer | Gap Filler | 3.0 | 7.04 | 69 |
| T-flex ™ 6100 | Boron nitride filled silicone elastomer | Gap Filler | 3.0 | 7.94 | 69 |
| T-pli ™ 210 | Boron nitride filled, silicone elastomer, fiberglass reinforced | Gap Filler | 6 | 1.03 | 138 |
| T-flex ™ 820 | Reinforced silicone elastomer | Gap Filler | 2.8 | 2.86 | 69 |
| T-pcm ™ 583 | Non-reinforced film | Phase Change | 3.8 | 0.12 | 69 |
| T-flex ™ 320 | Ceramic filled silicone elastomer | Gap Filler | 1.2 | 8.42 | 69 |
| T-grease ™ | Silicone-based grease or non-silicone based grease | Thermal Grease | 1.2 | 0.138 | 348 |

In addition to the examples listed in the table above, other thermal interface materials can also be used, which are preferably better than air alone at conducting and transferring heat. Exemplary thermal interface materials include compliant or conformable silicone pads, non-silicone based materials (e.g., non-silicone based gap filler materials, thermoplastic and/or thermoset polymeric, elastomeric materials, etc.), silk screened materials, polyurethane foams or gels, thermal putties, thermal greases, thermally-conductive additives, etc. In some embodiments, one or more conformable thermal interface pads are used having sufficient compressibility and flexibility for allowing a pad to relatively closely conform to the size and outer shape of an electrical component when placed in contact with the electrical component when the shielding apparatus is installed to a printed circuit board over the electrical component. By engaging the electrical component in this relatively close fitting and encapsulating manner, a conformable thermal interface pad can conduct heat away from the electrical component to the cover in dissipating thermal energy.

Advantageously, various embodiments can thus allow cost savings to a customer. Rather than having separate components to respectively provide EMI shielding and thermal management, a customer can instead purchase a thermally-enhanced EMI shielding assembly that can provide shielding and thermal management.

In various embodiments, the frames and covers are adaptable for tape and reel packaging for use with standard automated pick and place equipment or, alternatively, the frames and covers may be packed in trays for correct orientation within an automated system. In addition, various embodiments can provide for EMI shielding and thermal management of relatively small electronic components and circuit board layouts, such as the electronic components and circuit board layouts associated with cellular telephones and other wireless electronic devices. As electronic components and layouts are decreasing in size, various embodiments are able to help meet the needs of increasing heat dissipation from such small electronic components and layouts.

Certain terminology is used herein for purposes of reference only, and thus is not intended to be limiting. For example, terms such as "upper", "lower", "above", and "below" refer to directions in the drawings to which reference is made. Terms such as "front", "back", "rear", "bottom" and "side", describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second" and other such numerical terms referring to structures do not imply a sequence or order unless clearly indicated by the context.

When introducing elements or features of the present disclosure and the exemplary embodiments, the articles "a", "an", "the" and "said" are intended to mean that there are one or more of such elements or features. The terms "comprising", "including" and "having" are intended to be inclusive and mean that there may be additional elements or features other than those specifically noted. It is further to be understood that the methods and the steps, processes, and operations thereof described herein are not to be construed as necessarily requiring their performance in the particular order discussed or illustrated, unless specifically identified as an order or performance. It is also to be understood that additional or alternative steps may be employed.

The description of the disclosure is merely exemplary in nature and, thus, variations that do not depart from the gist of the disclosure are intended to be within the scope of the disclosure. Such variations are not to be regarded as a departure from the spirit and scope of the disclosure.

What is claimed is:

1. An assembly for providing EMI shielding and dissipating heat from one or more electrical components of a board, the assembly comprising:
   a frame;
   a cover attachable to the frame in a first latched position and at least a second, operational latched position; and
   at least one thermally-conductive compliant material;
   wherein, when the cover is attached to the frame in the first latched position, a spaced distance separates the at least one thermally-conductive compliant material from at least one of the cover or the one or more electrical components; and
   wherein, when the cover is attached to the frame in the second latched position, the spaced distance is substantially eliminated and the at least one thermally-conductive compliant material forms a thermally-conducting heat path from the one or more electrical components to the cover.

2. The assembly of claim 1, wherein a clamping force is generated when the cover is attached to the frame in the second latched position that compresses the at least one thermally-conductive compliant material against the cover and the one or more electrical components.

3. The assembly of claim 1, wherein the at least one thermally-conductive compliant material is configured to be sandwiched under pressure between the cover and the at least a portion of the one or more electrical components when the cover is attached to the frame in the second latched position.

4. The assembly of claim 1, wherein:
   at least one of said cover and said frame includes a first latching member, and the other one of said cover and said frame includes a first opening configured to engagingly receive the first latching member for attaching the cover to the frame in the first latched position; and
   at least one of said cover and said frame includes a second latching member, and the other one of said cover and said frame includes a second opening configured to engagingly receive the second latching member for attaching the cover to the frame in the second latched position.

5. The assembly of claim 1, wherein the cover includes at least one pick-up area configured to facilitate handling of the cover by pick-and-place equipment.

6. The assembly of claim 5, wherein the cover includes carrying tabs.

7. The assembly of claim 1, wherein the cover is removably attachable to the frame in the first and second latched positions.

8. The assembly of claim 7, wherein the cover includes first wall portions, first detents inwardly extending relative to the first wall portions, second walls portions, and second and third detents inwardly extending relative to the second wall portions, and wherein the frame includes first openings for engagingly receiving the first detents for attaching the cover to the frame in the first latched position, and second and third openings for engagingly receiving the respective second and third detents for attaching the cover to the frame in the second latched position.

9. The assembly of claim 8, wherein the frame includes lip portions for interlockingly engaging the second detents of the cover when the second detents are disposed relatively underneath the frame's lip portions.

10. The assembly of claim 9, wherein the third detents of the cover comprise lower inwardly curved portions of the cover's second wall portions, and wherein the upper portion of the third detents are operable as camming surfaces for urging the cover's second wall portions outwardly away from the frame thereby facilitating disengagement of the second detents from under the frame's protruding lip portions and removal of the cover from the frame.

11. The assembly of claim 8, wherein the second detents of the cover comprise tabs.

12. The assembly of claim 8, wherein the cover comprises inwardly extending dimples on the first wall portions that define the first detents.

13. The assembly of claim 8, wherein the cover comprises inwardly extending half-dimples on the second wall portions that define the second detents.

14. The assembly of claim 1, further comprising a thermal management structure operable as at least one or more of a heat sink and a heat spreader, and at least one thermally-conductive material disposed between the thermal management structure and the cover such that the at least one thermally-conductive material form a thermally-conducting heat path between the thermal management structure and the cover.

15. The assembly of claim 1, wherein the at least one thermally-conductive compliant material comprises a thermal interface/phase change material.

16. A method for providing board level EMI shielding and thermal management for one or more electrical components of a board, the method comprising:
   attaching a cover to a frame in a first latched position such that a spaced distance separates at least one thermally-conductive compliant material, disposed within an interior defined by the cover and the frame, from at least one of the cover or the one or more electrical components disposed within the interior defined by the cover and the frame, and moving the cover relatively downward towards the board from the first latched position into a second, operational latched position in which the spaced distance is substantially eliminated and the at least one thermally-conductive compliant material forms a thermally-conducting heat path from the one or more electrical components to the cover.

17. The method of claim 16, further comprising performing a solder reflow process to mount the frame to the board while the cover is attached to the frame in the first latched position.

18. The method of claim 16, further comprising performing a solder reflow process to mount the frame to the board before attaching the cover to the frame.

19. The method of claim 16, wherein moving the cover from the first latched position to the second latched position generates a clamping force that compresses the at least one thermally-conductive compliant material against the cover and at least a portion of the one or more electrical components.

20. The method of claim 16, wherein moving the cover from the first latched position to the second latched position sandwiches the at least one thermally-conductive compliant material under pressure between the cover and the one or more electrical components.

21. The method of claim 16, wherein attaching the cover to the frame in the first latched position includes picking up and placing the cover on the frame using pick and place equipment.

22. The method of claim 16, further comprising, after attaching the cover to the frame in the first latched position, picking up and placing the cover and the frame on the board using pick and place equipment.

23. The method of claim 16, further comprising removing the cover from the frame to access the one or more electrical components.

24. The method of claim 23, further comprising reattaching the removed cover to the frame.

25. The method of claim 23, further comprising attaching a replacement cover to the frame.

26. An assembly for EMI shielding and thermal management of one or more electrical components of a board, the assembly comprising:
a frame;
a cover attachable to the frame;
a thermal interface/phase change material configured such that:
before solder reflow of the frame to the board, a spaced distance is provided between the thermal interface/phase change material and the one or more electrical components disposed within an interior defined by the cover and the frame; and
after solder reflow and cooling, displacement of the thermal interface/phase change material and thermal contraction of the cover can cooperatively generate a clamping force for compressing the thermal interface/phase change material generally between the cover and the one or more electrical components, whereby the thermal interface/phase change material forms a thermally-conducting heat path from the one or more electrical components to the cover;
wherein the cover and the frame are configured such that the cover is attachable to the frame in:
a first latched position in which a spaced distance separates the thermal interface/phase change material and the one or more electrical components; and
a second, operational latched position in which the thermal interface/phase change material
contacts the at least a portion of the one or more electrical components and forms a thermally-conducting heat path from the one or more electrical components to the cover.

27. The assembly of claim 26, wherein the thermal interface/phase change material comprises a polymeric resin material filled with thermally-conductive particles.

* * * * *

UNITED STATES PATENT AND TRADEMARK OFFICE
CERTIFICATE OF CORRECTION

PATENT NO. : 7,623,360 B2  
APPLICATION NO. : 11/440618  
DATED : November 24, 2009  
INVENTOR(S) : English et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 853 days.

Signed and Sealed this

Twenty-sixth Day of October, 2010

David J. Kappos
*Director of the United States Patent and Trademark Office*